US012666602B2

(12) United States Patent
Lee et al.

(10) Patent No.: US 12,666,602 B2
(45) Date of Patent: Jun. 23, 2026

(54) SEMICONDUCTOR MEMORY DEVICE

(71) Applicant: SAMSUNG ELECTRONICS CO., LTD., Suwon-si (KR)

(72) Inventors: Kiseok Lee, Suwon-si (KR); Eunju Cho, Suwon-si (KR); Keunnam Kim, Suwon-si (KR); Seokhan Park, Suwon-si (KR); Seok-Ho Shin, Suwon-si (KR); Joongchan Shin, Suwon-si (KR); Heechan Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 380 days.

(21) Appl. No.: 18/238,790

(22) Filed: Aug. 28, 2023

(65) Prior Publication Data
US 2024/0147701 A1 May 2, 2024

(30) Foreign Application Priority Data
Oct. 28, 2022 (KR) ........................ 10-2022-0140980

(51) Int. Cl.
*H10B 12/00* (2023.01)
(52) U.S. Cl.
CPC ......... *H10B 12/482* (2023.02); *H10B 12/315* (2023.02); *H10B 12/485* (2023.02); *H10B 12/488* (2023.02); *H10B 12/50* (2023.02)
(58) Field of Classification Search
CPC ..... H10B 12/50; H10B 12/482; H10B 12/485
See application file for complete search history.

(56) References Cited

U.S. PATENT DOCUMENTS

| | | | |
|---|---|---|---|
| 9,111,960 B2 | 8/2015 | Kim et al. | |
| 11,049,804 B2 | 6/2021 | Ramaswamy | |
| 11,062,989 B2 | 7/2021 | Sukekawa | |
| 2011/0303974 A1 * | 12/2011 | Kim ..................... | H10B 12/053 257/329 |
| 2020/0395362 A1 | 12/2020 | Park | |
| 2021/0249416 A1 | 8/2021 | Li et al. | |

(Continued)

FOREIGN PATENT DOCUMENTS

| | | |
|---|---|---|
| CN | 114141713 A | 3/2022 |
| KR | 1020230155795 A | 11/2023 |

(Continued)

*Primary Examiner* — Douglas M Menz
(74) *Attorney, Agent, or Firm* — Muir Patent Law, PLLC

(57) ABSTRACT
A semiconductor memory device may include a substrate including a cell array region and a connection region, bit lines provided on the substrate and extending in a first direction, first and second active patterns alternately arranged in the first direction on each of the bit lines, back-gate electrodes disposed between adjacent ones of the first and second active patterns and extended in a second direction to cross the bit lines, first and second word lines disposed adjacent to the first and second active patterns respectively and extending in the second direction, and a shielding conductive pattern including line portions, which are respectively disposed between adjacent ones of the bit lines, and a plate portion, which is connected in common to the line portions. A length of the line portions of the shielding conductive pattern in the first direction may be shorter than that of the bit lines.

20 Claims, 72 Drawing Sheets

P2

(56) References Cited

U.S. PATENT DOCUMENTS

| | | | |
|---|---|---|---|
| 2022/0102352 A1 | 3/2022 | Lee et al. | |
| 2023/0363143 A1 | 11/2023 | Lee et al. | |
| 2023/0371243 A1 | 11/2023 | Lee et al. | |
| 2023/0389287 A1* | 11/2023 | Ku ...................... | H10B 12/315 |
| 2023/0389289 A1 | 11/2023 | Park et al. | |
| 2024/0147706 A1 | 5/2024 | Kim et al. | |
| 2024/0147707 A1 | 5/2024 | Kang et al. | |

FOREIGN PATENT DOCUMENTS

| | | | |
|---|---|---|---|
| KR | 1020230158993 A | 11/2023 | |
| KR | 1020230165456 A | 12/2023 | |
| KR | 1020240059910 A | 5/2024 | |
| KR | 1020240062190 A | 5/2024 | |

* cited by examiner

Figure 22B:
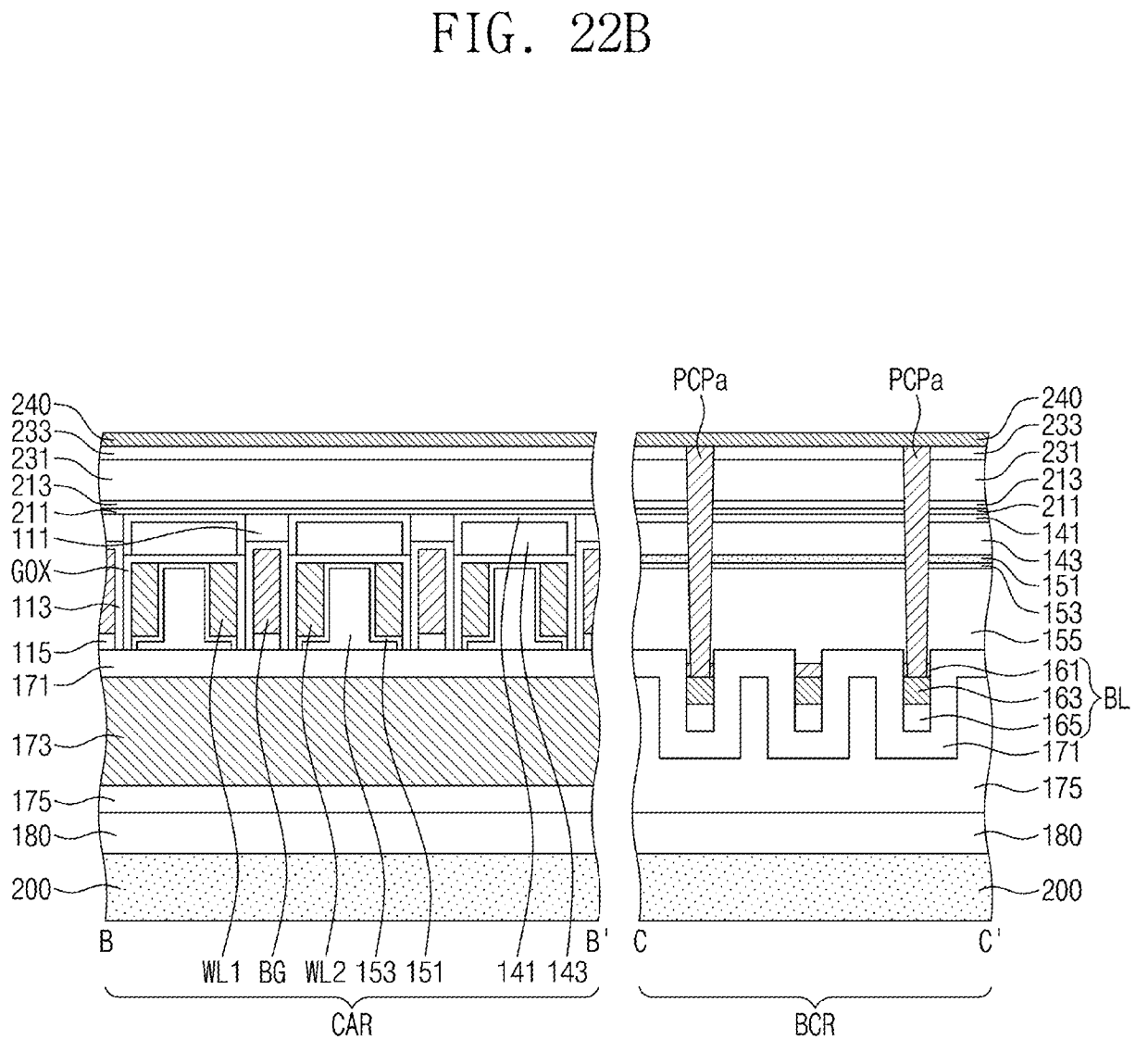

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2022-0140980, filed on Oct. 28, 2022, in the Korean Intellectual Property Office, the entire contents of which are hereby incorporated by reference.

BACKGROUND

1. Field

Embodiments relate to a semiconductor memory device.

2. Description of the Related Art

Higher integration of semiconductor devices is desirable to satisfy consumer demands for superior performance and an inexpensive price. In the case of semiconductor devices, their integration is an important factor in determining product prices. Therefore, increased integration is especially desired. In the case of two-dimensional or planar semiconductor devices their integration is mainly determined by the area occupied by a unit memory cell. Therefore, integration is greatly influenced by the level of a fine pattern forming technology. However, the extremely expensive process equipment needed to increase pattern fineness sets a practical limitation on the ability to increase integration for two-dimensional or planar semiconductor devices. Accordingly, various semiconductor technologies have been suggested to improve an integration density, resistance, and current driving ability of a semiconductor device.

SUMMARY

According to an embodiment, a semiconductor memory device may include a substrate including a cell array region and a connection region, bit lines provided on the substrate and extended in a first direction, first and second active patterns disposed on each of the bit lines and alternately arranged in the first direction, back-gate electrodes respectively disposed between adjacent ones of the first and second active patterns and extended in a second direction to cross the bit lines, first word lines disposed adjacent to the first active patterns, respectively, and extended in the second direction, second word lines disposed adjacent to the second active patterns, respectively, and extended in the second direction, and a shielding conductive pattern including line portions, which are respectively disposed between adjacent ones of the bit lines, and a plate portion, which is connected in common to the line portions. When measured in the first direction, a length of the line portions of the shielding conductive pattern may be shorter than a length of the bit lines.

According to an embodiment, a semiconductor memory device may include a substrate including a cell array region, a first connection region adjacent to the cell array region in a first direction, and a second connection region adjacent to the cell array region in a second direction crossing the first direction, bit lines provided on the substrate and extended in the first direction, a spacer insulating layer conformally covering the bit lines and defining gap regions between the bit lines, respectively, a shielding conductive pattern disposed between the spacer insulating layer and the substrate, the shielding conductive pattern including line portions, which are provided on the cell array region to fill the gap regions of the spacer insulating layer, and a plate portion, which is provided to connect the line portions to each other, a first active pattern and a second active pattern disposed on each of the bit lines, a back-gate electrode disposed between the first and second active patterns and extended in a second direction to cross the bit line, a first word line disposed at a side of the first active pattern and extended in the second direction, a second word line disposed at an opposite side of the second active pattern and extended in the second direction, and contact patterns coupled to the first and second active patterns, respectively. The plate portion of the shielding conductive pattern may be extended in the first direction and the second direction.

According to an embodiment, a semiconductor memory device may include a substrate including a cell array region, a first connection region adjacent to the cell array region in a first direction, and a second connection region adjacent to the cell array region in a second direction crossing the first direction, bit lines provided on the substrate and extended in the first direction, a shielding conductive pattern including line portions, which are respectively disposed between adjacent ones of the bit lines, and a plate portion, which is connected in common to the line portions, first and second active patterns disposed on each of the bit lines and alternately arranged in the first direction, back-gate electrodes disposed between adjacent ones of the first and second active patterns and extended in the second direction to cross the bit lines, first word lines disposed adjacent to the first active patterns, respectively, and extended in the second direction, second word lines disposed adjacent to the second active patterns, respectively, and extended in the second direction, contact patterns coupled to the first and second active patterns, respectively, data storage patterns coupled to the contact patterns, respectively, a peripheral active pattern provided on the first and second connection regions of the substrate, the peripheral active pattern including a first surface and a second surface, which are opposite to each other in a vertical direction normal to a top surface of the substrate, a device isolation layer enclosing the peripheral active pattern, a peripheral transistor integrated on the first surface of the peripheral active pattern, bit line contact plugs provided on the first connection region to penetrate the device isolation layer and coupled to the bit lines, and shielding contact plugs provided on the second connection region to penetrate the device isolation layer and coupled to the plate portion of the shielding conductive pattern.

BRIEF DESCRIPTION OF THE DRAWINGS

Features will become apparent to those of skill in the art by describing in detail exemplary embodiments with reference to the attached drawings in which:

FIG. 1B is a sectional view, which is taken along a line A-A' of FIG. 1A to illustrate a semiconductor memory device according to an embodiment.

FIG. 1C is a sectional view, which is taken along lines B-B' and C-C' of FIG. 1A to illustrate a semiconductor memory device according to an embodiment.

FIGS. 3A, 3B, and 3C are sectional views, which are taken along the lines A-A', B-B', C-C', D-D', and E-E' of FIG. 1A and on the word line connection region to illustrate a semiconductor memory device according to an.

FIGS. 4A to 24A are sectional views, which are taken along the line A-A' of FIG. 1A to illustrate a method of fabricating a semiconductor memory device according to an embodiment.

FIGS. 4B to 24B are sectional views, which are taken along the lines B-B' and C-C' of FIG. 1A to illustrate a method of fabricating a semiconductor memory device according to an embodiment.

FIGS. 4C to 24C are sectional views, which are taken along the lines D-D' and E-E' of FIG. 1A and on the word line connection region to illustrate a method of fabricating a semiconductor memory device according to an embodiment.

DETAILED DESCRIPTION

Example embodiments will now be described more fully with reference to the accompanying drawings, in which example embodiments are shown.

Figure 1A:
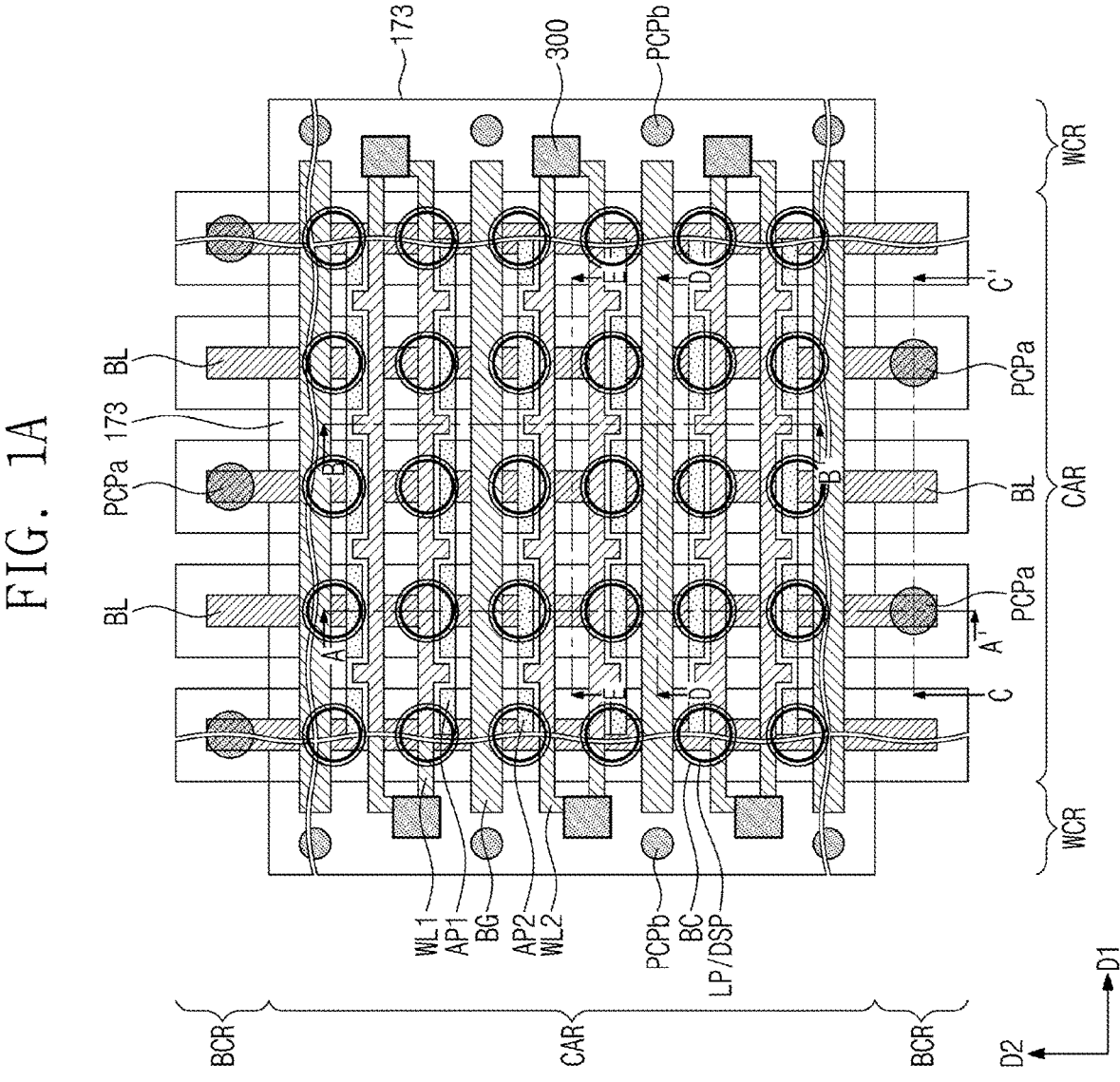
FIG. 1A is a plan view illustrating a semiconductor memory device according to an embodiment.
Figure 1B:
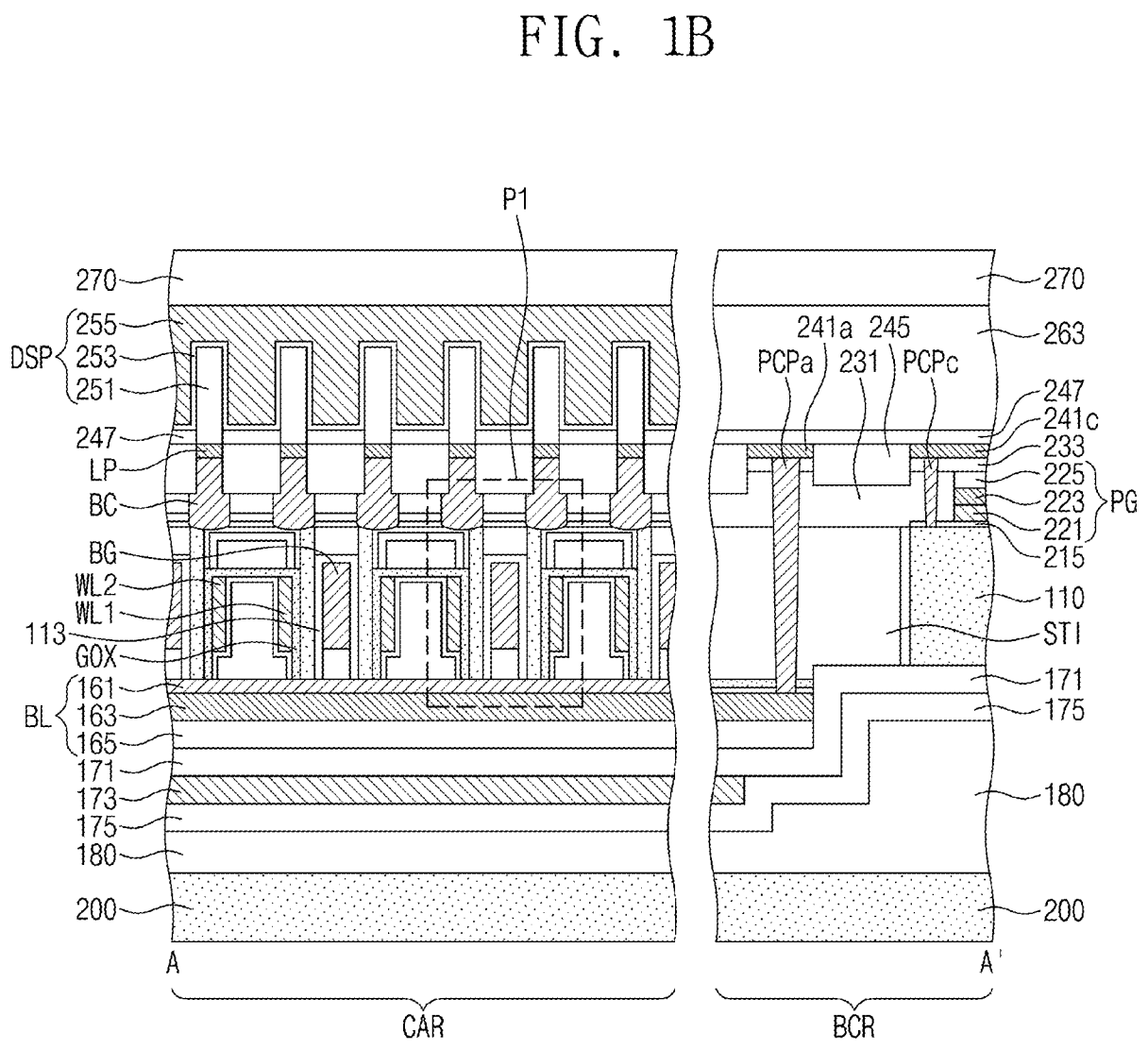
Figure 1C:
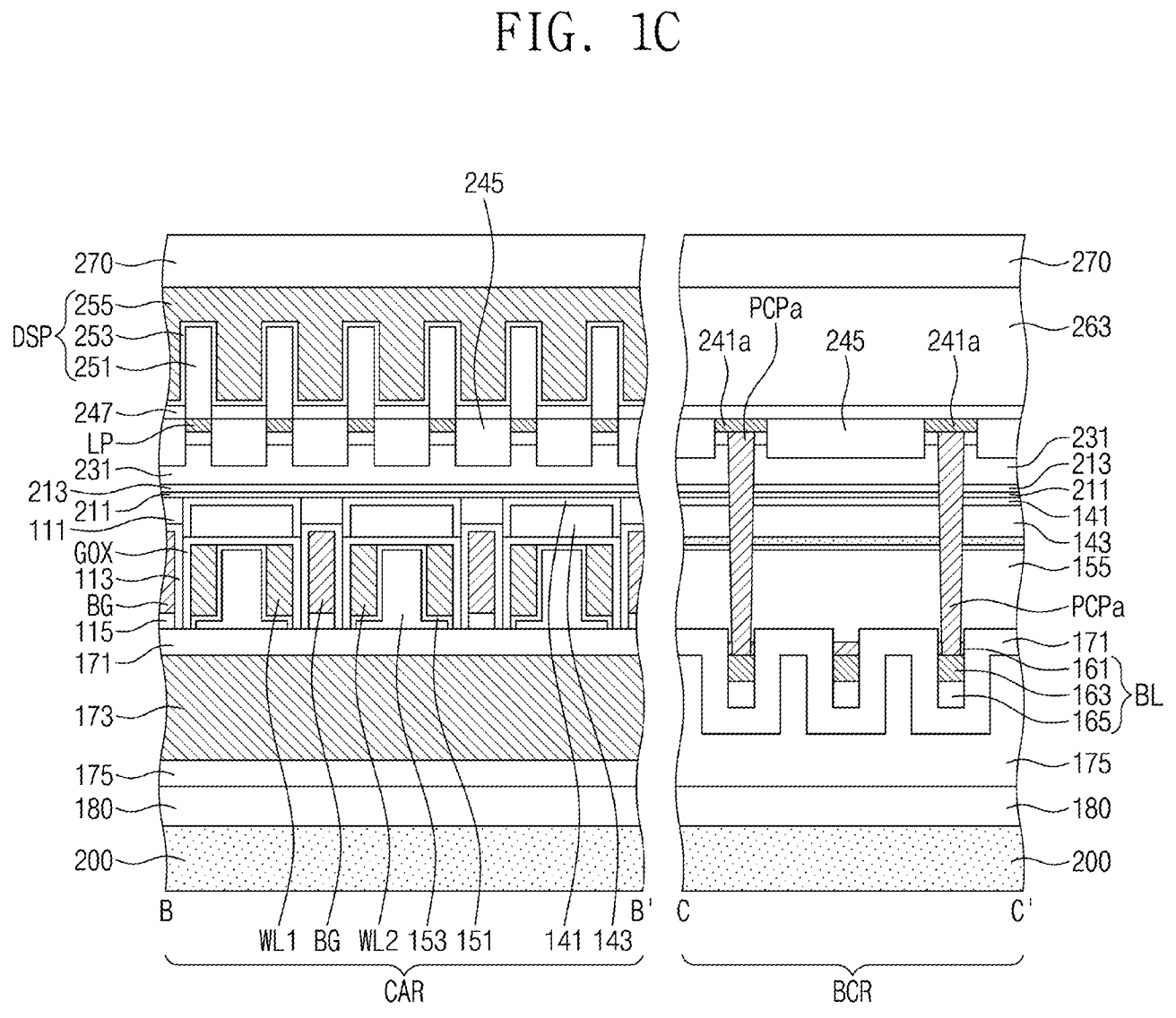
Figure 1D:
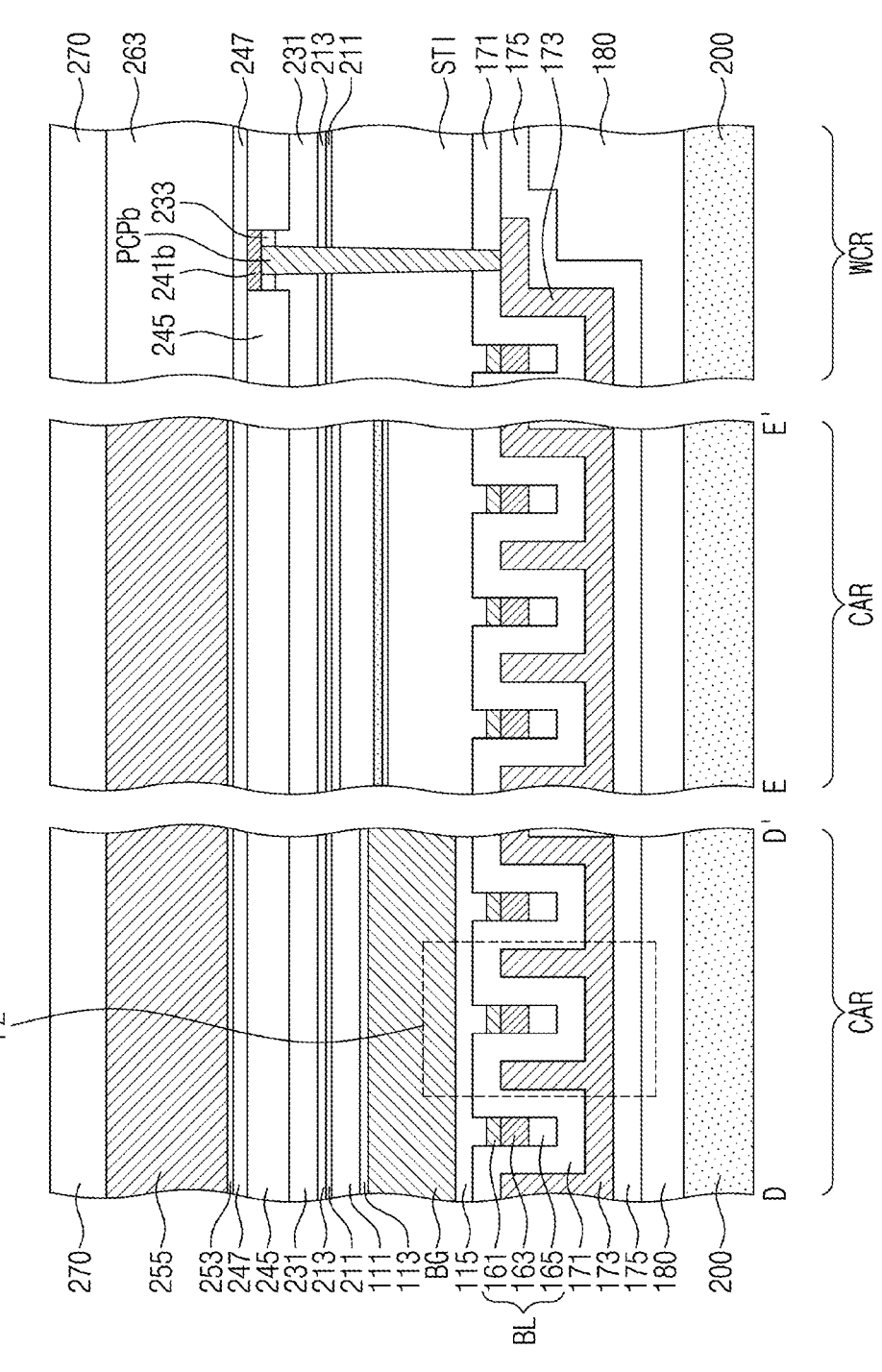
FIG. 1D is a sectional view, which is taken along lines D-D' and E-E' of FIG. 1A and on a word line connection region to illustrate a semiconductor memory device according to an embodiment.
Figure 2A:
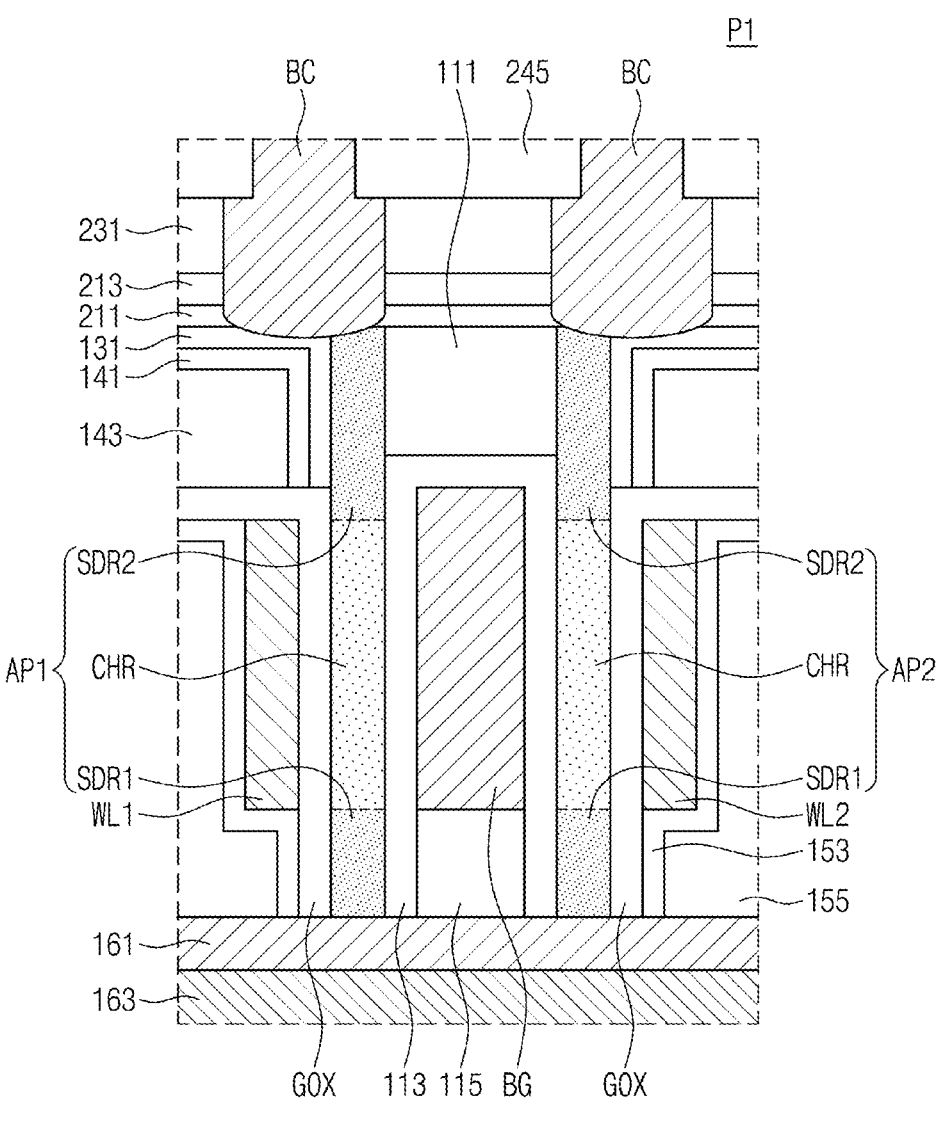
FIG. 2A is an enlarged sectional view illustrating a portion 'P1' of FIG. 1B.
Figure 2B:
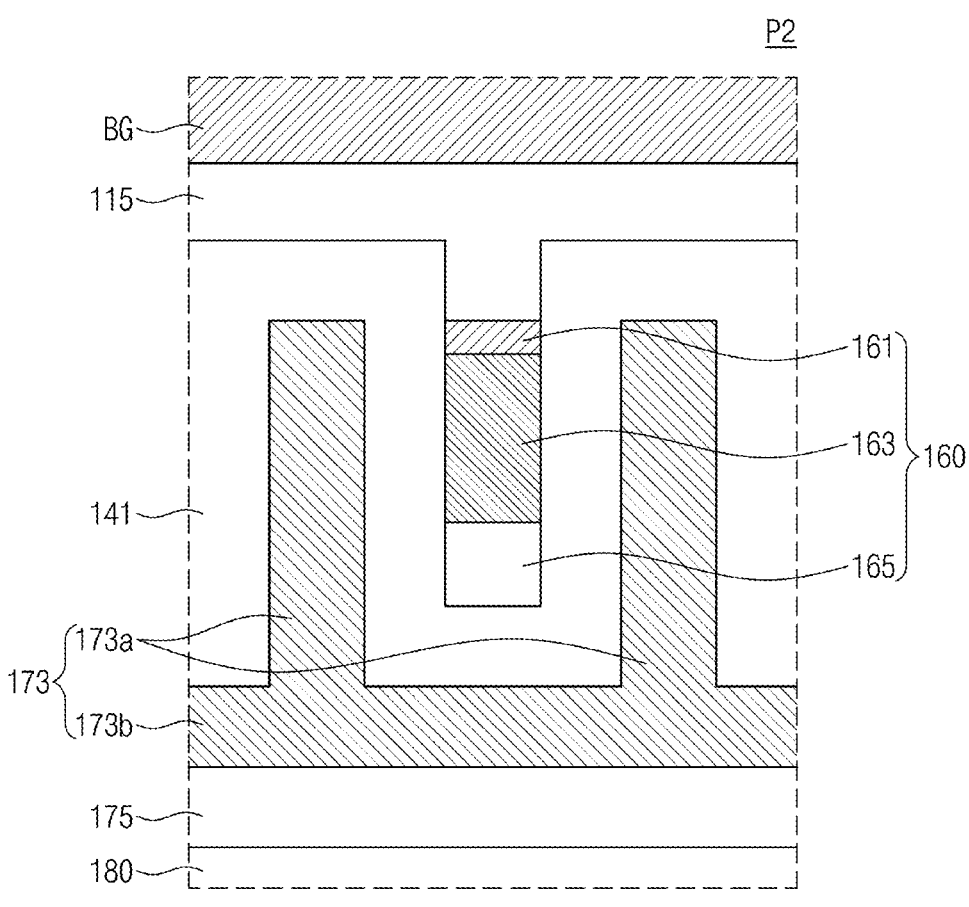
FIG. 2B is an enlarged sectional view illustrating a portion 'P2' of FIG. 1D.

FIG. 1A is a plan view illustrating a semiconductor memory device according to an embodiment. FIG. 1B is a sectional view, which is taken along a line A-A' of FIG. 1A to illustrate a semiconductor memory device according to an embodiment. FIG. 1C is a sectional view, which is taken along lines B-B' and C-C' of FIG. 1A to illustrate a semiconductor memory device according to an embodiment. FIG. 1D is a sectional view, which is taken along lines D-D' and E-E' of FIG. 1A and on a word line connection region to illustrate a semiconductor memory device according to an embodiment. FIG. 2A is an enlarged sectional view illustrating a portion 'P1' of FIG. 1B. FIG. 2B is an enlarged sectional view illustrating a portion 'P2' of FIG. 1D.

A semiconductor memory device according to an embodiment may include memory cells, each of which includes a vertical channel transistor (VCT).

Referring to FIGS. 1A, 1B, 1C, and 1D, the semiconductor memory device may include a cell array region CAR, word line connection regions WCR, and bit line connection regions BCR. The cell array region CAR may be provided between the word line connection regions WCR in a first direction D1 and may be provided between the bit line connection regions BCR in a second direction D2. Here, the first and second directions D1 and D2 may be parallel to a top surface of a substrate 200 and may be perpendicular to each other. Hereinafter, the word line connection regions WCR may be referred to as "first connection regions," and the bit line connection regions BCR may be referred to as "second connection region." That is, the first connection regions WCR may be provided at both sides of the cell array region CAR in the first direction D1, and the second connection regions BCR may be provided at both sides of the cell array region CAR in the second direction D2.

The substrate 200 may be one of a semiconductor material (e.g., silicon wafer), an insulating material (e.g., glass), or a semiconductor or conductor covered with an insulating material.

Bit lines BL may be disposed on the substrate 200 to be spaced apart from each other in the first direction D1. The bit lines BL may extend in the second direction D2, which is not parallel to the first direction D1, and may be parallel to each other.

The bit lines BL may extend from the cell array region CAR to the second connection regions BCR and may have end portions in the second connection regions BCR.

Each of the bit lines BL may include a polysilicon pattern 161, a metal pattern 163, and a hard mask pattern 165, which are sequentially stacked. The polysilicon pattern 161 may be formed of or include doped polysilicon The metal pattern 163 may be formed of or include at least one of conductive metal nitride materials (e.g., titanium nitride and tantalum nitride) or metallic materials (e.g., tungsten, titanium, and tantalum). The metal pattern 163 may be formed of or include at least one of metal silicide materials (e.g., titanium silicide, cobalt silicide, or nickel silicide). The hard mask pattern 165 may be formed of or include at least one of insulating materials (e.g., silicon nitride or silicon oxynitride). In an embodiment, the bit lines BL may include at least one of two- and three-dimensional materials, and for example, the bit lines BL may be formed of or include a carbon-based two-dimensional material (e.g., graphene), a carbon-based three-dimensional material (e.g., carbon nanotube), or combinations thereof.

In an embodiment, the semiconductor memory device may include a shielding conductive pattern 173 provided between the bit lines BL. The shielding conductive pattern 173 may be disposed on a spacer insulating layer 171, which defines gap regions between adjacent ones of the bit lines BL. A capping insulating layer 175 may be disposed on the shielding conductive pattern 173.

In detail, the spacer insulating layer 171 may be provided to have a substantially uniform thickness and to cover both side surfaces and top surfaces of the bit lines BL. The spacer insulating layer 171 may define gap regions between respective pairs of the bit lines BL. The gap regions of the spacer insulating layer 171 may extend parallel to the bit lines BL or in the second direction D2.

The spacer insulating layer 171 may extend from the cell array region CAR to the first and second connection regions WCR and BCR. In an embodiment, the spacer insulating layer 171 may include a silicon oxide layer, a silicon nitride layer, a silicon oxynitride layer, and/or a low-k dielectric layer.

The shielding conductive pattern 173 may be disposed on the spacer insulating layer 171 to fill the gap regions of the spacer insulating layer 171.

The shielding conductive pattern 173 may be formed of a conductive material. According to an embodiment, an air gap or a void may be formed in the shielding conductive pattern 173. The shielding conductive pattern 173 may be formed of or include at least one of metallic materials (e.g., tungsten (W), titanium (Ti), nickel (Ni), and cobalt (Co)). In an embodiment, the shielding conductive pattern 173 may be formed of or include at least one of conductive two-dimensional (2D) materials (e.g., graphene). The shielding conductive pattern 173 may reduce a coupling noise between adjacent ones of the bit lines BL.

When measured in the first direction D1, a length of the shielding conductive pattern 173 may be longer than the lengths of word lines WL1 and WL2. When measured in the second direction D2, a length of the shielding conductive pattern 173 may be shorter than lengths of the bit lines BL. The shielding conductive pattern 173 may extend from the cell array region CAR to the first connection regions WCR and may have an end portion on the first connection regions WCR.

In more detail, referring to FIG. 2B, the shielding conductive pattern 173 may include line portions 173a, which are disposed between adjacent ones of the bit lines BL, and a plate portion 173b, which is connected in common to the line portions 173a to connect the line portions 173a to each other.

The line portions 173a of the shielding conductive pattern 173 may extend in the second direction D2 to be parallel to each other. In the second connection regions BCR, the plate portion 173b of the shielding conductive pattern 173 may not cover the end portions of the bit lines BL.

The capping insulating layer 175 may be provided to have a substantially uniform thickness and to cover the shielding conductive pattern 173. In an embodiment, the capping insulating layer 175 may include a silicon oxide layer, a silicon nitride layer, a silicon oxynitride layer, and/or a low-k dielectric layer.

In the second connection regions BCR, the capping insulating layer 175 may be provided to fill parts of the gap regions of the spacer insulating layer 171, as shown in FIG. 1C. In the second connection regions BCR, the capping insulating layer 175 may be in direct contact with the spacer insulating layer 171. In the first connection regions WCR, the capping insulating layer 175 may cover the end portion of the shielding conductive pattern 173, as shown in FIG. 1D.

Furthermore, a planarization insulating layer 180 may be disposed between the capping insulating layer 175 and the substrate 200. The planarization insulating layer 180 may be provided such that a thickness on the cell array region CAR is different from a thickness on the first and second connection regions WCR and BCR. As an example, the planarization insulating layer 180 may be one of insulating layers, which are formed by a spin-on-glass (SOG) technique, or a silicon oxide layer.

On each of the bit lines BL, first and second active patterns AP1 and AP2 may be alternately disposed in the second direction D2. The first active patterns AP1 may be spaced apart from each other in the first direction D1 by a specific distance. The second active patterns AP2 may be spaced apart from each other in the first direction D1 by a specific distance. In other words, the first and second active patterns AP1 and AP2 may be two-dimensionally arranged in the first and second directions D1 and D2 that are not parallel to each other.

In an embodiment, the first and second active patterns AP1 and AP2 may be formed of a single-crystalline semiconductor material. For example, the first and second active patterns AP1 and AP2 may be formed of single-crystalline silicon. In the case where the first and second active patterns AP1 and AP2 are formed of the single-crystalline semiconductor material, it may be possible to reduce a leakage current during an operation of the semiconductor memory device.

Each of the first and second active patterns AP1 and AP2 may have a length in the first direction D1, a width in the second direction D2, and a height in a direction perpendicular to the first and second directions D1 and D2. Each of the first and second active patterns AP1 and AP2 may have a substantially uniform width. For example, each of the first and second active patterns AP1 and AP2 may have substantially the same width on two surfaces (hereinafter, first and second surfaces), which are opposite to each other in a vertical direction.

The widths of the first and second active patterns AP1 and AP2 in the second direction D2 may range from several nanometers to several tens of nanometers. For example, the width of the first and second active patterns AP1 and AP2 may range from 1 nm to 30 nm (or, for example, from 1 nm to 10 nm). The length of each of the first and second active patterns AP1 and AP2 in the first direction D1 may be larger than a linewidth of the bit line BL.

In more detail, referring to FIG. 2A, each of the first and second active patterns AP1 and AP2 may have a first surface and a second surface, which are opposite to each other in a direction perpendicular to the first and second directions D1 and D2. In an embodiment, the first surfaces of the first and second active patterns AP1 and AP2 may be in contact with the polysilicon pattern 161 of the bit line BL. In the case where the polysilicon pattern 161 is omitted, the first and second active patterns AP1 and AP2 may be in contact with the metal pattern 163.

Each of the first and second active patterns AP1 and AP2 may have a first side surface and a second side surface that are opposite to each other in the second direction D2. The first side surface of the first active pattern AP1 may be adjacent to the first word line WL1, and the second side surface of the second active pattern AP2 may be adjacent to the second word line WL2.

Each of the first and second active patterns AP1 and AP2 may include a first dopant region SDR1 adjacent to the bit line BL, a second dopant region SDR2 adjacent to a contact pattern BC, and a channel region CHR between the first and second dopant regions SDR1 and SDR2. The first and second dopant regions SDR1 and SDR2 may be portions of the first and second active patterns AP1 and AP2 doped with impurities, and a doping concentration in the first and second active patterns AP1 and AP2 may be higher than a doping concentration in the channel region CHR.

During the operation of the semiconductor memory device, the channel regions CHR of the first and second active patterns AP1 and AP2 may be controlled by the first and second word lines WL1 and WL2 and back-gate electrodes BG.

The back-gate electrodes BG may be disposed on the bit lines BL to be spaced apart from each other in the second direction D2 by a specific distance. The back-gate electrodes BG may extend in the first direction D1 to cross the bit lines BL. The back-gate electrodes BG may extend from the cell array region CAR to the first connection regions WCR. End portions of the back-gate electrodes BG may be disposed in the first connection regions WCR.

Each of the back-gate electrodes BG may be disposed between the first and second active patterns AP1 and AP2, which are adjacent to each other in the second direction D2. That is, the first active pattern AP1 may be disposed at a side of each of the back-gate electrodes BG, and the second active pattern AP2 may be disposed at an opposite side of each of the back-gate electrodes BG. When measured in the vertical direction, the back-gate electrodes BG may have a height that is smaller than the height of the first and second active patterns AP1 and AP2.

In an embodiment, the back-gate electrodes BG may be formed of or include at least one of doped polysilicon, conductive metal nitride materials (e.g., titanium nitride and tantalum nitride), metallic materials (e.g., tungsten, titanium, and tantalum), conductive metal silicide materials, or conductive metal oxide materials.

During the operation of the semiconductor memory device, a negative voltage may be applied to the back-gate electrodes BG to increase a threshold voltage of the vertical channel transistor. In this case, it may be possible to prevent a leakage current property of the vertical channel transistor from being deteriorated by a reduction of the threshold voltage of the vertical channel transistor, which could occur if the vertical channel transistor were to be scaled down.

In more detail, referring to FIG. 2A, the back-gate electrode BG may have a first surface and a second surface, which are located near the bit line BL and the contact pattern BC, respectively. The first and second surfaces of the back-gate electrode BG may be placed at vertical levels that are different from the first and second surfaces of the first and second active patterns AP1 and AP2.

A first insulating pattern 111 may be disposed between the first and second active patterns AP1 and AP2, which are adjacent to each other in the second direction D2. The first insulating pattern 111 may be disposed between the second dopant regions SDR2 of the first and second active patterns AP1 and AP2. The first insulating pattern 111 may extend in the first direction D1 to be parallel to the back-gate electrodes BG. A distance between the second surfaces of the first and second active patterns AP1 and AP2 and the back-gate electrode BG may vary depending on a thickness of the first insulating pattern 111. In an embodiment, the first insulating pattern 111 may be formed of or include at least one of silicon oxide, silicon oxynitride, or silicon nitride.

A back-gate insulating pattern 113 may be disposed between each back-gate electrode BG and the first and second active patterns AP1 and AP2 and between the back-gate electrode BG and the first insulating pattern 111. The back-gate insulating pattern 113 may include vertical portions covering opposite side surfaces of the back-gate electrode BG and a horizontal portion connecting the vertical portions. The horizontal portion of the back-gate insulating pattern 113 may be closer to the contact pattern BC than to the bit line BL and may cover the second surface of the back-gate electrode BG.

In an embodiment, the back-gate insulating pattern 113 may be formed of or include at least one of silicon oxide, silicon oxynitride, or high-k dielectric materials whose dielectric constants are higher than that of silicon oxide.

A back-gate capping pattern 115 may be disposed between the bit lines BL and the back-gate electrode BG. The back-gate capping pattern 115 may be formed of, or include, an insulating material. A bottom surface of the back-gate capping pattern 115 may be in contact with the polysilicon pattern 161 of the bit lines BL. The back-gate capping pattern 115 may be disposed between the vertical portions of the back-gate insulating pattern 113. A thickness of the back-gate capping pattern 115 between the bit lines BL may be different from a thickness of the back-gate capping pattern 115 on the bit lines BL.

The first and second word lines WL1 and WL2 may extend in the first direction D1, on the bit lines BL and may be alternatively arranged in the second direction D2.

The first word line WL1 may be disposed at a side of the first active pattern AP1, and the second word line WL2 may be disposed at an opposite side of the second active pattern AP2. The first and second word lines WL1 and WL2 may be vertically spaced apart from the bit lines BL and the contact patterns BC. In other words, the first and second word lines WL1 and WL2 may be placed between the bit lines BL and the contact patterns BC, when viewed in a vertical view.

Each of the first and second word lines WL1 and WL2 may have a width in the second direction D2. The width on the bit line BL may be different from the width on the shielding conductive pattern 173. Portions of the first word lines WL1 may be disposed between the first active patterns AP1, which are adjacent to each other in the first direction D1. Portions of the second word lines WL2 may be disposed between the second active patterns AP2, which are adjacent to each other in the first direction D1.

In an embodiment, the first and second word lines WL1 and WL2 may be formed of or include at least one of doped polysilicon, metallic materials, conductive metal nitride materials, conductive metal silicide materials, conductive metal oxide materials, or combinations thereof.

The first and second word lines WL1 and WL2, which are adjacent to each other, may have side surfaces facing each other. Each of the first and second word lines WL1 and WL2 may have a first surface and a second surface that are close to the bit line BL and the contact pattern BC, respectively.

The first surfaces of the first and second word lines WL1 and WL2 may have various shapes. In an embodiment, each of the first and second word lines WL1 and WL2 may have an L-shaped section.

The first and second word lines WL1 and WL2 may have a height that is smaller than the height of the first and second active patterns AP1 and AP2, when measured in the vertical direction. The height of the first and second word lines WL1 and WL2 may be equal to or smaller than the height of the back-gate electrodes BG, when measured in the vertical direction.

The first and second word lines WL1 and WL2 may extend from the cell array region CAR to the first connection regions WCR. Each of the first and second word lines WL1 and WL2 may include a line portion that extends in the first direction D1, and a protruding portion that extends in the second direction D2 and is connected to the line portion.

Furthermore, separation insulating patterns 300 may be provided in the first connection regions WCR. In each of the first connection regions WCR, the separation insulating pattern 300 may be provided to vertically penetrate the first and second word lines WL1 and WL2. In the first connection regions WCR, the first and second word lines WL1 and WL2 may be disconnected from each other by the separation insulating patterns 300.

Gate insulating patterns GOX may be disposed between the first and second word lines WL1 and WL2 and the first and second active patterns AP1 and AP2. The gate insulating patterns GOX may extend in the first direction D1 to be parallel to the first and second word lines WL1 and WL2.

The gate insulating pattern GOX may be formed of or include at least one of silicon oxide, silicon oxynitride, high-k dielectric materials having dielectric constants higher than silicon oxide, or combinations thereof. The high-k dielectric materials may include metal oxide materials or metal oxynitride materials. For example, the high-k dielectric materials for the gate insulating pattern GOX may include $HfO_2$, $HfSiO$, $HfSiON$, $HfTaO$, $HfTiO$, $HfZrO$, $ZrO_2$, $Al_2O_3$, or combinations thereof, as non-limiting examples.

Referring to FIG. 2A, the gate insulating pattern GOX may be provided to cover the first side surface of the first active pattern AP1 and the second side surface of the second active pattern AP2. The gate insulating pattern GOX may have a substantially uniform thickness. Each of the gate insulating patterns GOX may include a vertical portion that is adjacent to the first and second active patterns AP1 and AP2, and a horizontal portion that protrudes from the vertical portion in the first direction D1. In an embodiment, a pair of the first and second word lines WL1 and WL2 may be disposed on the horizontal portion of each of the gate insulating patterns GOX.

Each of the gate insulating patterns GOX may be provided to have a substantially L-shaped section. In this case, the gate insulating patterns GOX may be spaced apart from each other and may be disposed to have mirror symmetry.

A second insulating pattern 143 may be disposed between a horizontal portion HP of the gate insulating pattern GOX and the contact patterns BC. In an embodiment, the second insulating pattern 143 may be formed of or include silicon oxide. First and second etch stop layers 131 and 141 may be disposed between the second dopant regions SDR2 of the first and second active patterns AP1 and AP2 and the second insulating pattern 143.

The first and second word lines WL1 and WL2 on the gate insulating pattern GOX may be spaced apart from each other by a third insulating pattern 155. The third insulating pattern 155 may extend in the first direction D1 between the first and second word lines WL1 and WL2.

A capping layer 153 may be disposed between the third insulating pattern 155 and the first and second word lines WL1 and WL2. The capping layer 153 may have a substantially uniform thickness.

Third and fourth etch stop layers 211 and 213 and an interlayer insulating layer 231 may be provided on the cell array region CAR to cover the second surfaces of the first and second active patterns AP1 and AP2. The interlayer insulating layer 231 may extend to the first and second connection regions WCR and BCR to cover a top surface of a device isolation layer STI and a peripheral gate electrode PG.

The contact patterns BC may be provided to penetrate the interlayer insulating layer 231 and the third and fourth etch stop layers 211 and 213. The contact patterns BC may be coupled to the first and second active patterns AP1 and AP2, respectively. In other words, the contact patterns BC may be coupled to the second dopant regions of the first and second active patterns AP1 and AP2, respectively. A lower width of the contact pattern BC may be larger than an upper width thereof. Adjacent ones of the contact patterns BC may be spaced apart from each other by separation insulating patterns 245. Each of the contact patterns BC may have one of various shapes (e.g., circular, elliptical, rectangular, square, rhombic, and hexagonal shapes), when viewed in a plan view.

The contact patterns BC may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments are not limited to this example.

Landing pads LP may be disposed on the contact patterns BC. Each of the landing pads LP may have one of various shapes (e.g., circular, elliptical, rectangular, square, rhombic, and hexagonal shapes), when viewed in a plan view.

The separation insulating patterns 245 may be disposed between the landing pads LP. The landing pads LP may be arranged in the first and second directions D1 and D2 to form a matrix-shaped arrangement, when viewed in a plan view. The landing pads LP may be provided to have top surfaces that are substantially coplanar with top surfaces of the separation insulating patterns 245.

The landing pads LP may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to this example.

In the cell array region CAR, data storage patterns DSP may be disposed on the landing pads LP, respectively. The data storage patterns DSP may be electrically connected to the first and second active patterns AP1 and AP2, respectively. The data storage patterns DSP may be arranged in the first and second directions D1 and D2 to form a matrix-shaped arrangement, as shown in FIG. 1A. The data storage patterns DSP may be fully or partially overlapped with the landing pads LP. Each of the data storage patterns DSP may be in contact with the entire or partial region of the top surface of a corresponding one of the landing pads LP.

In an embodiment, the data storage patterns DSP may be a capacitor and may include a capacitor dielectric layer 253, which is interposed between storage electrodes 251 and a plate electrode 255. In this case, the storage electrode 251 may be in contact with the landing pad LP and may have one of circular, elliptical, rectangular, square, rhombic, and hexagonal shapes, when viewed in a plan view. The data storage patterns DSP may be fully or partially overlapped with the landing pads LP. Each of the data storage patterns DSP may be in contact with the entire or partial region of the top surface of a corresponding one of the landing pads LP.

In some implementations, the data storage pattern DSP may be a variable resistance pattern whose resistance can be switched to one of at least two states by an electric pulse applied thereto. For example, the data storage pattern DSP may be formed of or include at least one of phase-change materials whose crystal state can be changed depending on an amount of a current applied thereto, such as, for example, perovskite compounds, transition metal oxides, magnetic materials, ferromagnetic materials, or antiferromagnetic materials.

An upper insulating layer 270 may be disposed on the data storage patterns DSP. The upper insulating layer 270 may cover the plate electrode 255.

In an embodiment, word line contact plugs, which are coupled to the first and second word lines WL1 and WL2, may be disposed in the first connection regions WCR. Bit line contact plugs PCPa, which are coupled to the bit lines BL, may be disposed in the second connection regions BCR. In addition, shielding contact plugs PCPb, which are coupled to the shielding conductive pattern 173, may be disposed in the first connection regions WCR.

Furthermore, a peripheral active pattern 110 may be disposed on the substrate 200 and in the first and second connection regions WCR and BCR. The peripheral active pattern 110 may be formed of or include the same single-crystalline semiconductor material as the first and second active patterns AP1 and AP2 of the cell array region CAR. The peripheral active pattern 110 may have a first surface that is adjacent to the substrate 200, and a second surface that is opposite to the first surface. The first surface of the peripheral active pattern 110 may be substantially coplanar with the first surfaces of the first and second active patterns AP1 and AP2. The second surface of the peripheral active pattern 110 may be substantially coplanar with the second surfaces of the first and second active patterns AP1 and AP2.

The device isolation layer STI may be disposed on the substrate 200 and in the first and second connection regions WCR and BCR to penetrate or enclose the peripheral active pattern 110.

Peripheral transistors may be provided on the second surface of the peripheral active pattern 110. In an embodiment, the peripheral transistors may constitute row and column decoders, sense amplifiers, or control logics.

In detail, a peripheral gate insulating layer 215 may be disposed on the second surface of the peripheral active pattern 110. The peripheral gate electrode PG may be disposed on the peripheral gate insulating layer 215. The peripheral gate electrode PG may include a peripheral conductive pattern 221, a peripheral metal pattern 223, and a peripheral mask pattern 225.

The bit line contact plugs PCPa may be provided in the second connection regions BCR to penetrate the device isolation layer STI and may be coupled to end portions of the bit lines BL. The shielding contact plugs PCPb may be provided in the first connection region WCR to penetrate the device isolation layer STI and may be coupled to an end portion of the shielding conductive pattern 173. Peripheral contact plugs PCPc may be coupled to the peripheral transistors, in the first and second connection regions WCR and BCR.

The bit line contact plugs PCPa may be connected to first peripheral interconnection lines 241a. The shielding contact plugs PCPb may be connected to second peripheral interconnection lines 241b. The peripheral contact plugs PCPc may be connected to third peripheral interconnection lines 241c.

On the first and second connection regions WCR and BCR, the separation insulating pattern 245 may be provided to electrically disconnect the first, second, and third peripheral interconnection lines 241a, 241b, and 241c from each other.

A peripheral circuit insulating layer 263 and the upper insulating layer 270 may be disposed on the first, second, and third peripheral interconnection lines 241a, 241b, and 241c. An etch stop layer 247 may be disposed between the peripheral circuit insulating layer 263 and the first, second, and third peripheral interconnection lines 241a, 241b, and 241c.

Hereinafter, semiconductor memory devices according to various embodiments will be described. In the following description, a previously described element may be identified by the same reference number without repeating an overlapping description thereof, for the sake of brevity.

Figure 3A:
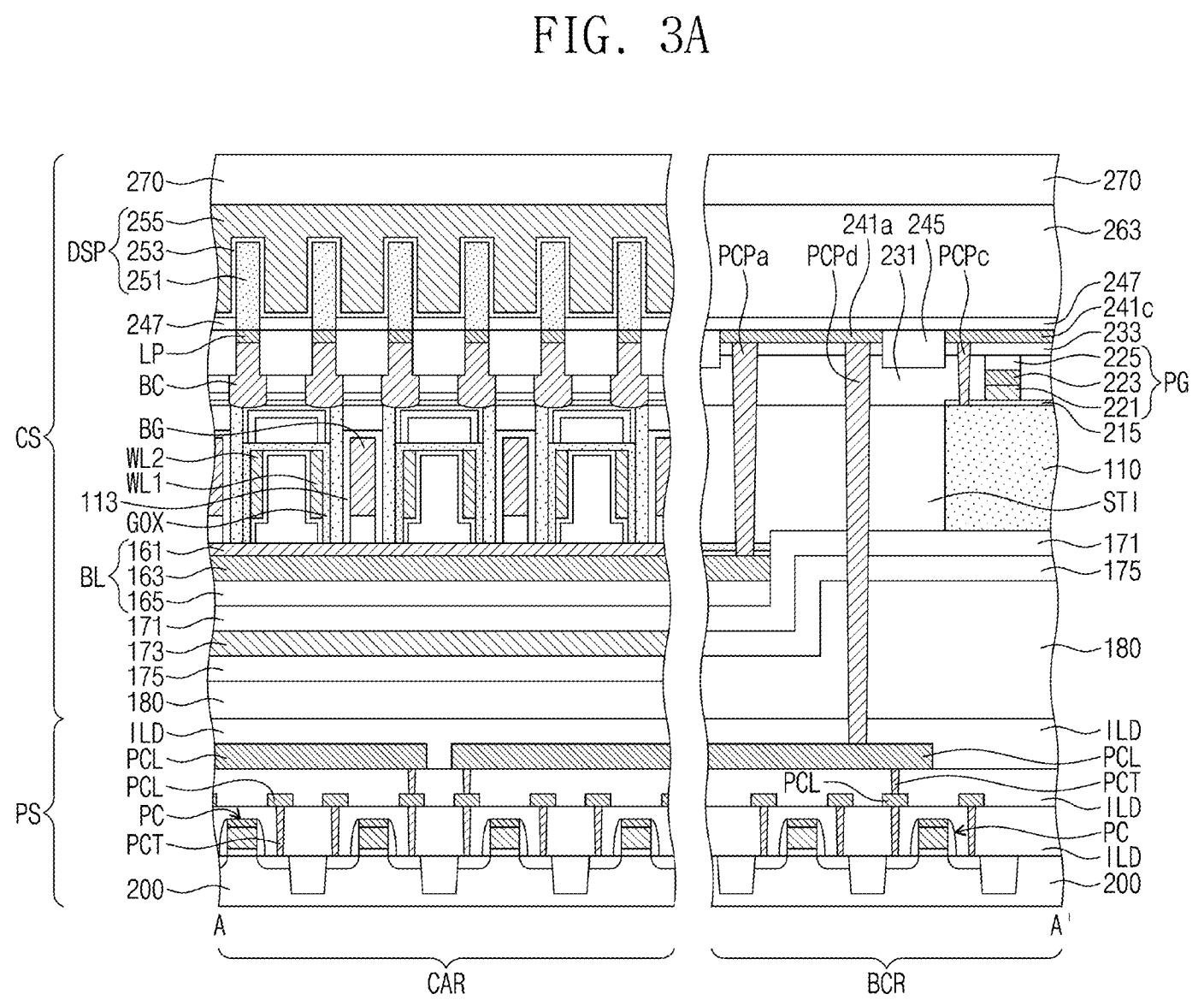
Figure 3B:
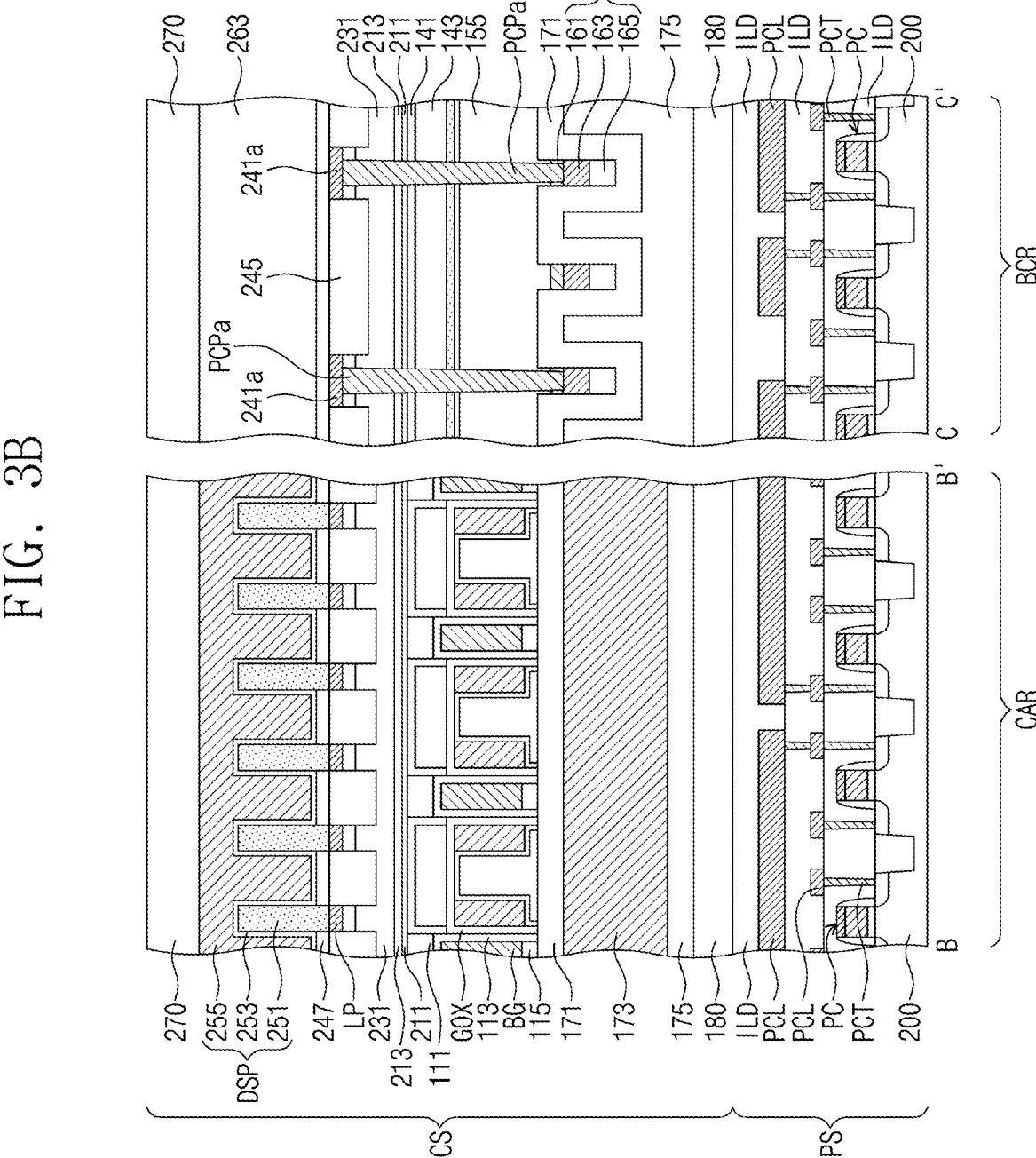
Figure 3C:
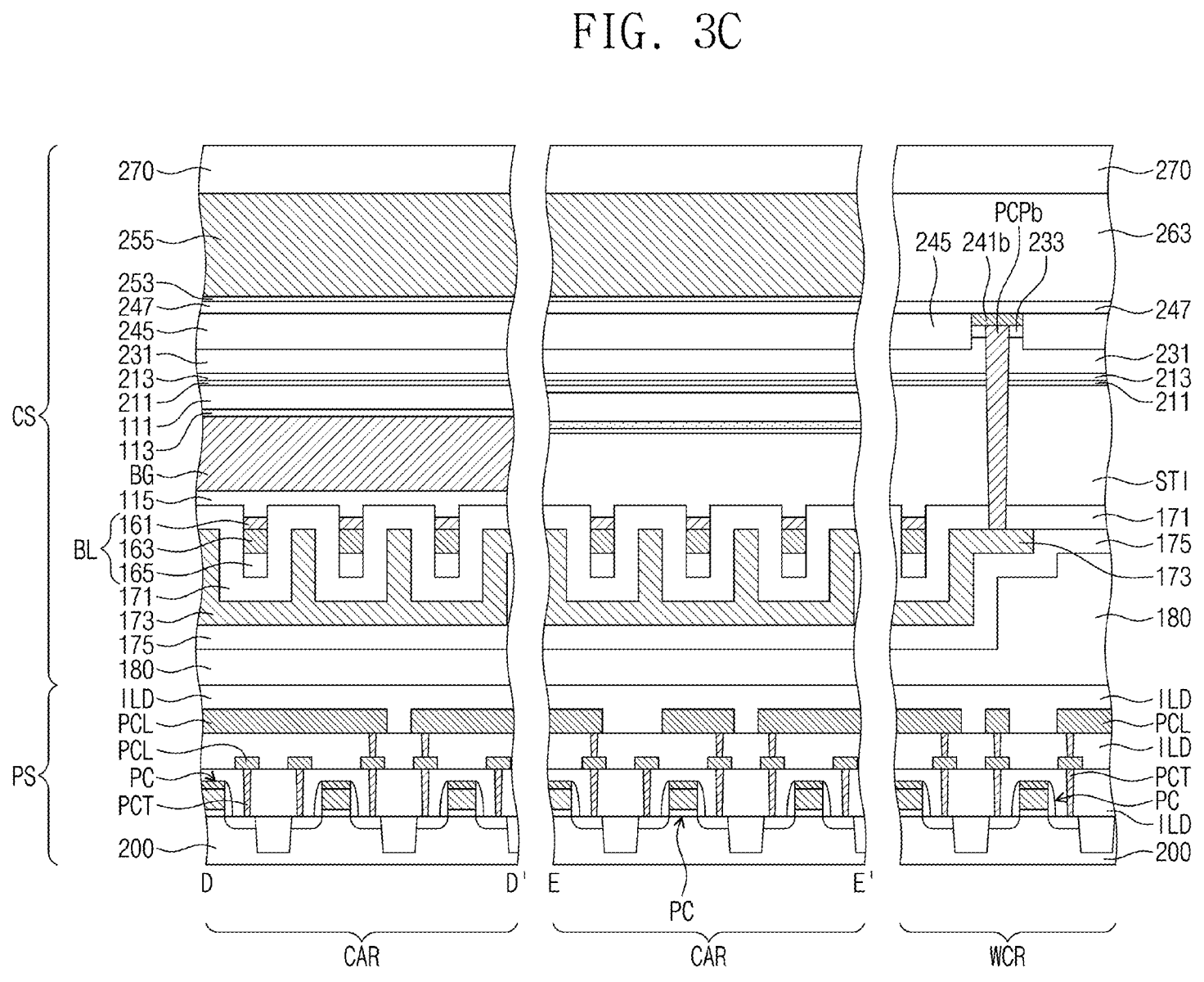
Figure 4A:
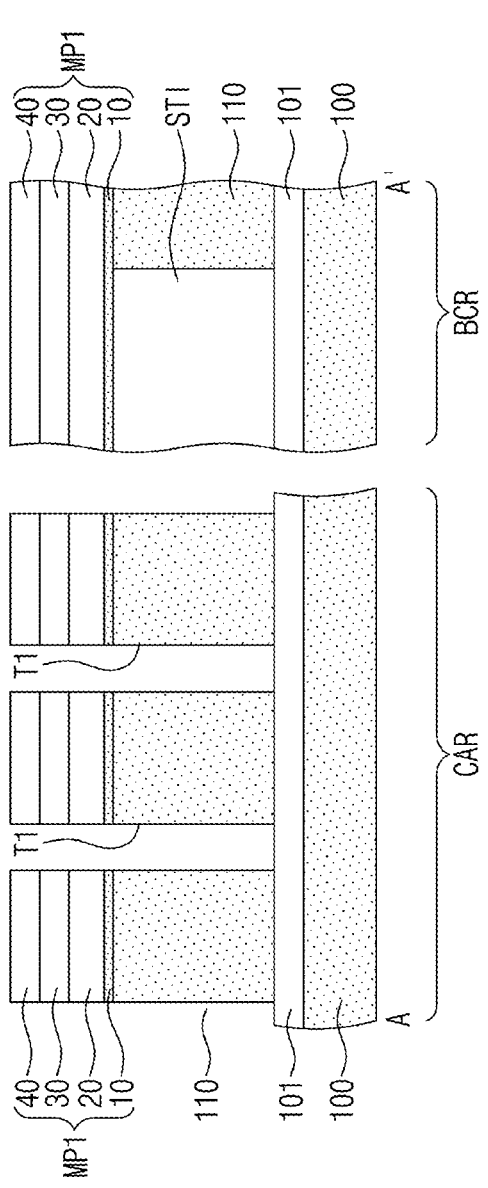
Figure 4B:
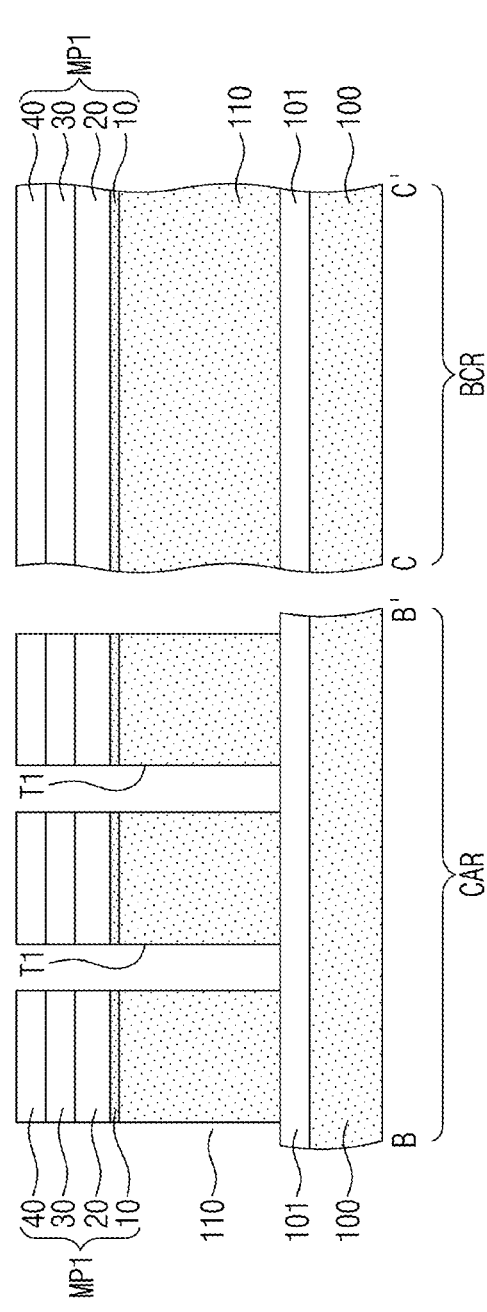
Figure 4C:
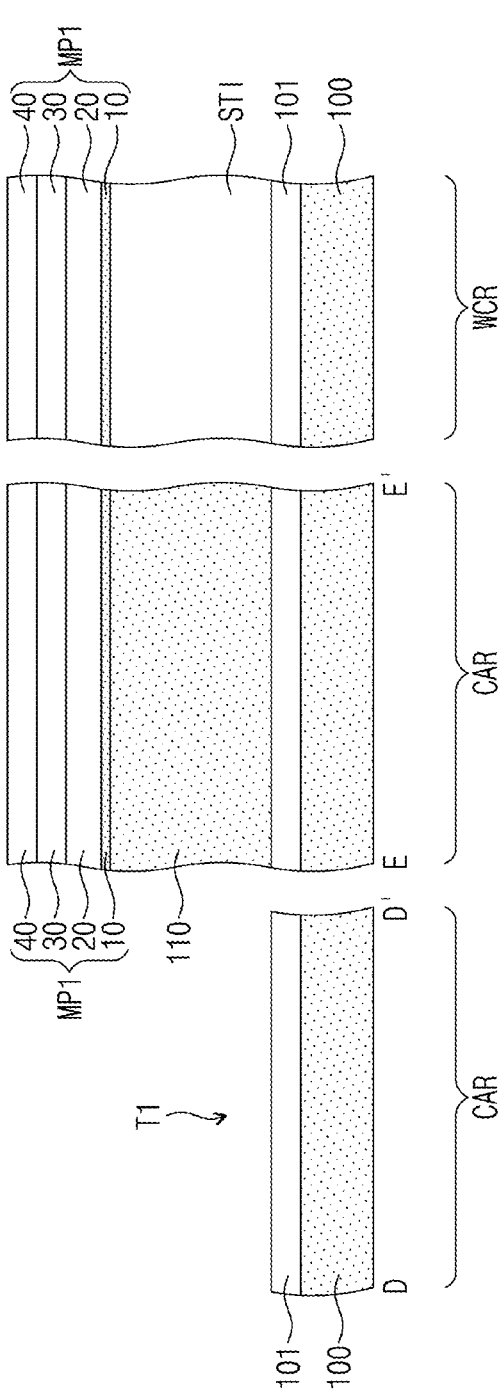
Figure 5A:
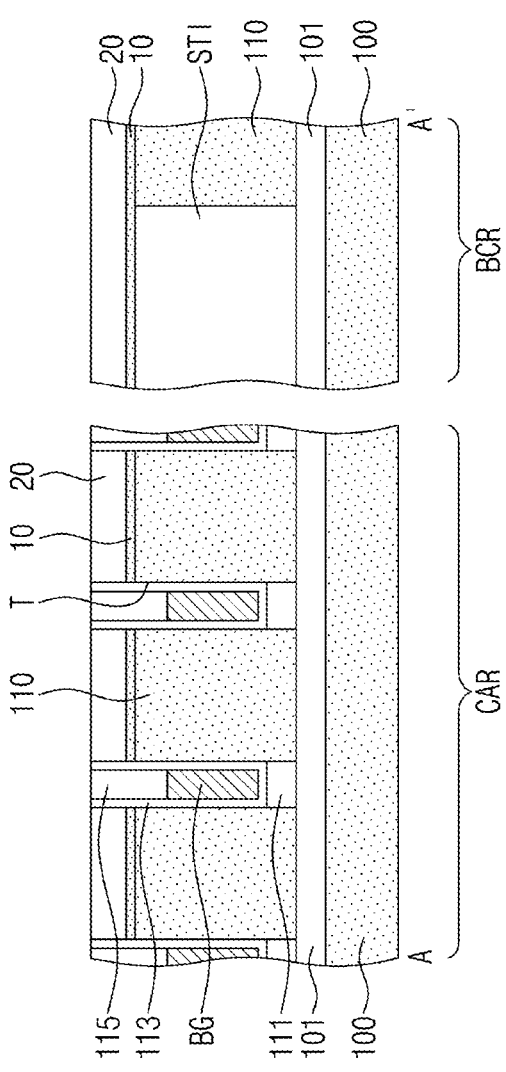
Figure 5B:
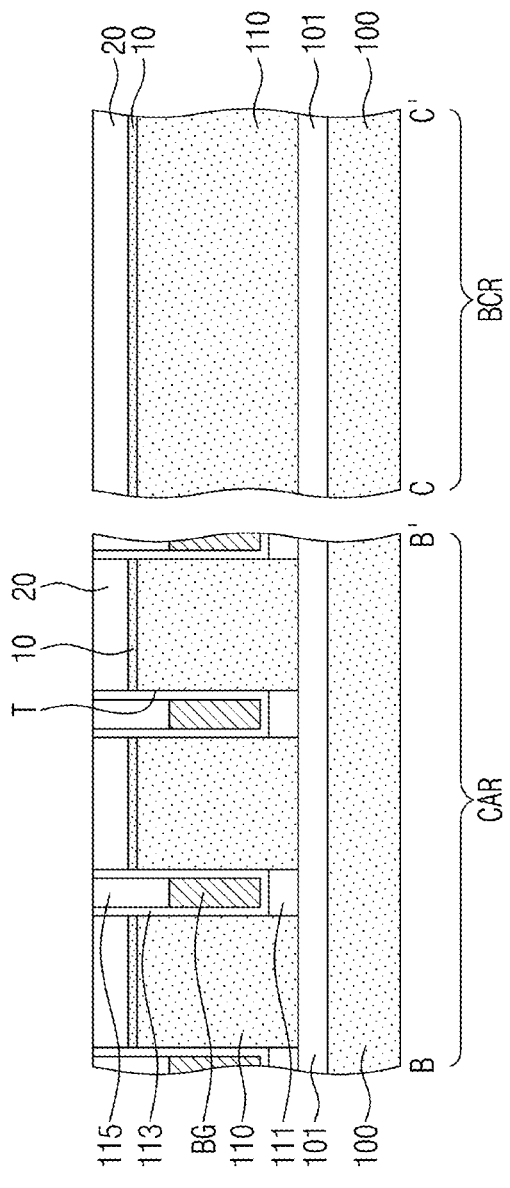
Figure 5C:
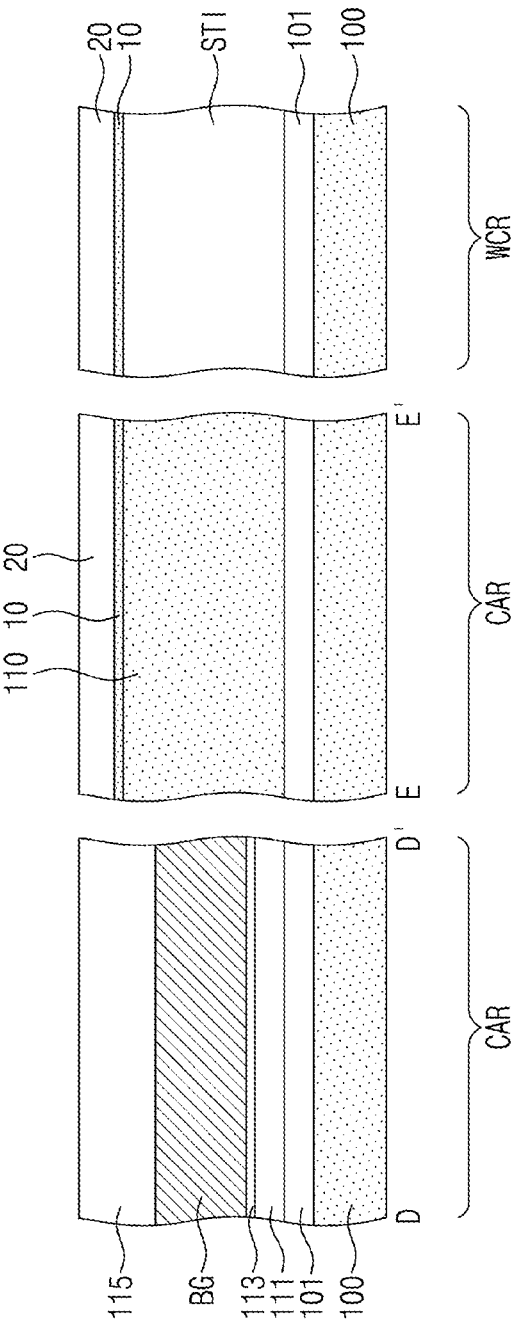
Figure 6A:
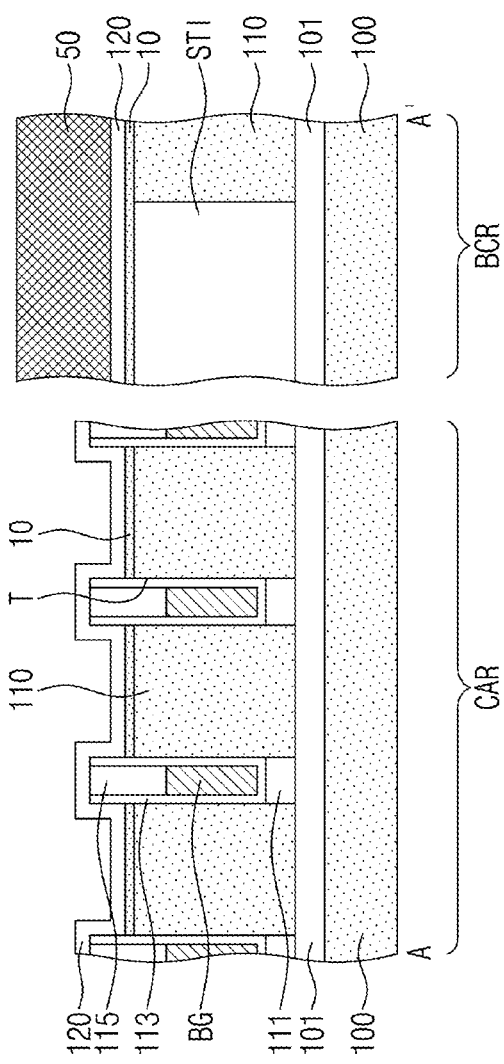
Figure 6B:
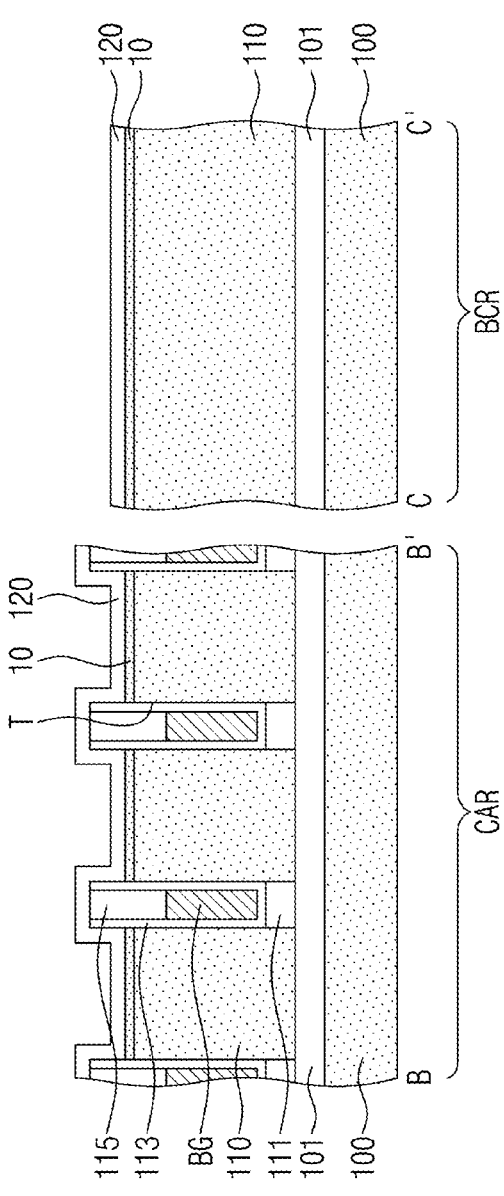
Figure 6C:
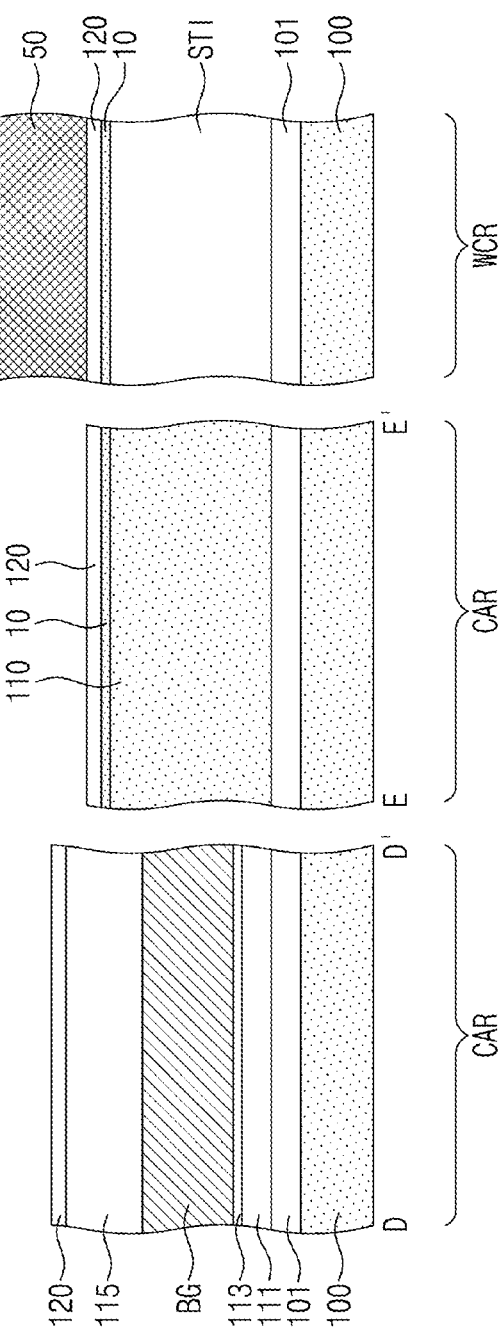

FIGS. 3A, 3B, and 3C are sectional views that are taken along the lines A-A', B-B', C-C', D-D', and E-E' of FIG. 1A and on the word line connection region to illustrate a semiconductor memory device according to an embodiment.

Referring to FIGS. 3A, 3B, and 3C, the semiconductor memory device may include a peripheral circuit structure PS and a cell array structure CS, which are connected to each other.

In detail, the cell array structure CS may be provided on the peripheral circuit structure PS. As previously described with reference to FIGS. 1A, 1, and 1C, the cell array structure CS may include a vertical channel transistor (VCT), which is used as a cell transistor of each memory cell, and a capacitor, which is used as a data storage device of each memory cell.

The peripheral circuit structure PS may be disposed between the substrate 200 and the cell array structure CS. In an embodiment, the substrate 200 may be a single-crystalline silicon wafer.

The peripheral circuit structure PS may be disposed between the substrate 200 and the planarization insulating layer 180 of the cell array structure CS. The peripheral circuit structure PS may include core and peripheral circuits PC, which are formed on the substrate 200, peripheral circuit insulating layers ILD, which cover the core and peripheral circuits PC and are stacked between the substrate 200 and the planarization insulating layer 180, and peripheral metal structures PCT and PCL, which are disposed in the peripheral circuit insulating layers ILD.

The core and peripheral circuits PC may include row and column decoders, sense amplifiers, control logics, or the like. In an embodiment, the core and peripheral circuits PC may include NMOS and PMOS transistors integrated on the substrate 200.

On the substrate 200, the peripheral circuit insulating layer ILD may cover the core and peripheral circuits PC and the peripheral metal structures PCL and PCT. The peripheral circuit insulating layer ILD may include a plurality of vertically-stacked insulating layers. In an embodiment, the peripheral circuit insulating layer ILD may include a silicon oxide layer, a silicon nitride layer, a silicon oxynitride layer, and/or a low-k dielectric layer.

The peripheral metal structures PCT and PCL may include at least two metal patterns PCL and metal plugs PCT, which are connected to the metal patterns PCL.

The core and peripheral circuits PC may be electrically connected to the bit lines BL of the cell array structure CS through the peripheral metal structures PCL and PCT, the first peripheral interconnection lines 241a, and peripheral contact plugs PCPd.

The cell array structure CS may include memory cells including vertical channel transistors (VCTs), similar to that in the previous embodiment. The vertical channel transistor may refer to a transistor whose channel region is elongated in a direction perpendicular to the top surface of the substrate 200. The cell array structure CS may include the bit lines BL, the first and second active patterns AP1 and AP2, the first and second word lines WL1 and WL2, and the data storage patterns DSP.

The bit lines BL of the cell array structure CS may be disposed adjacent to the peripheral circuit structure PS. When the bit lines BL are disposed adjacent to the peripheral circuit structure PS, a length of an electric connection path between the bit lines BL and the core and peripheral circuits PTR may be reduced.

FIGS. 4A to 24A, FIGS. 4B to 24B, and FIGS. 4C to 24C are sectional views illustrating a method of fabricating a semiconductor memory device, according to an embodiment. FIGS. 4A to 24A are sectional views taken along a line A-A' of FIG. 1A, FIGS. 4B to 24B are sectional views taken along lines B-B' and C-C' of FIG. 1A, and FIGS. 4C to 24C are sectional views, which are taken along lines D-D' and E-E' of FIG. 1A and on the word line connection region.

Referring to FIGS. 1A, 4A, 4B, and 4C, a first substrate structure including a first substrate 100, a buried insulating layer 101, and an active layer 110 may be prepared.

The buried insulating layer 101 and the active layer 110 may be provided on the first substrate 100. The first substrate 100, the buried insulating layer 101, and the active layer 110 may constitute a silicon-on-insulator substrate (i.e., SOI substrate).

In an embodiment, the first substrate 100 may be a silicon substrate, a germanium substrate, and/or a silicon-germanium substrate. The first substrate 100 may include the word line connection regions (i.e., the first connection regions WCR), which are spaced apart from each other in the first direction D1, and the cell array region CAR, which is interposed therebetween, and may include bit line connection regions (i.e., the second connection regions BCR), which are spaced apart from each other in the second direction D2, and the cell array region CAR, which is interposed therebetween. The first and second directions D1 and D2 may be parallel to the top surface of the first substrate 100 and may be parallel to each other.

The buried insulating layer 101 may be a buried oxide (BOX) layer, which may be formed by a separation-by-implanted oxygen (SIMOX) method or by a bonding and layer-transfer method. In some implementations, the buried insulating layer 101 may be an insulating layer, which may be formed by a chemical vapor deposition method. In an embodiment, the buried insulating layer 101 may include a silicon oxide layer, a silicon nitride layer, a silicon oxynitride layer, and/or a low-k dielectric layer.

The active layer 110 may be a single-crystalline semiconductor layer. For example, the active layer 110 may be a single-crystalline silicon substrate, a single-crystalline germanium substrate, and/or a single-crystalline silicon-germanium substrate. The active layer 110 may have a first surface and a second surface, which are opposite to each other. The second surface may be in contact with the buried insulating layer 101.

The device isolation layer STI may be formed in the active layer 110 and in the first and second connection regions WCR and BCR. The device isolation layer STI may be formed by patterning the active layer 110 in the first and second connection regions WCR and BCR to form a device isolation trench exposing the buried insulating layer 101 and filling the device isolation trench with an insulating material. A top surface of the device isolation layer STI may be substantially coplanar with the first surface of the active layer 110. As a result of the formation of the device isolation layer STI, the peripheral active pattern 110 may be formed in the first and second connection regions WCR and BCR.

After the formation of the device isolation layer STI, a first mask pattern MP1 may be formed on the first surface of the active layer 110. The first mask pattern MP1 may have line-shaped openings, which are provided on the cell array region CAR and extend in a first direction D1.

The first mask pattern MP1 may include a buffer layer 10, a first mask layer 20, a second mask layer 30, and a third mask layer 40, which are sequentially stacked. The third mask layer 40 may be formed of a material having an etch selectivity with respect to the second mask layer 30. The first mask layer 20 may be formed of a material having an etch selectivity with respect to the buffer layer 10 and the second mask layer 30. As an example, the buffer layer 10 and the second mask layer 30 may be formed of or include silicon oxide, and the first and third mask layers 20 and 40 may be formed of or include silicon nitride.

Thereafter, the active layer 110 of the cell array region CAR may be anisotropically etched using the first mask pattern MP1 as an etch mask. Accordingly, first trenches T1, which extend in the first direction D1, may be formed in the active layer 110 of the cell array region CAR. The first trenches T1 may be formed to expose the buried insulating layer 101 and may be spaced apart from each other in a second direction D2 by a specific distance.

Referring to FIGS. 1A, 5A, 5B, and 5C, the first insulating patterns 111 may be formed to fill lower portions of the first trenches T1. The first insulating patterns 111 may be formed by depositing an insulating material to fill the first trenches T1 and isotropically etching the insulating material. Each of the first insulating patterns 111 may be formed to partially expose side surfaces of a corresponding one of the first trenches T1.

After the formation of the first insulating pattern 111, the back-gate insulating patterns 113 and the back-gate electrodes BG may be formed in the first trenches T1.

In detail, after the formation of the first insulating pattern 111, a gate insulating layer may be deposited to conformally cover inner surfaces of the first trenches T1. Then, a gate conductive layer may be deposited to fill the first trenches T1 provided with the gate insulating layer. Thereafter, the gate conductive layer may be isotropically etched to form the back-gate electrodes BG in the first trenches T1, respectively. The third mask layer 40 may be removed during the formation of the back-gate electrode BG.

In an embodiment, before the formation of the back-gate insulating patterns 113, a gas-phase doping (GPD) process or a plasma doping (PLAD) process may be performed to dope the active layers 110, which are exposed through inner side surfaces of the first trenches T1, with impurities.

The back-gate capping patterns 115 may be formed in the first trenches T1 provided with the back-gate electrodes BG. The back-gate capping patterns 115 may be formed by depositing an insulating layer to fill the first trenches T1 provided with the back-gate electrodes BG and planarizing the insulating layer to expose a top surface of the first mask layer 20. In the case where the back-gate capping patterns 115 are formed of the same material (e.g., silicon oxide) as the second mask layer 30, the second mask layer 30 may be removed by the planarization process, which is performed to form the back-gate capping patterns 115.

Meanwhile, before the formation of the back-gate capping patterns 115, a gas-phase doping (GPD) process or a plasma doping (PLAD) process may be performed to inject impurities into the active layers 110 through the first trench provided with the back-gate electrode BG.

Referring to FIGS. 1A, 6A, 6B, and 6C, the first mask layer 20 may be removed after the formation of the back-gate capping patterns 115, and the back-gate capping patterns 115 may have a shape protruding above the top surface of the buffer layer.

Thereafter, a spacer layer 120 may be formed to conformally cover the top surface of the buffer layer 10, side surfaces of the back-gate insulating patterns 113, and top surfaces of the back-gate capping patterns 115. Active patterns of the vertical channel transistors may have a width that is determined by a deposition thickness of the spacer layer 120. The spacer layer 120 may be formed of an insulating material. For example, the spacer layer 120 may be formed of or include at least one of silicon oxide, silicon oxynitride, silicon nitride, silicon carbide (SiC), silicon carbon nitride (SiCN), or combinations thereof.

After the formation of the spacer layer 120, a peripheral mask pattern 50 may be formed on the spacer layer 120 in the first and second connection regions WCR and BCR to expose the cell array region CAR.

Referring to FIGS. 1A, 7A, 7B, and 7C, an anisotropic etching process may be performed on the spacer layer 120 to form a pair of spacers 121 on side surfaces of each back-gate insulating pattern 113.

Next, an anisotropic etching process using the spacers 121 as an etch mask may be performed on the peripheral active pattern 110. A pair of preliminary active patterns PAP that are separated from each other may be formed at both sides of each of the back-gate insulating patterns 113. As a result of the formation of the preliminary active patterns PAP, the buried insulating layer 101 may be exposed to the outside. The preliminary active patterns PAP may be line-shaped patterns that extend in the first direction D1 and that are parallel to the back-gate electrode BG. A second trench T2 may be formed between the preliminary active patterns PAP, which are adjacent to each other in the second direction D2.

After the formation of the spacers 121, the peripheral mask pattern 50 may be removed. In an embodiment, a portion of the spacer layer 120 may be left on the buffer layer 10 and in the first and second connection regions WCR and BCR.

Referring to FIGS. 1A, 8A, 8B, and 8C, the first etch stop layer 131 may be formed to conformally cover an inner surface of the second trench T2. A first sacrificial layer 133 may be formed to fill the second trench T2 provided with the first etch stop layer 131. The first sacrificial layer 133 may be formed to fill the second trench T2 and may have a substantially flat top surface.

The first etch stop layer 131 may be formed by depositing an insulating material (e.g., silicon oxide). The first sacrificial layer 133 may be formed of an insulating material having an etch selectivity with respect to the first etch stop layer 131. For example, the first sacrificial layer 133 may be one of insulating layers, which are formed by a spin-on-glass (SOG) technique, or a silicon oxide layer.

The first etch stop layer 131 and the first sacrificial layer 133 may be sequentially stacked on the spacer layer 120 in the first and second connection regions WCR and BCR.

A second mask pattern MP2 may be formed on the first sacrificial layer 133. The second mask pattern MP2 may be formed of a material having an etch selectivity with respect to the first sacrificial layer 133 and may be a line-shaped pattern that extends in the second direction D2. In some implementations, the second mask pattern MP2 may be a line-shaped pattern that extends in a direction crossing the first and second directions D1 and D2.

Thereafter, openings OP partially exposing the preliminary active patterns PAP may be formed by sequentially etching the first sacrificial layer 133 and the first etch stop layer 131 using the second mask pattern MP2 as an etch mask. The openings OP may be formed to expose a top surface of the buried insulating layer 101. In an embodiment, the spacers 121 exposed by the second mask pattern MP2 may be removed during the etching process on the first sacrificial layer 133 and the first etch stop layer 131.

The preliminary active patterns PAP, which are exposed to the openings OP, may be anisotropically etched to form the first and second active patterns AP1 and AP2 at both sides of the back-gate insulating pattern 113. That is, the first active patterns AP1 on a first side surface of the back-gate electrode BG may be formed to be spaced apart from each other in the first direction D1. The second active patterns AP2 may be formed on a second side surface of the back-gate electrode BG and may be spaced apart from each other in the first direction D1. In the case where the second mask pattern MP2 extends in the diagonal direction, the first and second active patterns AP1 and AP2 may be disposed to face each other in the diagonal direction.

Referring to FIGS. 1A, 9A, 9B, and 9C, after the formation of the first and second active patterns AP1 and AP2, a second sacrificial layer 135 may be formed to fill the openings OP. The second sacrificial layer 135 may be formed of an insulating material having an etch selectivity with respect to the first etch stop layer 131. As an example, the second sacrificial layer 135 may be formed of the same material as the first sacrificial layer 133.

After the formation of the second sacrificial layer 135, the second mask pattern MP2 may be removed. A planarization process may be performed on the first and second sacrificial layers 133 and 135 to expose a top surface of the back-gate capping pattern 115. As a result of the planarization process on the first and second sacrificial layers 133 and 135, the buffer layer 10 may be exposed in the first and second connection regions WCR and BCR.

Referring to FIGS. 1A, 10A, 10B, and 10C, the first and second sacrificial layers 133 and 135 may be removed to expose the first etch stop layer 131 between the first and second active patterns AP1 and AP2, which are opposite to each other in the second direction D2.

Thereafter, the second etch stop layer 141 may be deposited with a uniform thickness in the second trench, in which the first etch stop layer 131 is formed. In detail, the second etch stop layer 141 may be deposited on the first etch stop layer 131, the back-gate insulating patterns 113, the back-gate capping patterns 115, portions of the buried insulating layer 101, and the buffer layer 10 in the first and second connection regions WCR and BCR. The second etch stop layer 141 may be formed of or include a material having an etch selectivity with respect to the first etch stop layer 131.

The second insulating pattern 143 may be formed to fill a portion of the second trench T2 (e.g., see FIGS. 7A, 7B, and 7C) provided with the second etch stop layer 141.

The second insulating pattern 143 may be formed by forming an insulating layer using a spin-on-glass (SOG) technology to fill the second trench T2 and then isotropically etching the insulating layer. The second insulating pattern 143 may be formed of or include at least one of fluoride silicate glass (FSG), spin-on-glass (SOG), tonen silazene (TOSZ), etc.

A level of a top surface of the second insulating pattern 143 may be changed depending on the isotropic etching process. In an embodiment, the top surface of the second insulating pattern 143 may be located at a level higher than a bottom surface of the back-gate electrode BG. In some implementations, the top surface of the second insulating pattern 143 may be located at a level lower than the bottom surface of the back-gate electrode BG.

Figure 7A:
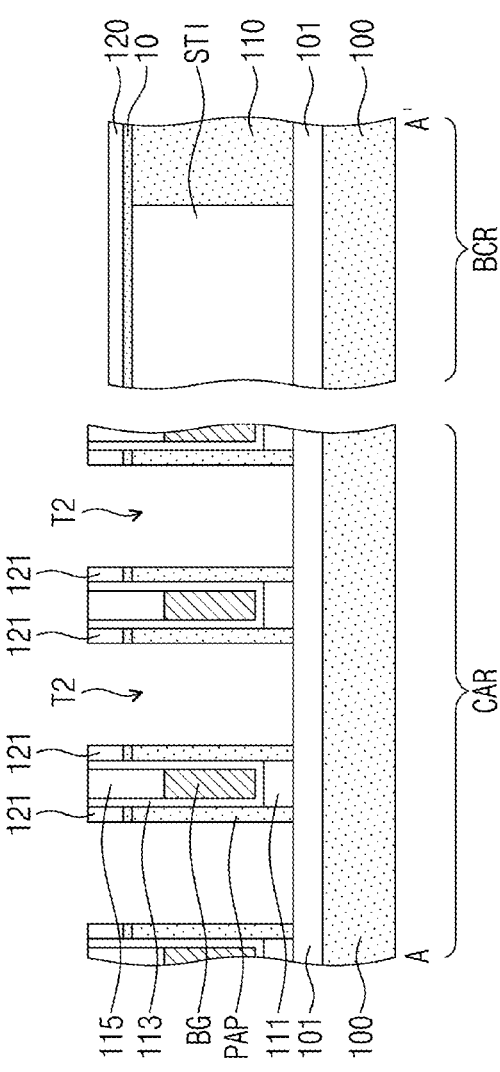
Figure 7B:
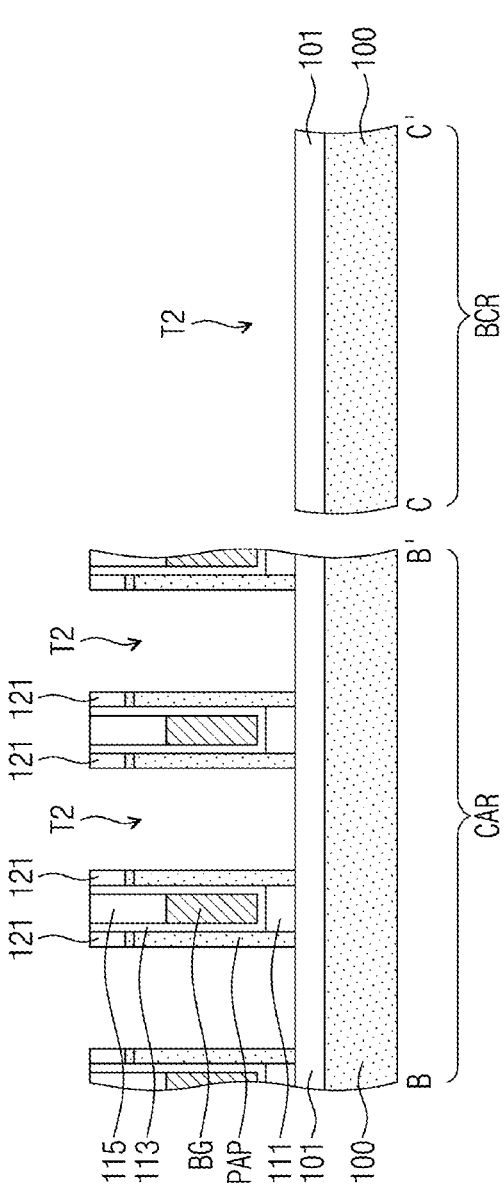
Figure 7C:
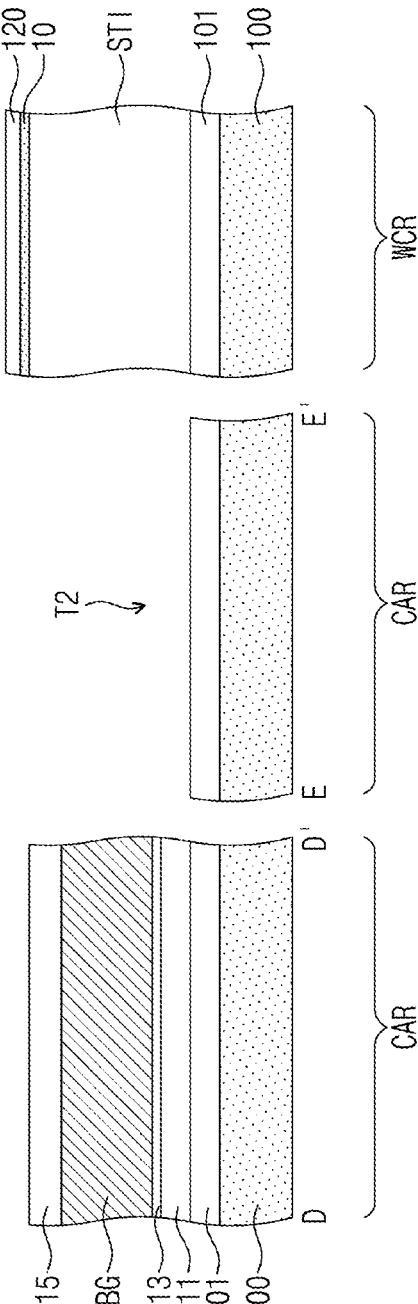
Figure 8A:
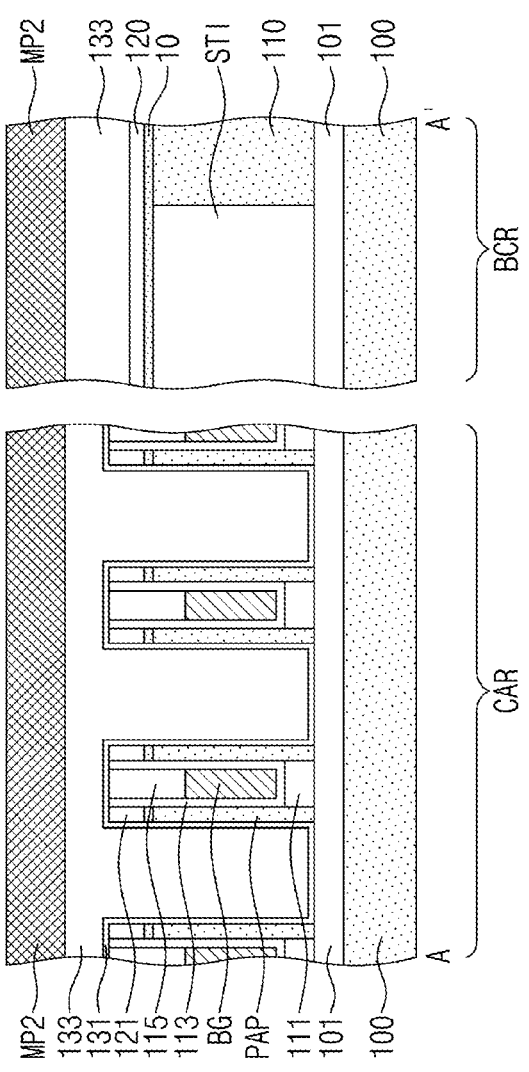
Figure 8B:
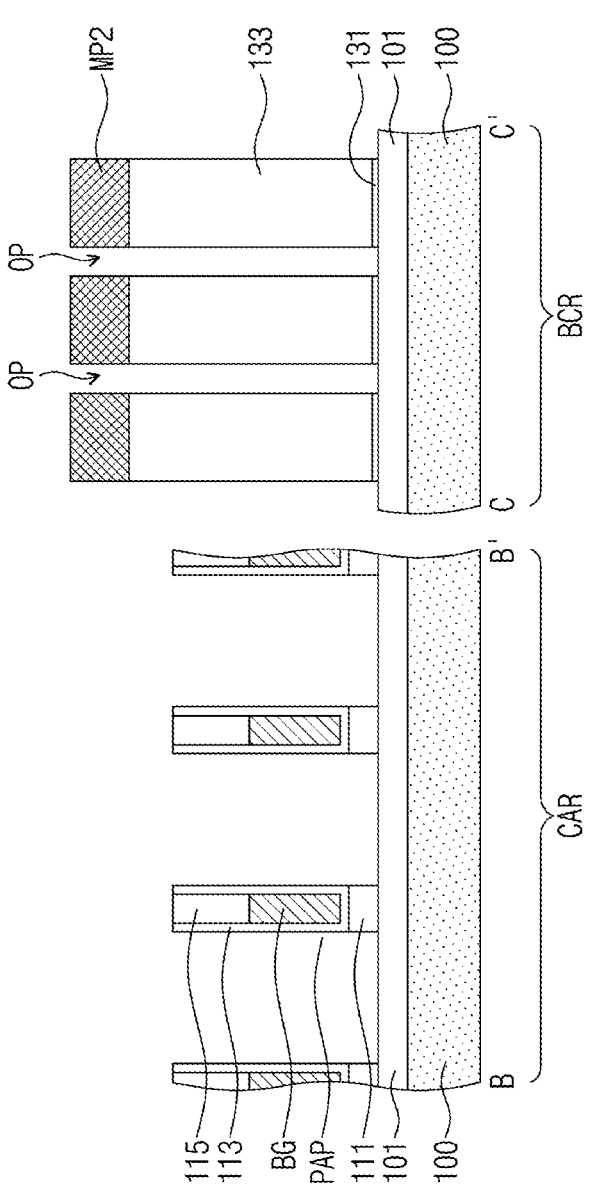
Figure 8C:
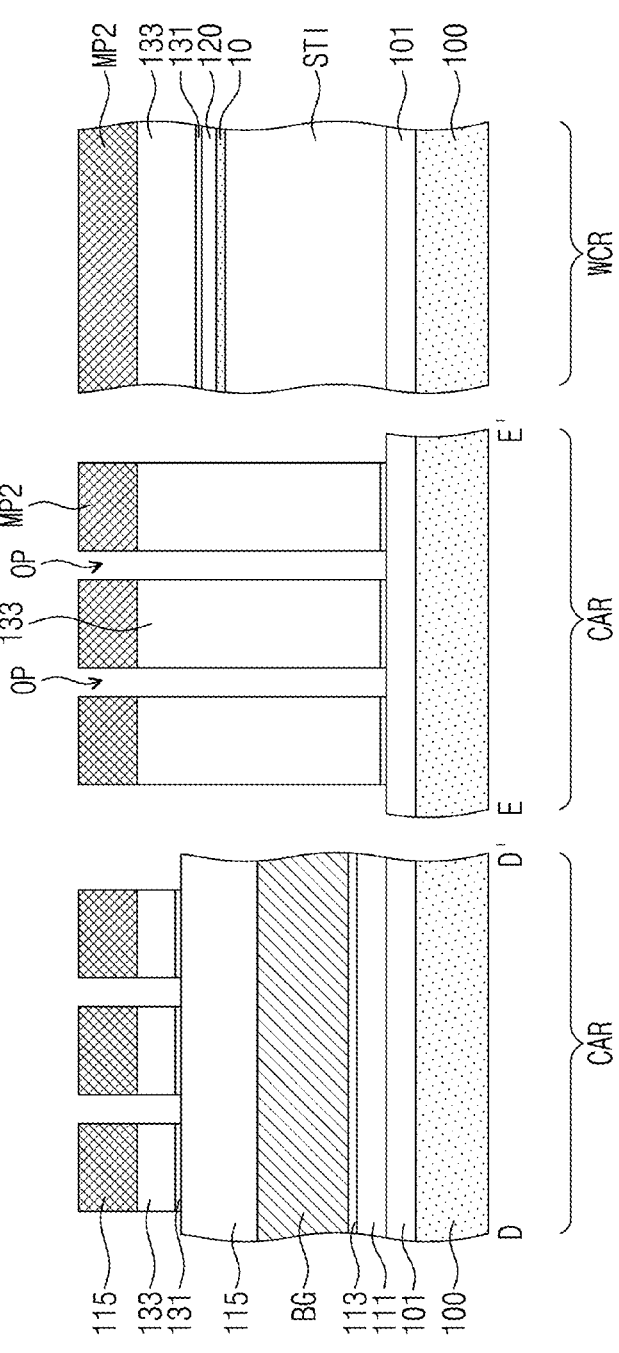
Figure 9A:
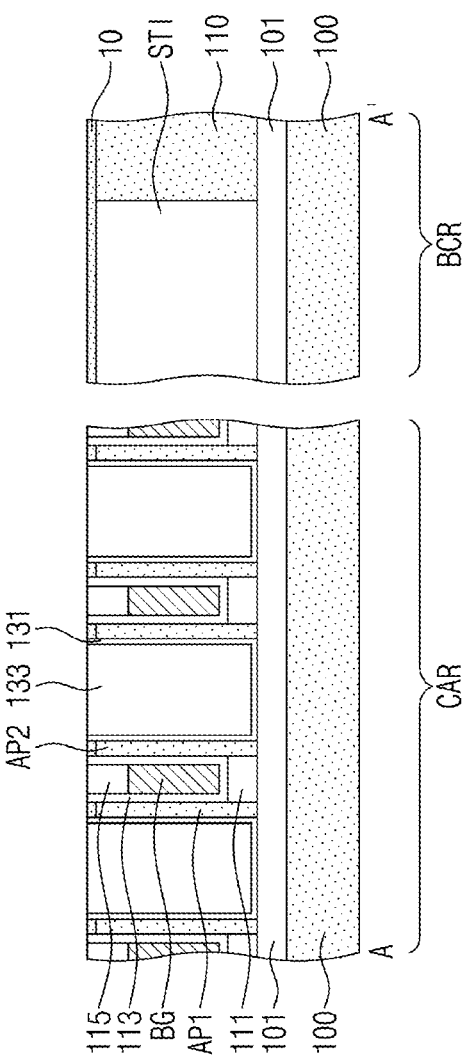
Figure 9B:
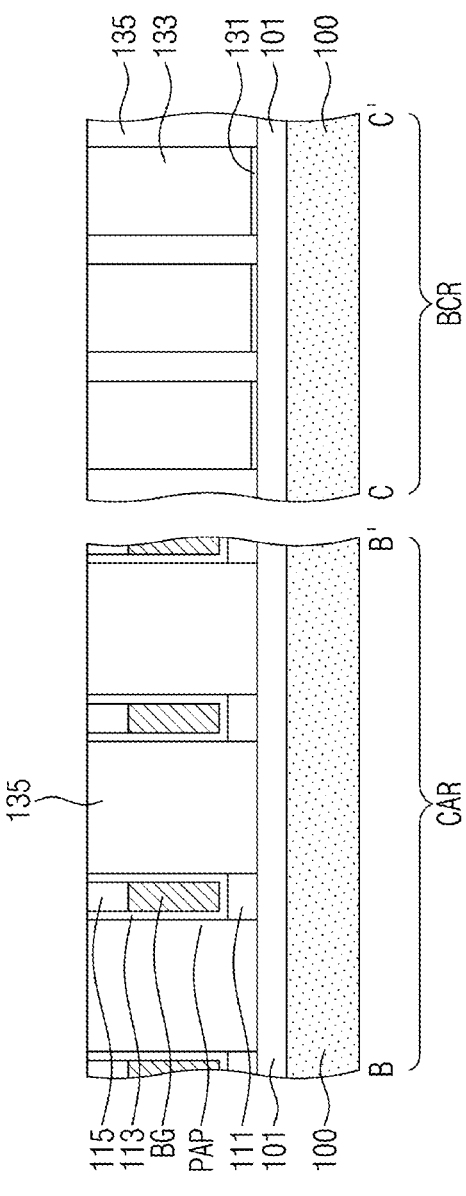
Figure 9C:
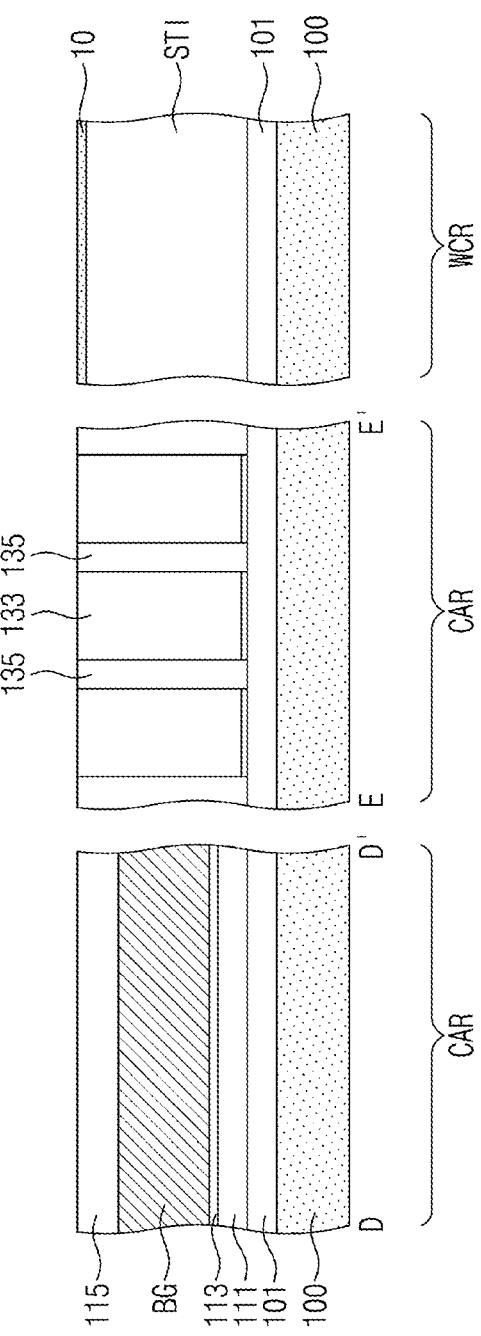
Figure 10A:
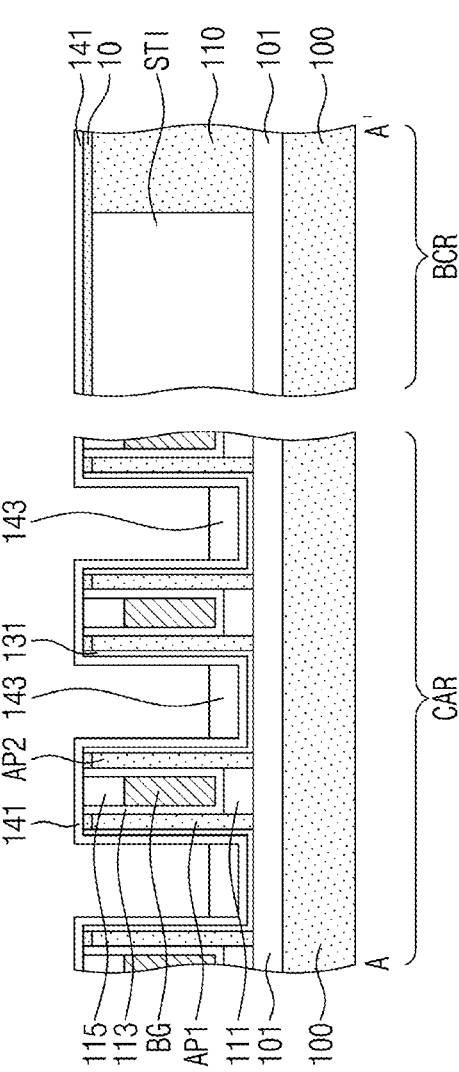
Figure 10B:
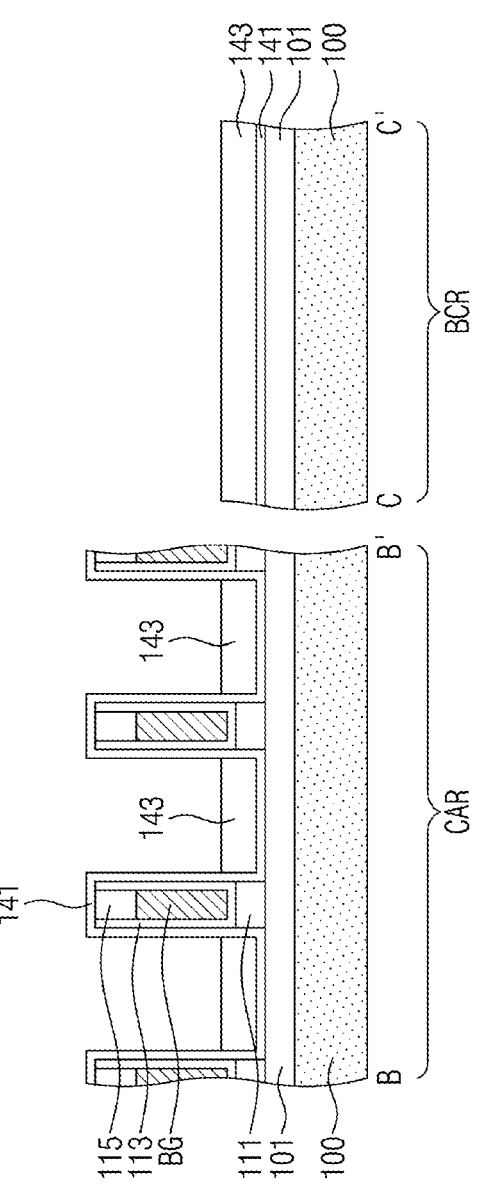
Figure 10C:
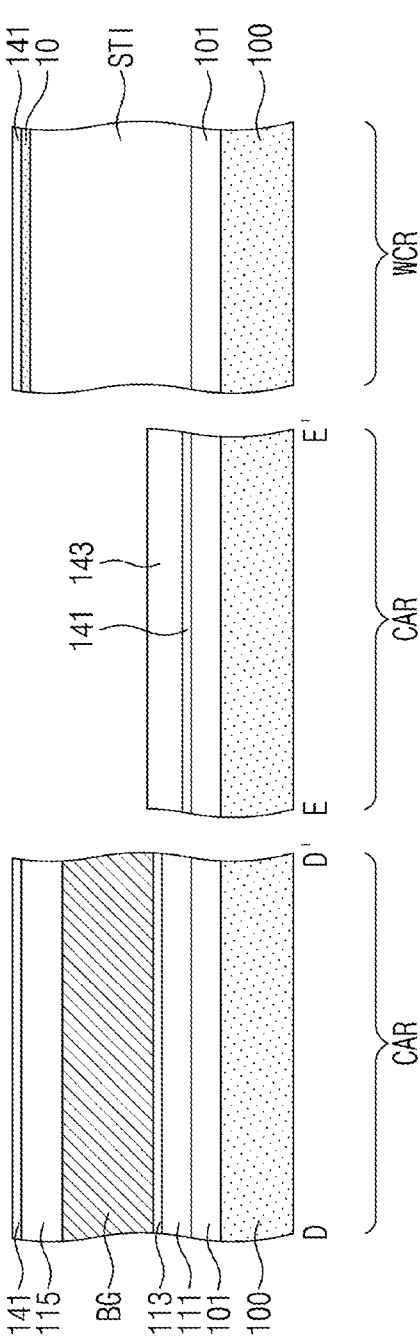
Figure 11A:
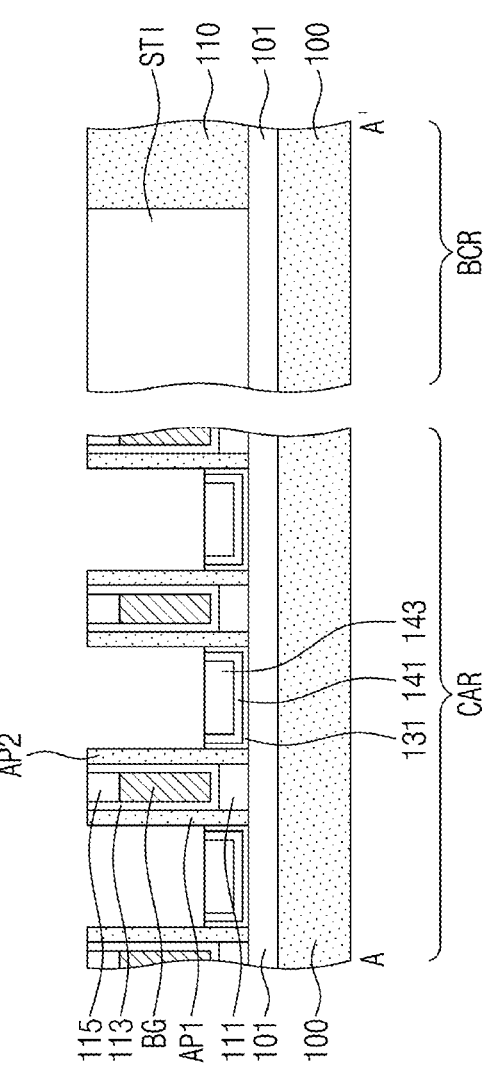
Figure 11B:
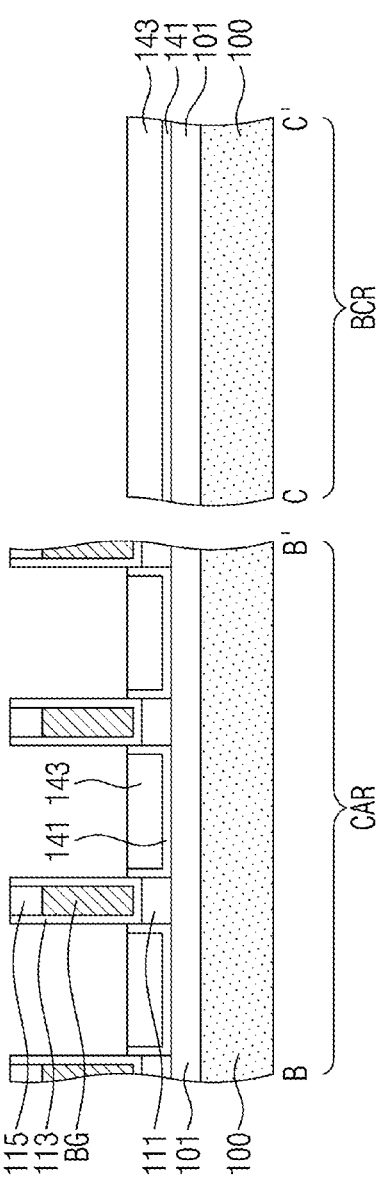
Figure 11C:
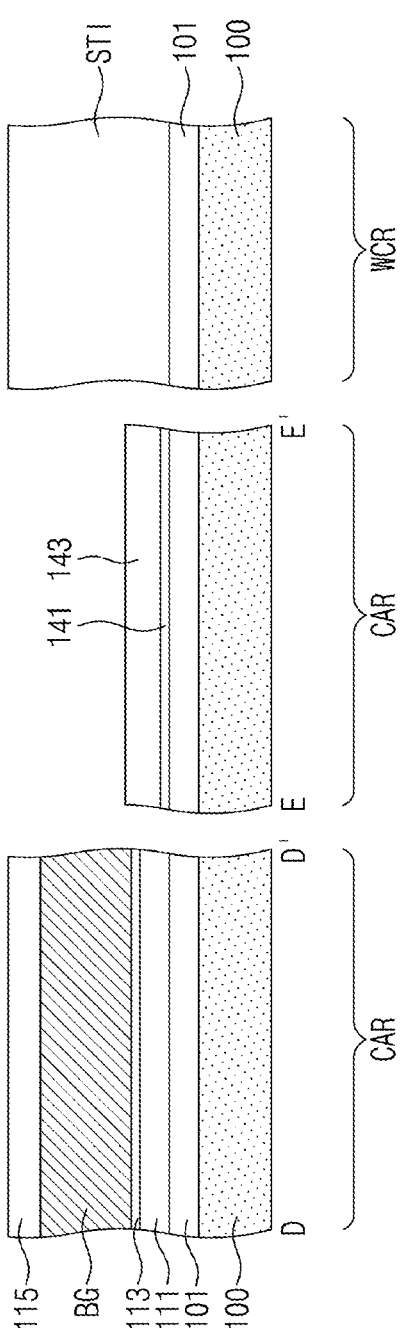
Figure 12A:
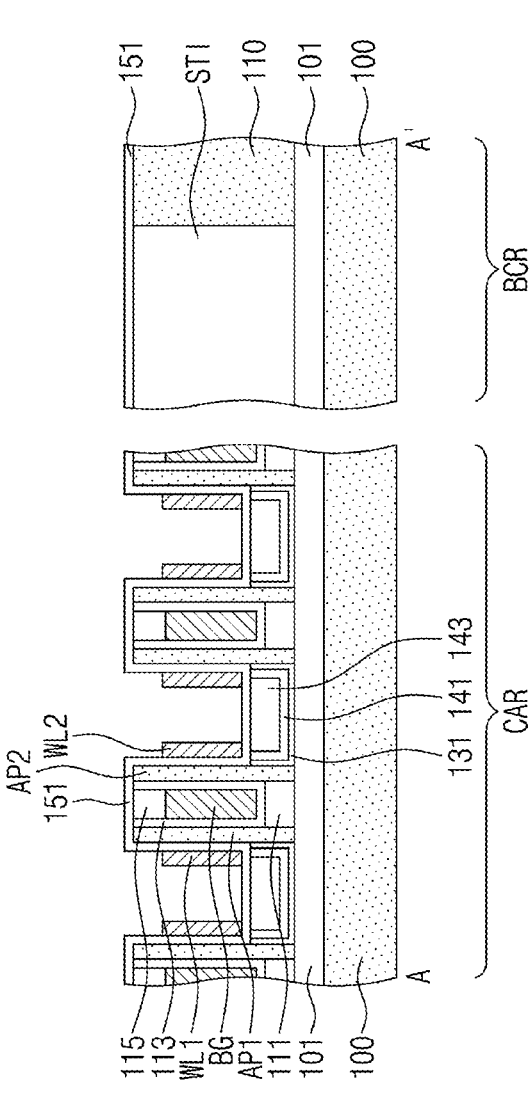
Figure 12B:
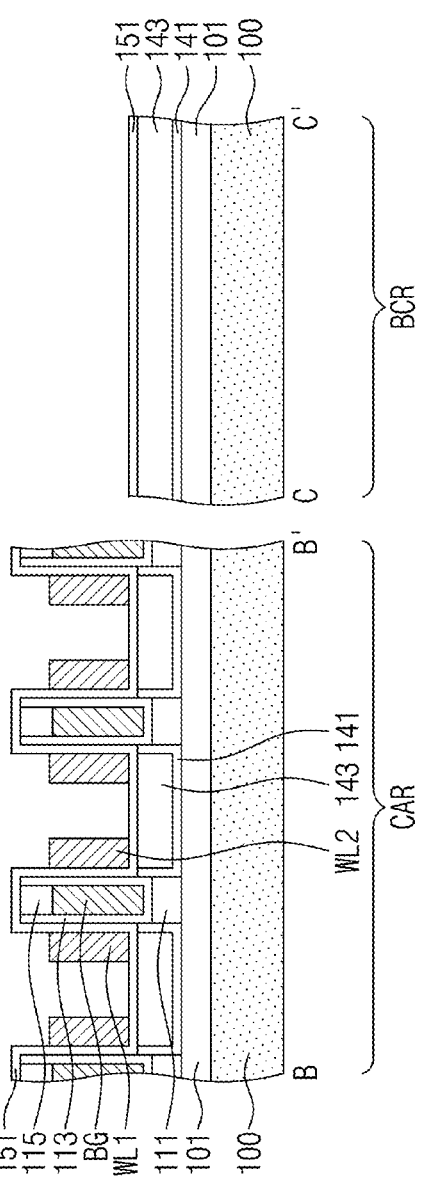
Figure 12C:
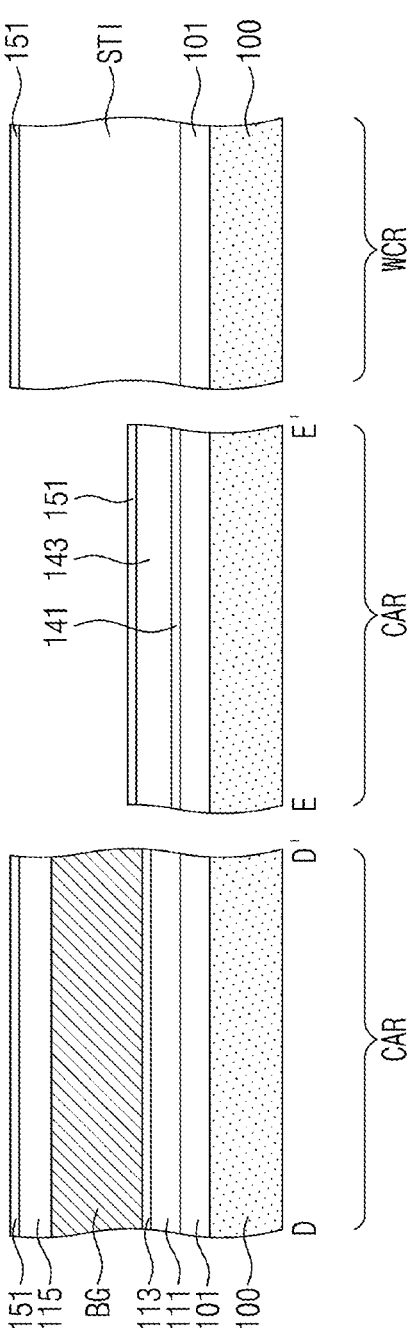
Figure 13A:
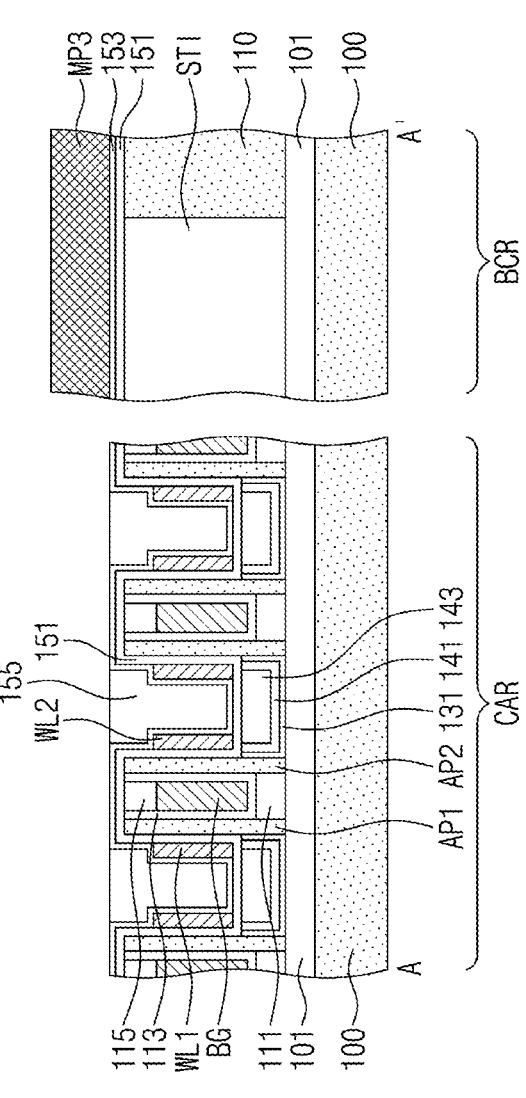
Figure 13B:
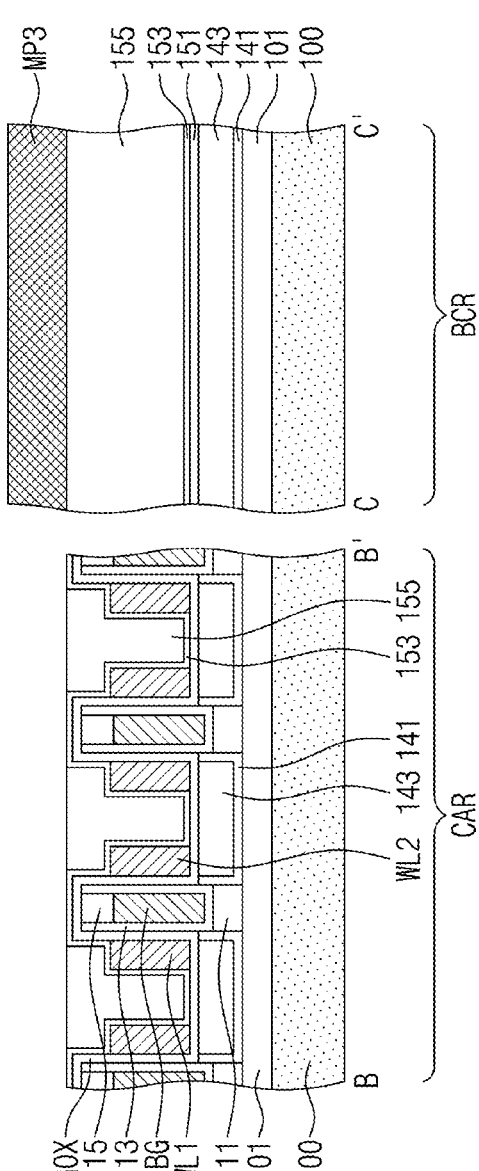
Figure 13C:
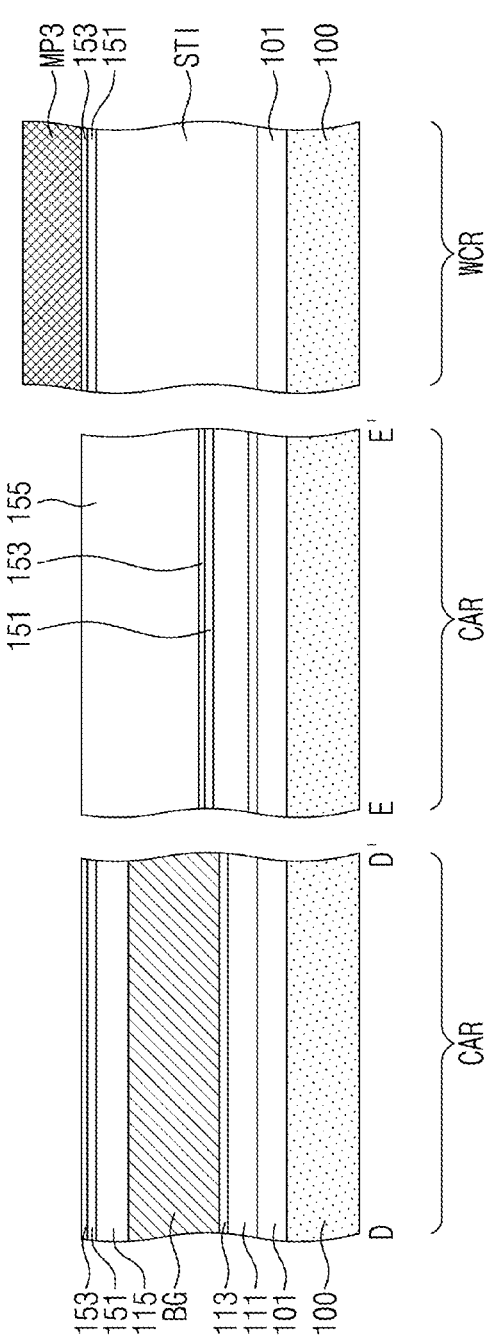
Figure 14A:
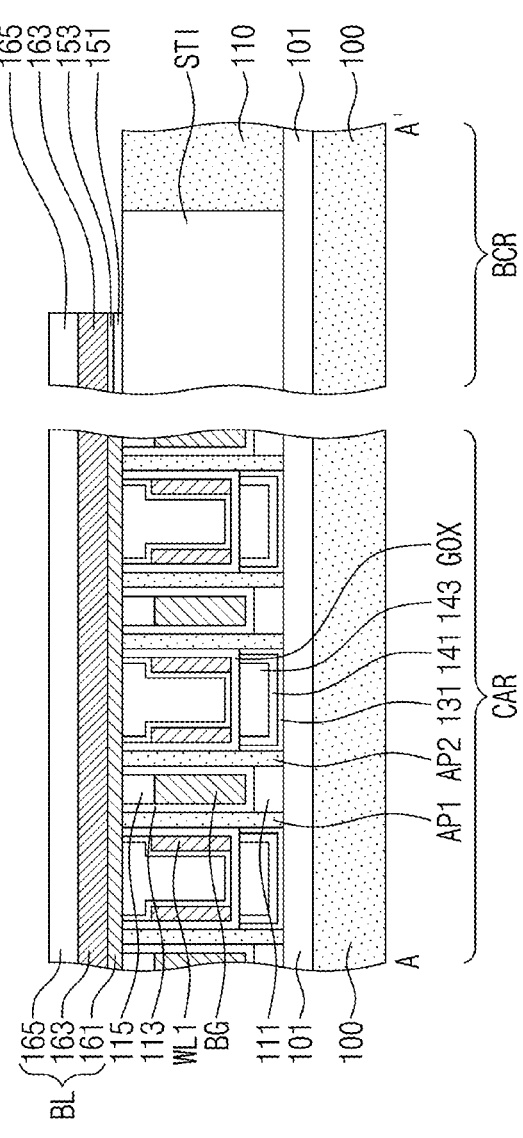
Figure 14B:
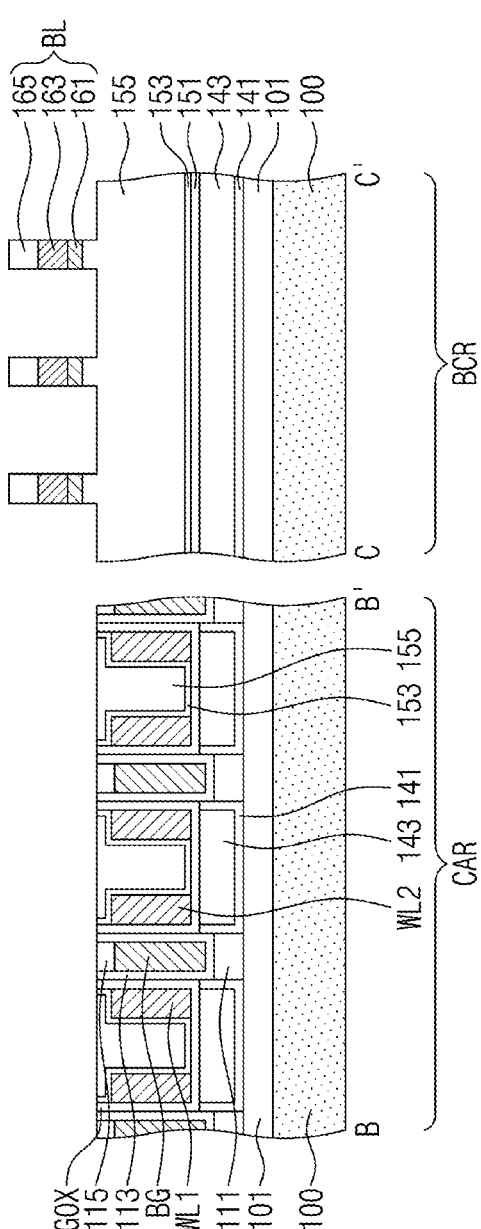
Figure 14C:
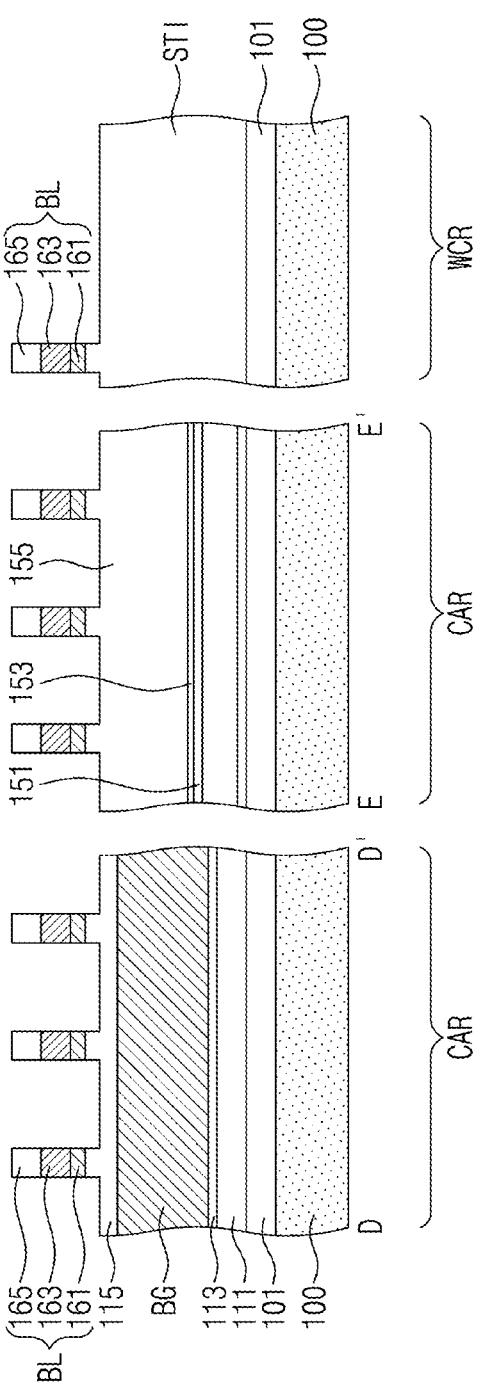
Figure 15A:
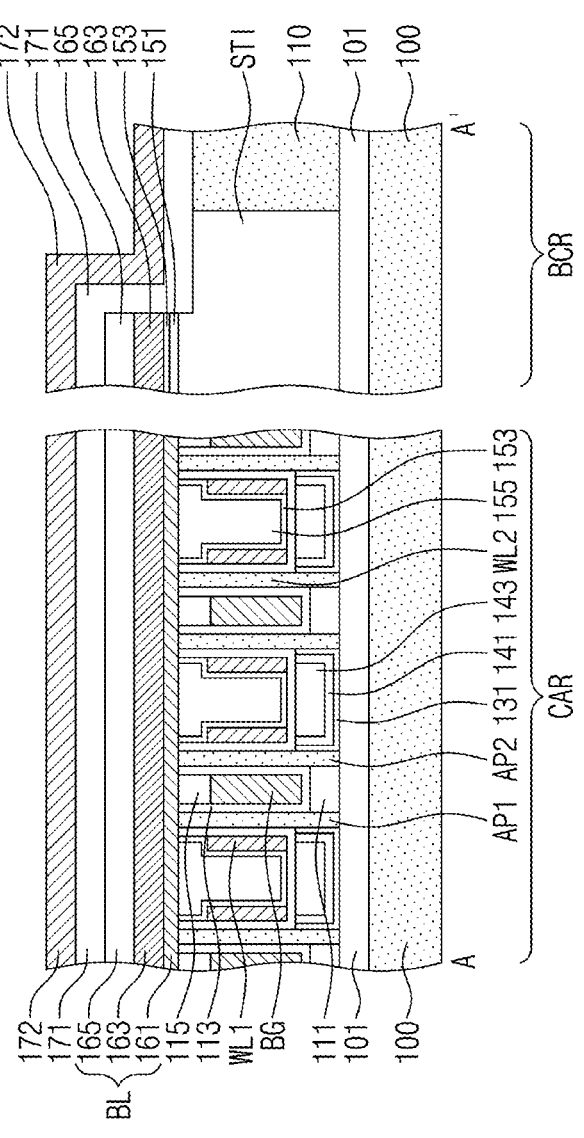
Figure 15B:
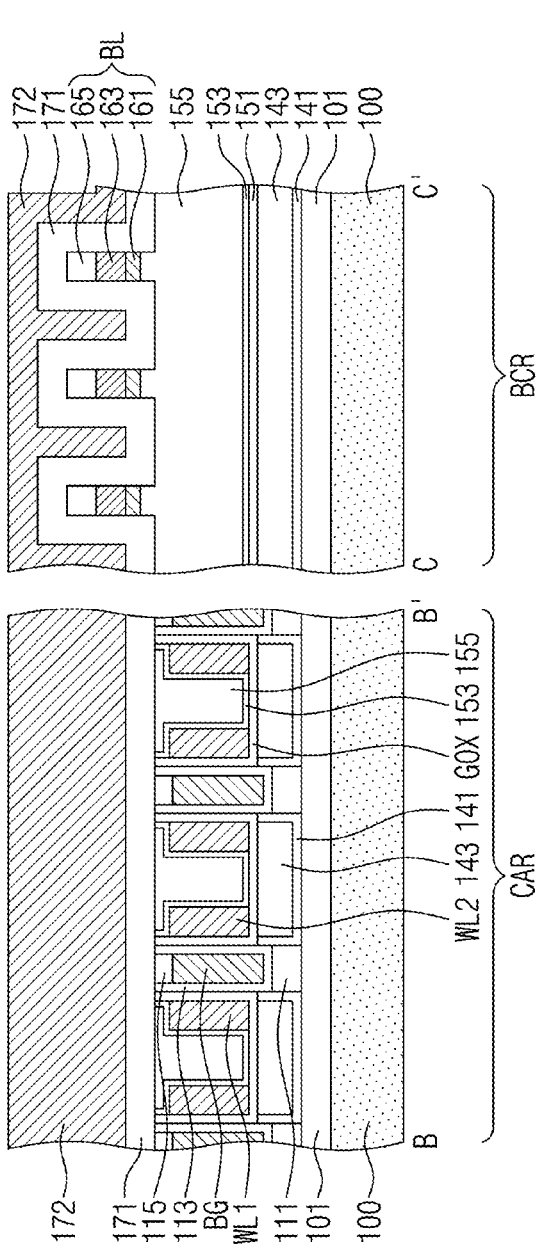
Figure 15C:
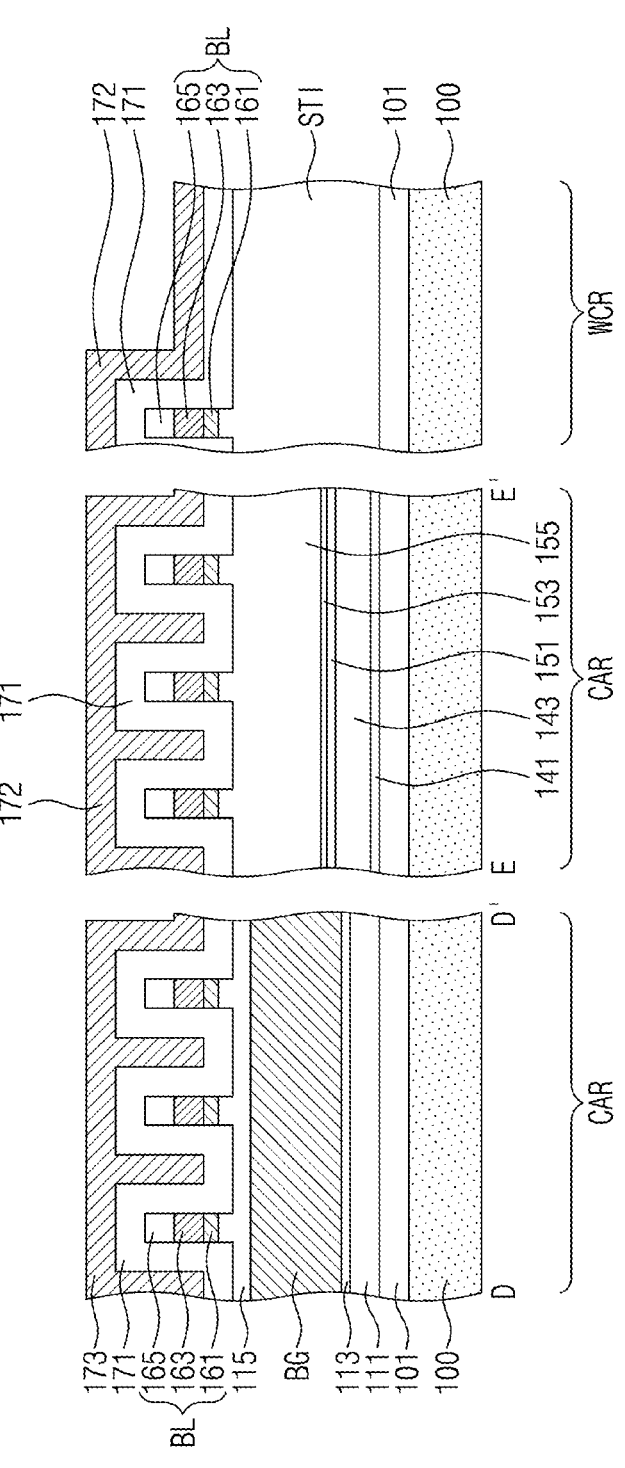
Figure 16A:
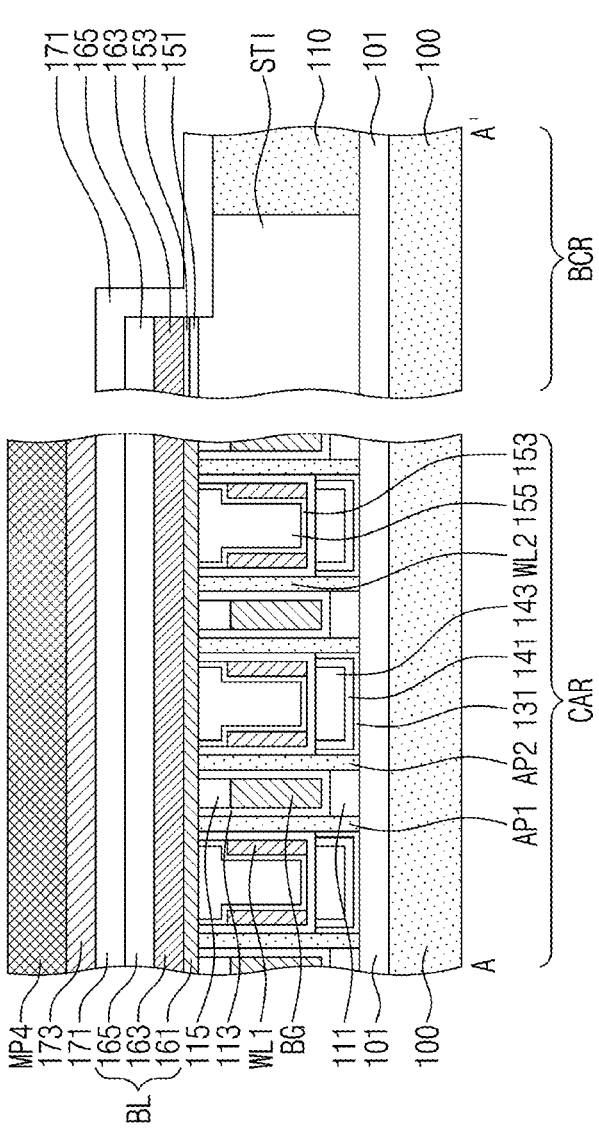
Figure 16B:
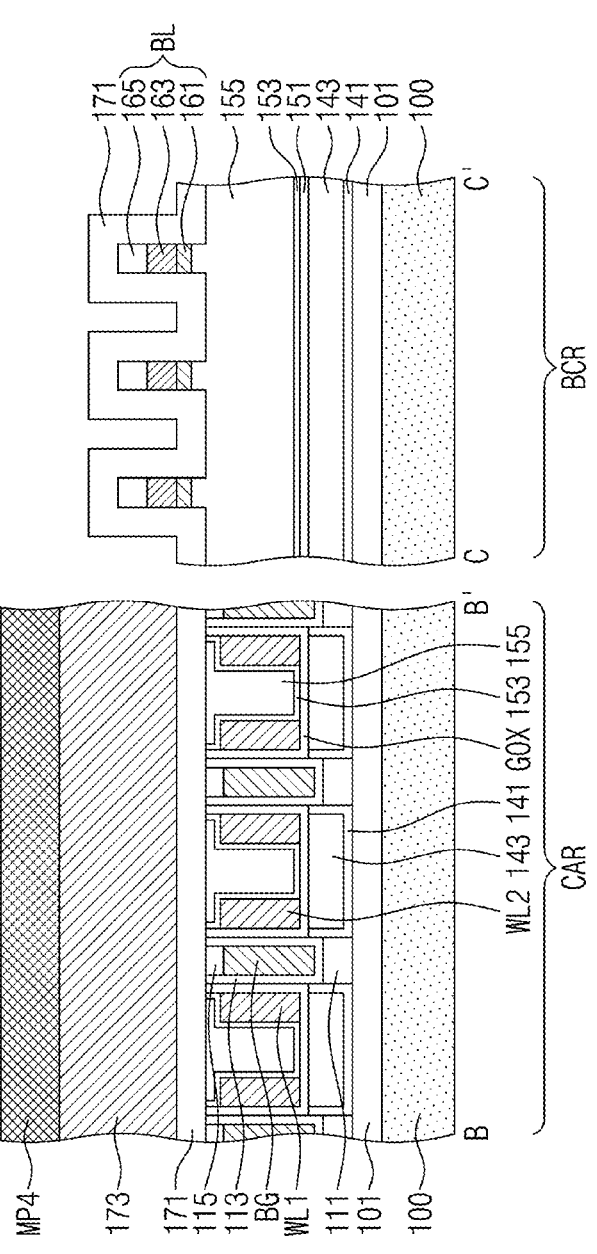
Figure 16C:
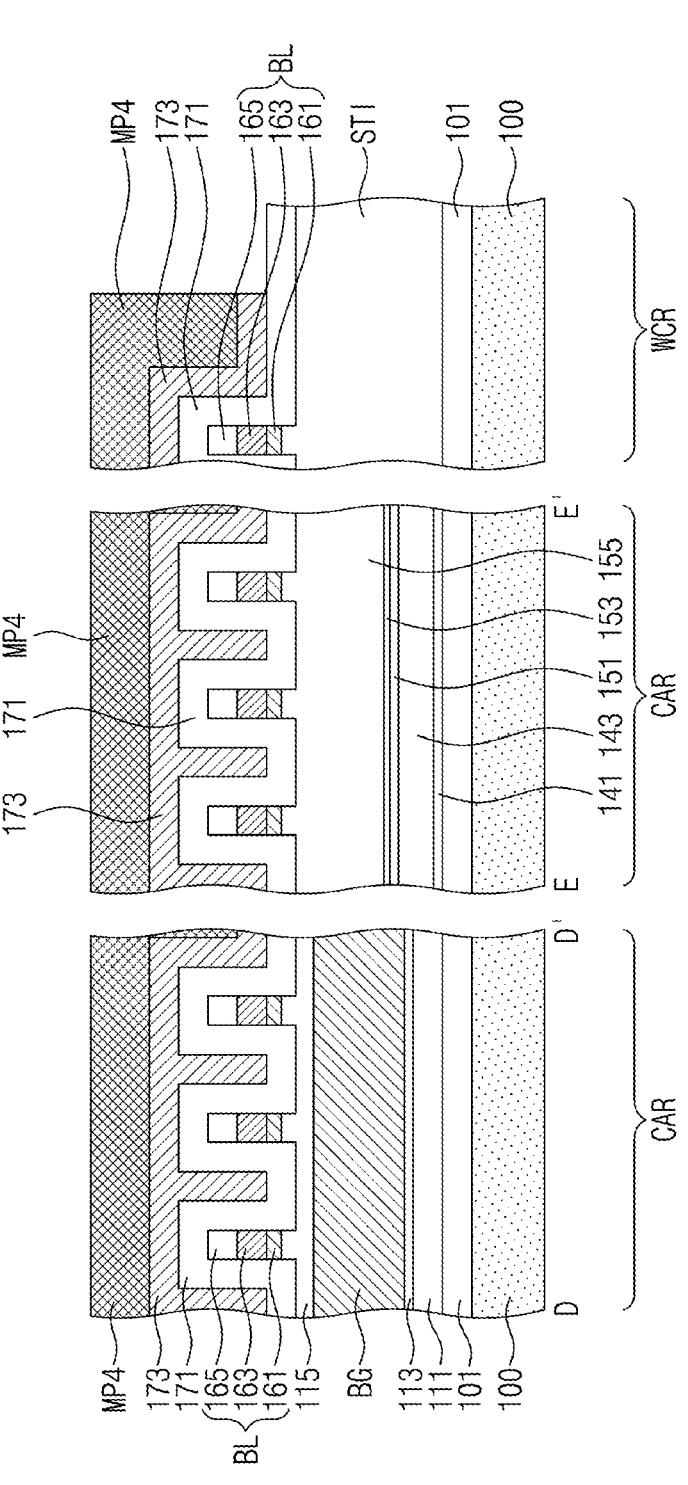
Figure 17A:
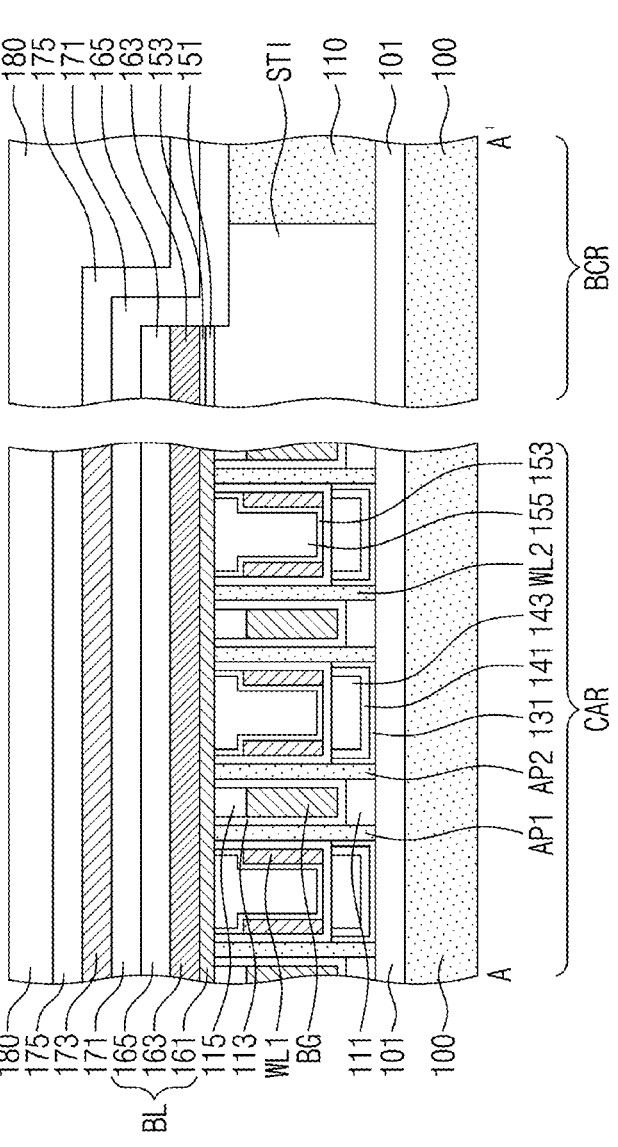
Figure 17B:
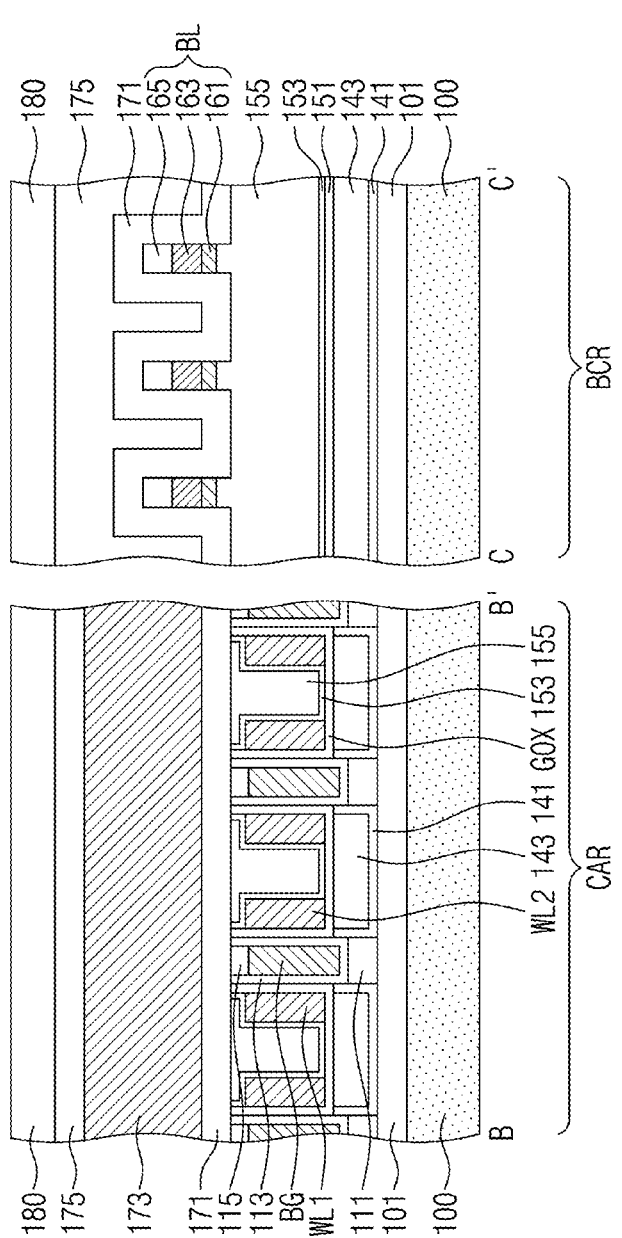
Figure 17C:
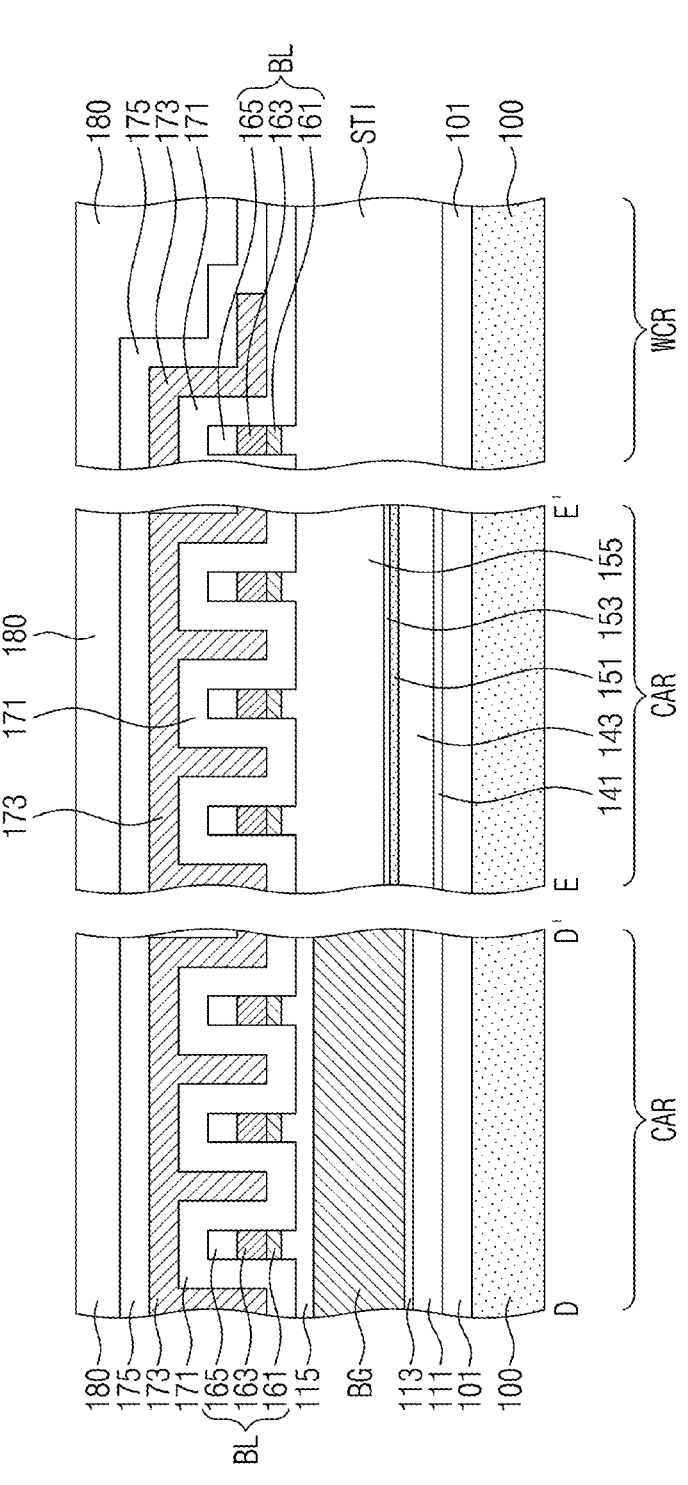
Figure 18A:
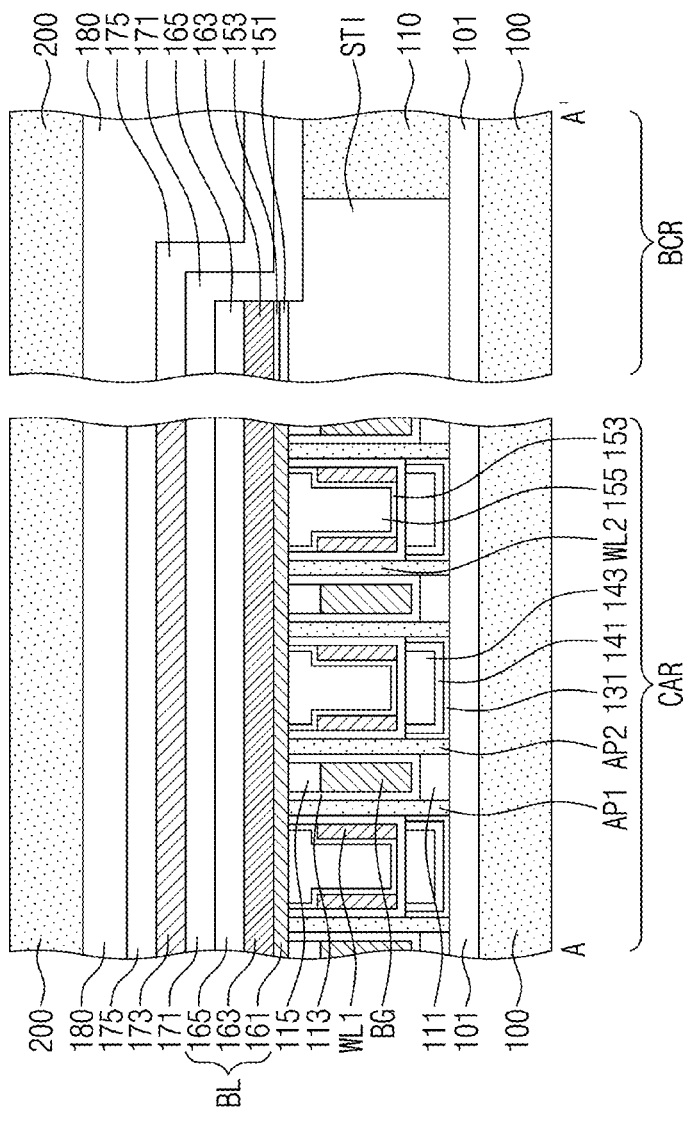
Figure 18B:
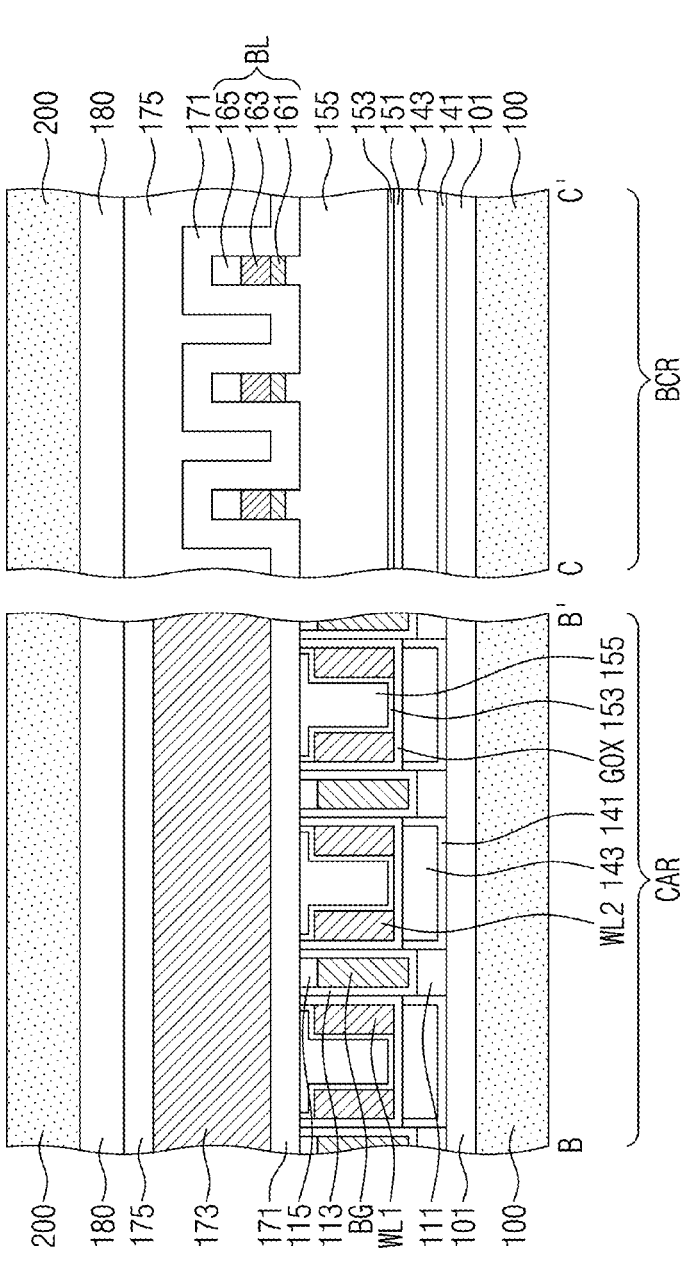
Figure 18C:
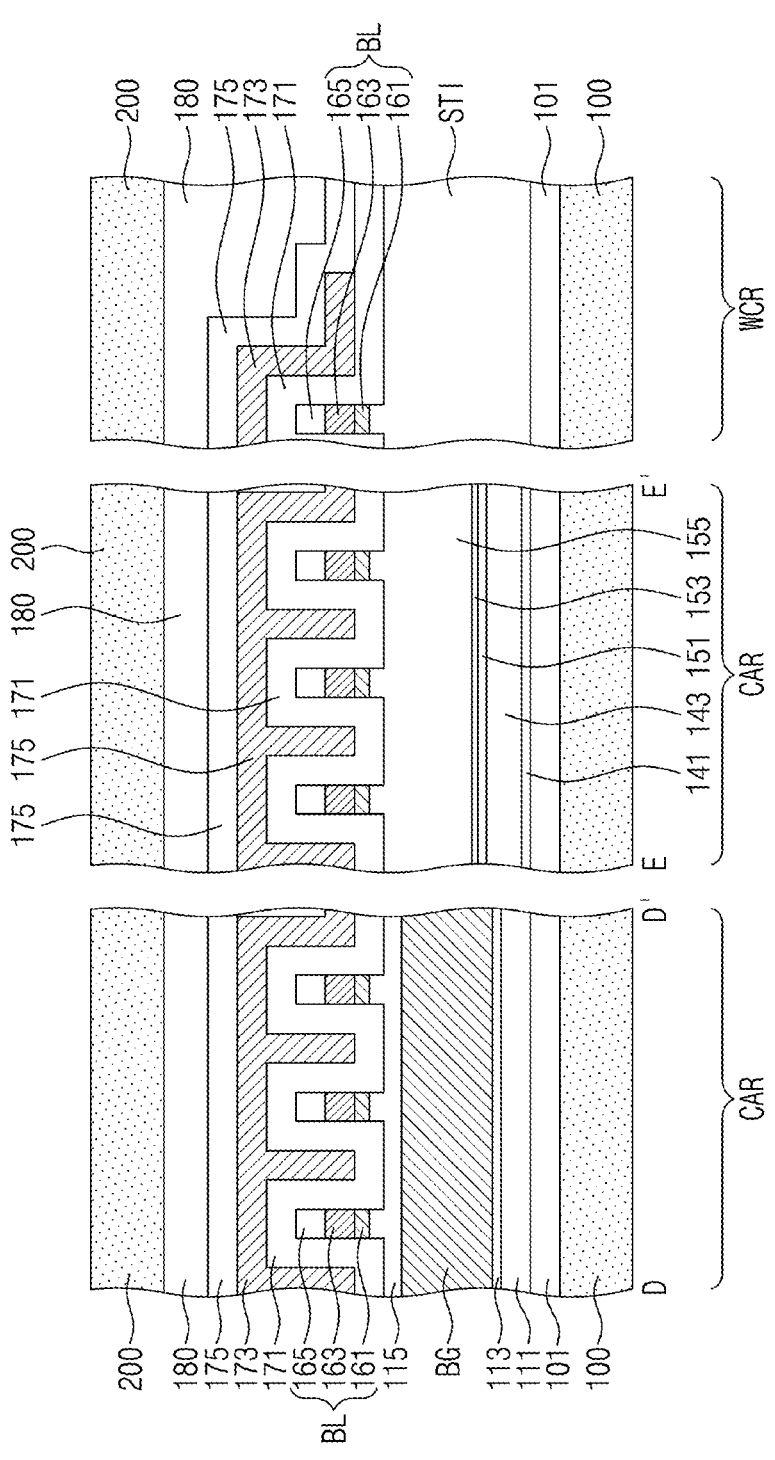
Figure 19A:
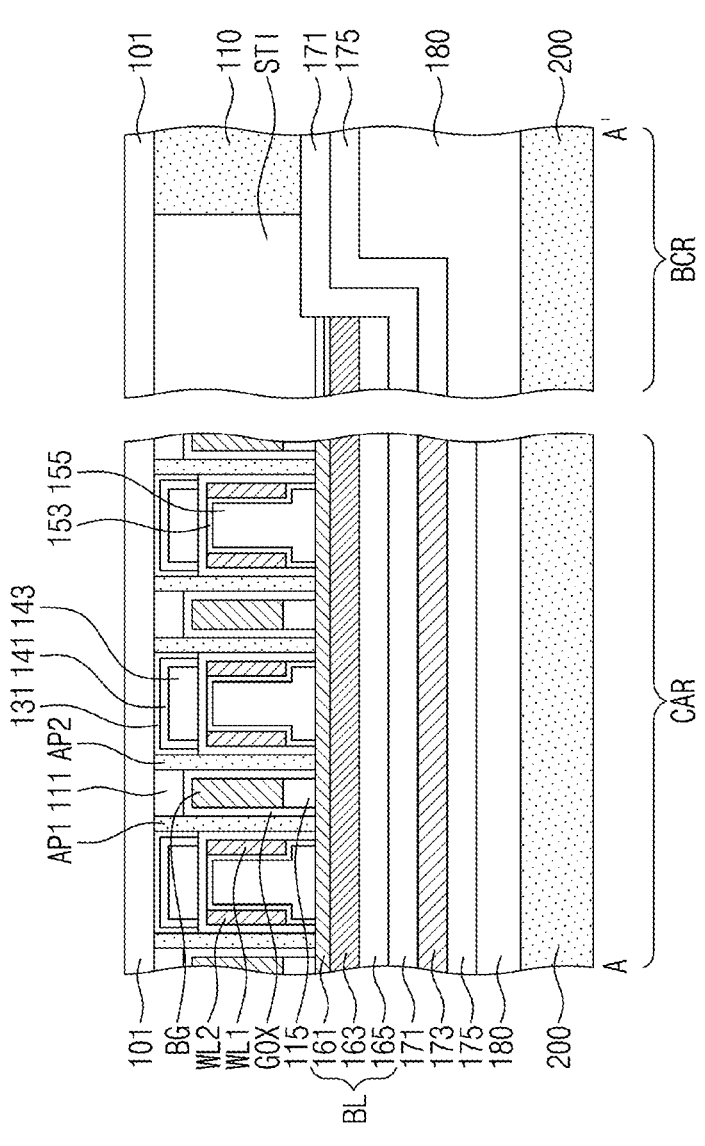
Figure 19B:
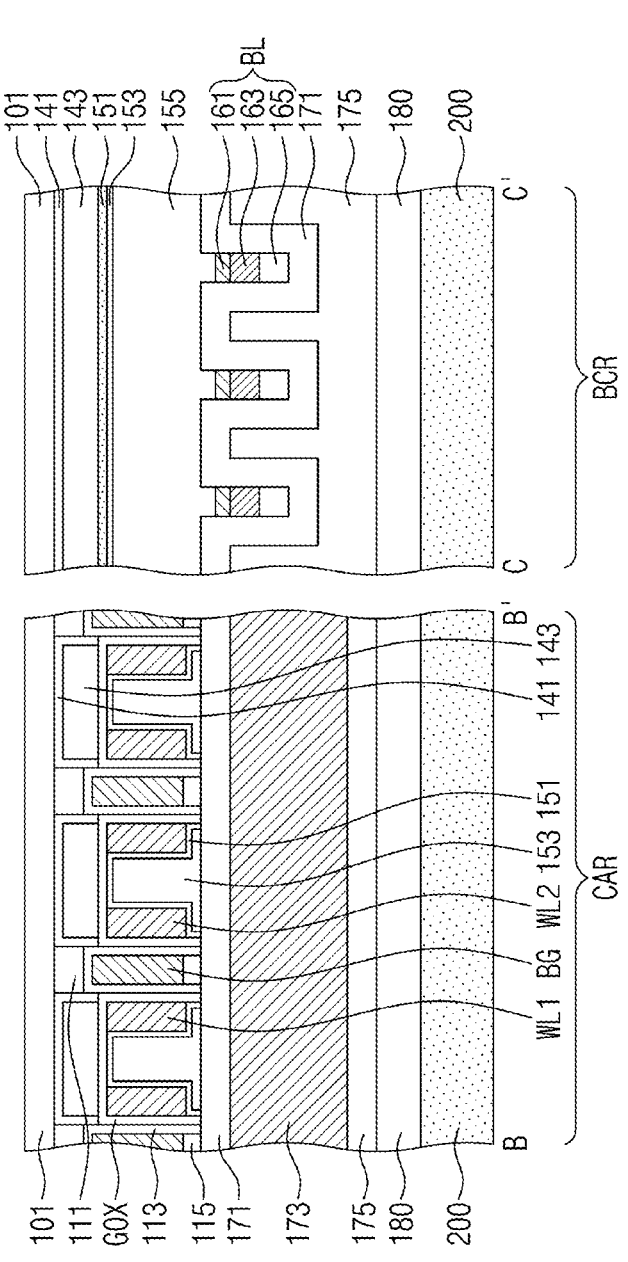
Figure 19C:
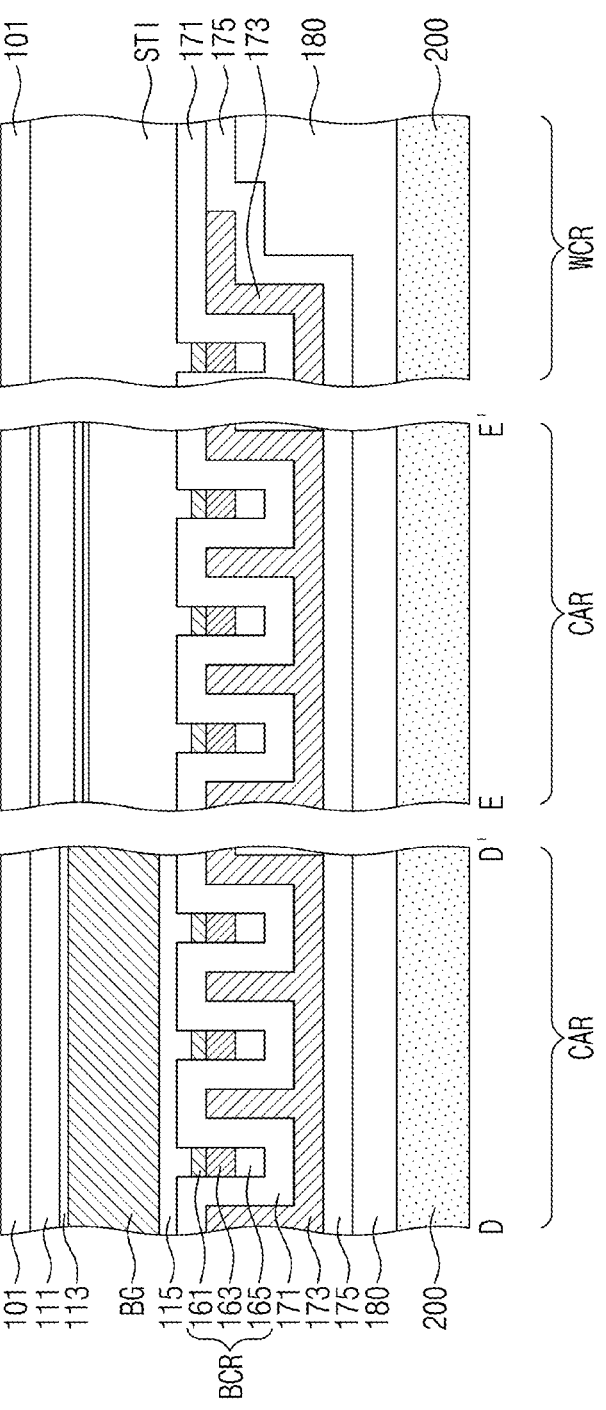
Figure 20A:
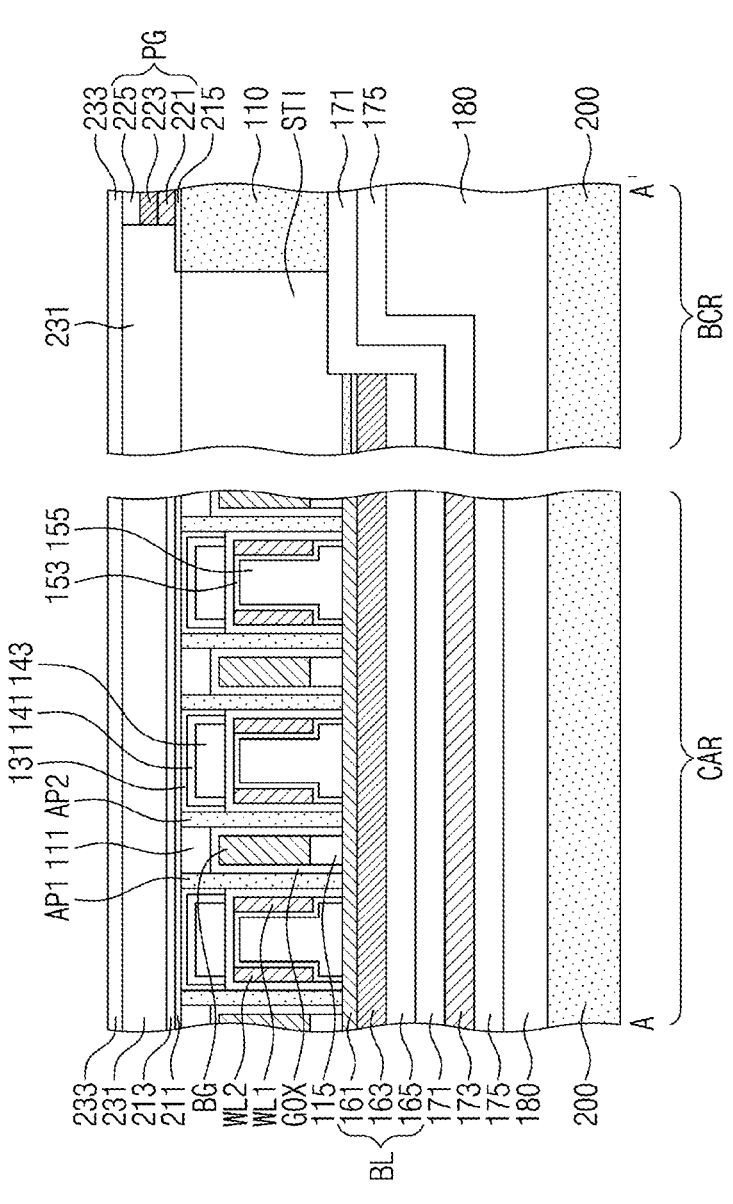
Figure 20B:
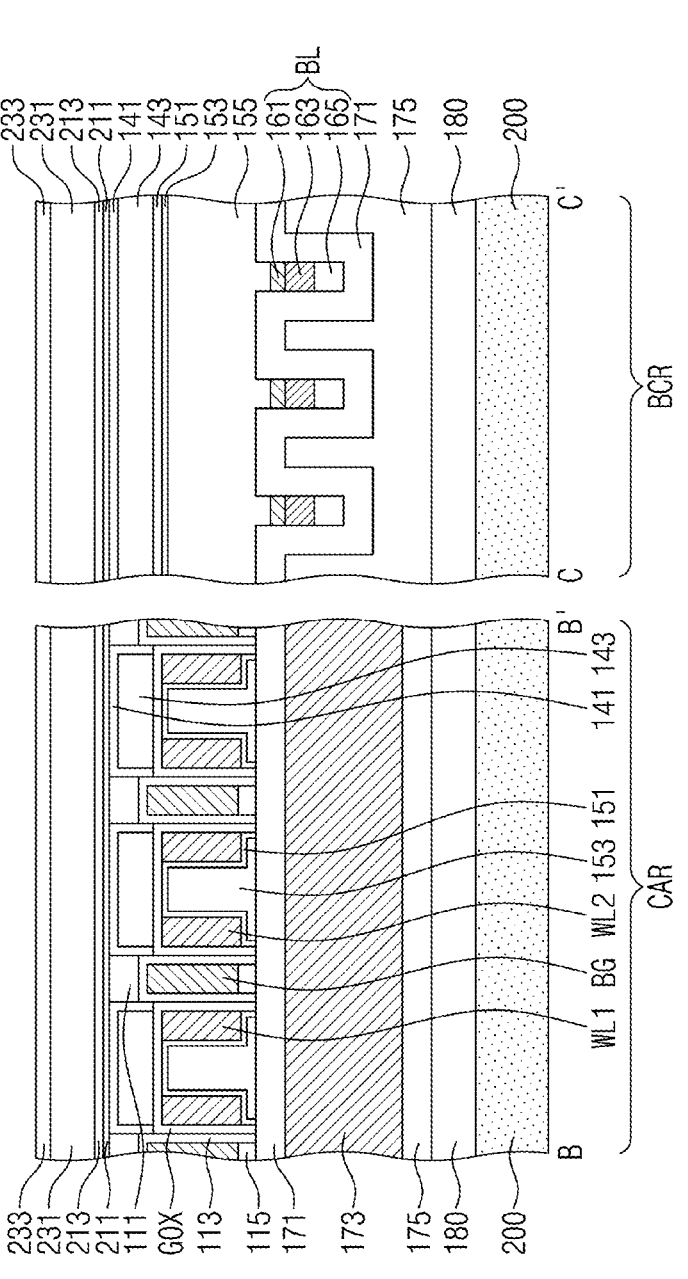
Figure 20C:
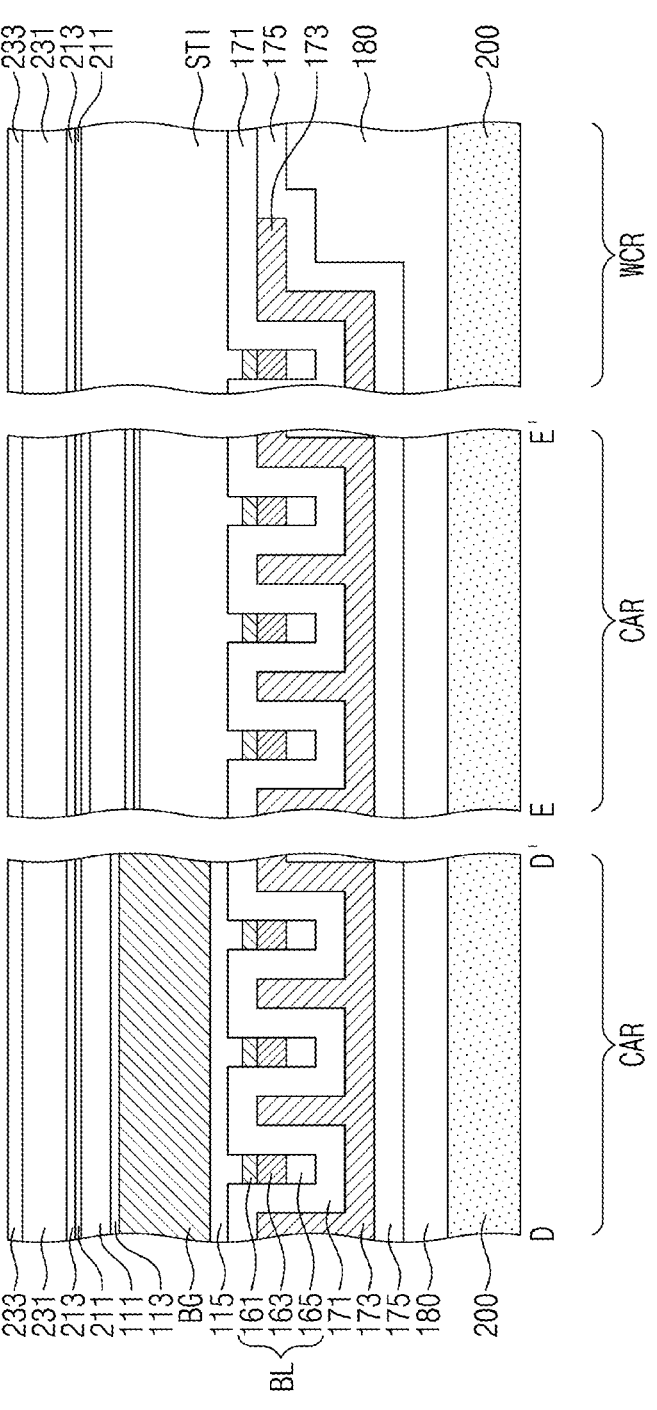
Figure 21A:
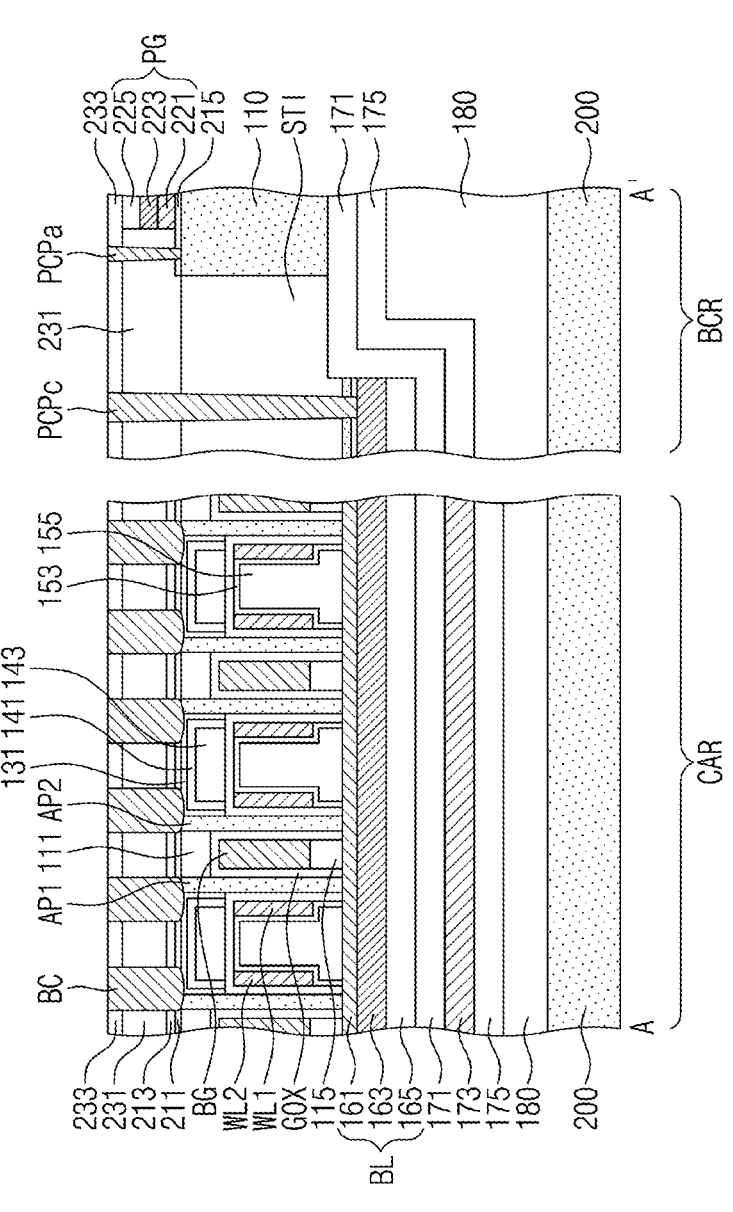
Figure 21B:
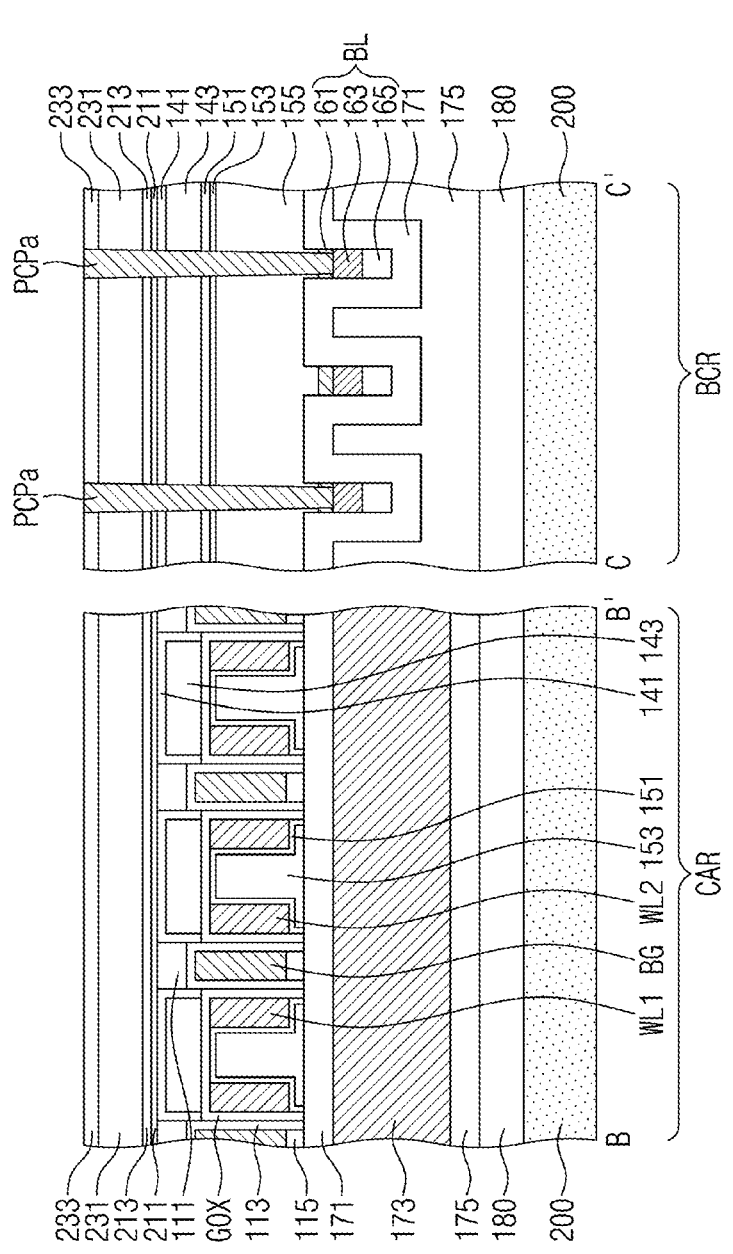
Figure 21C:
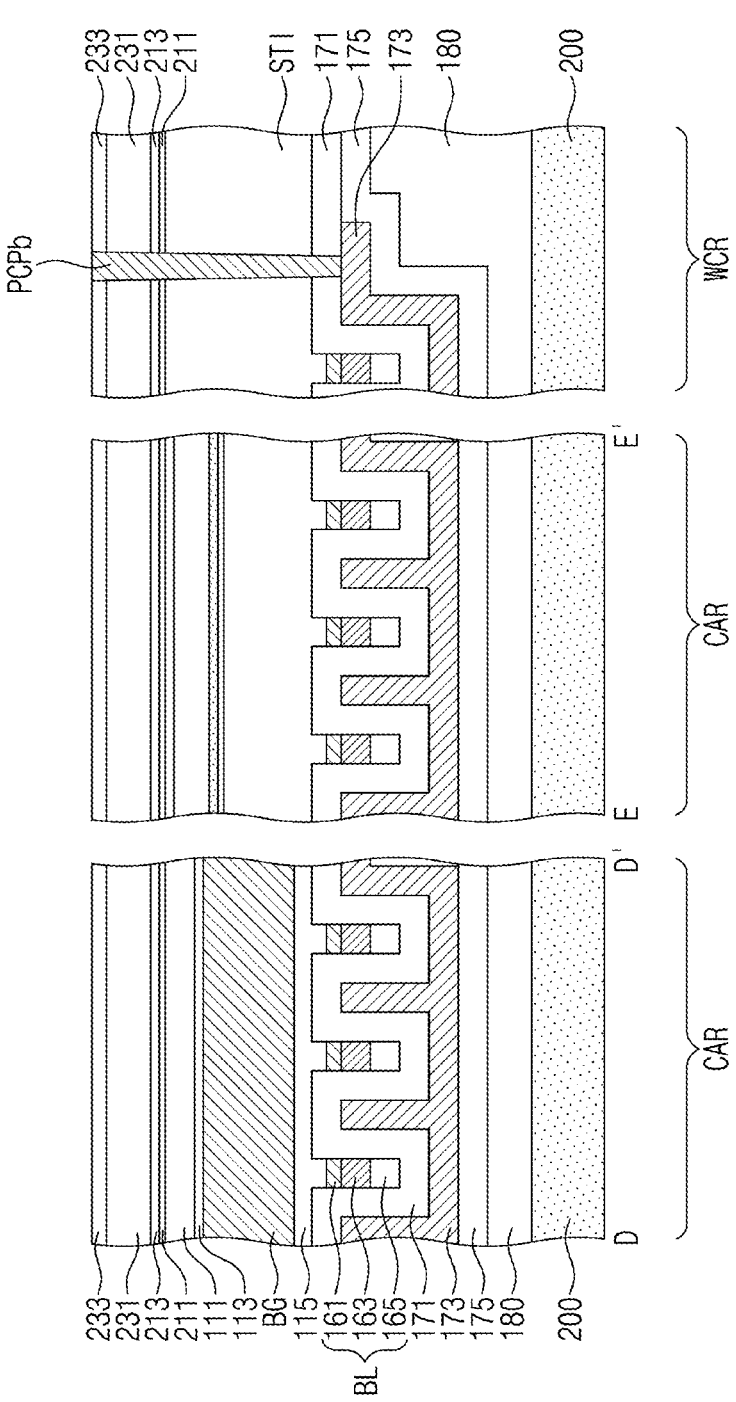
Figure 22A:
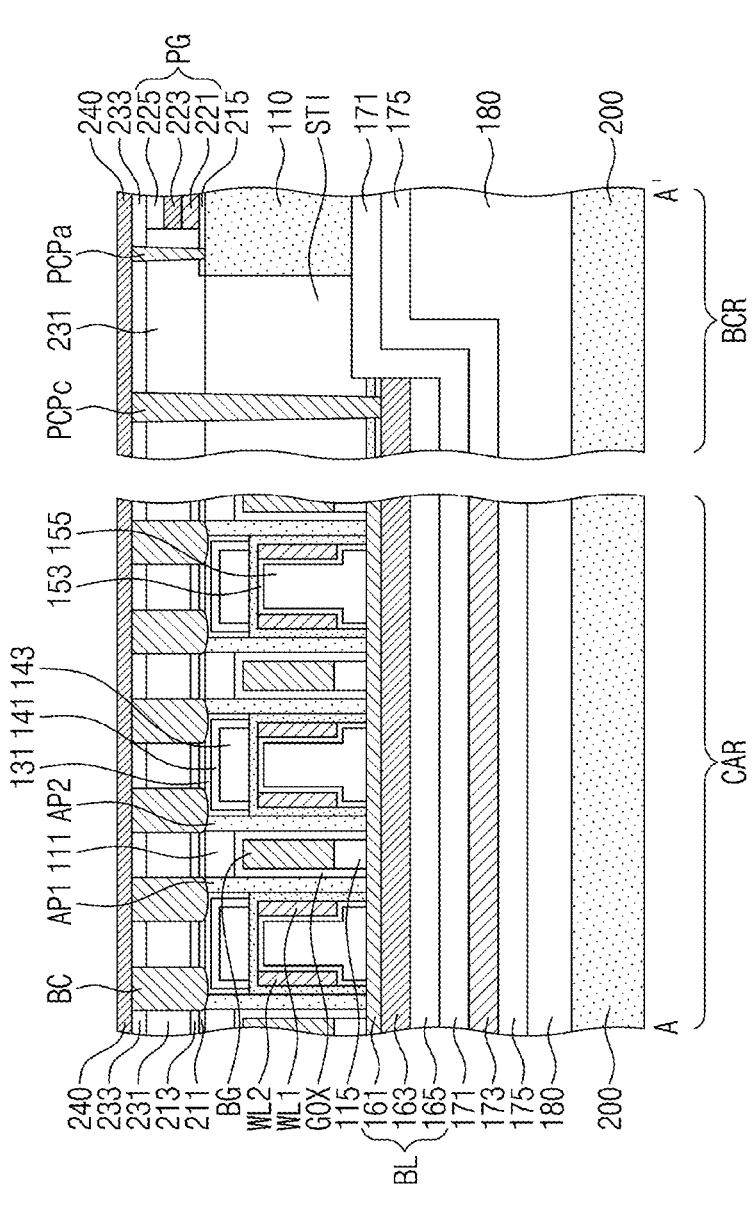
Figure 22C:
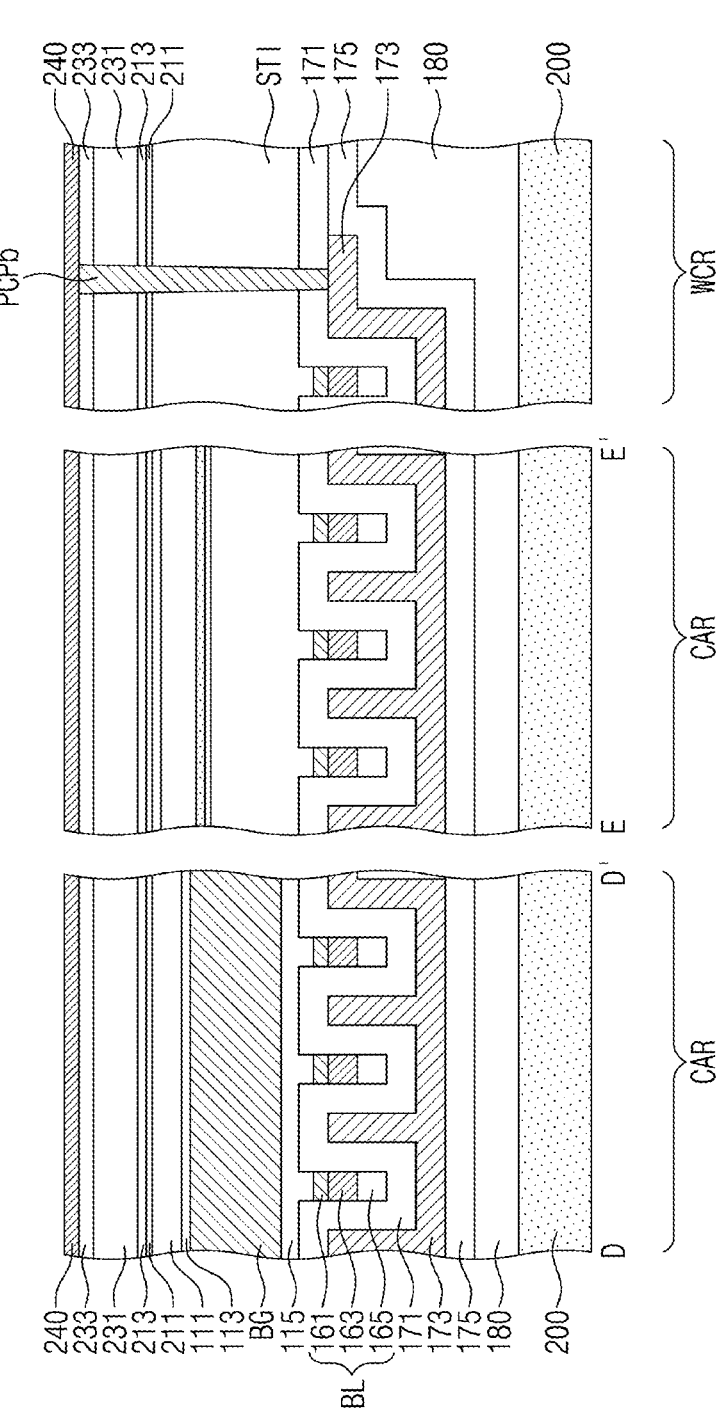
Figure 23A:
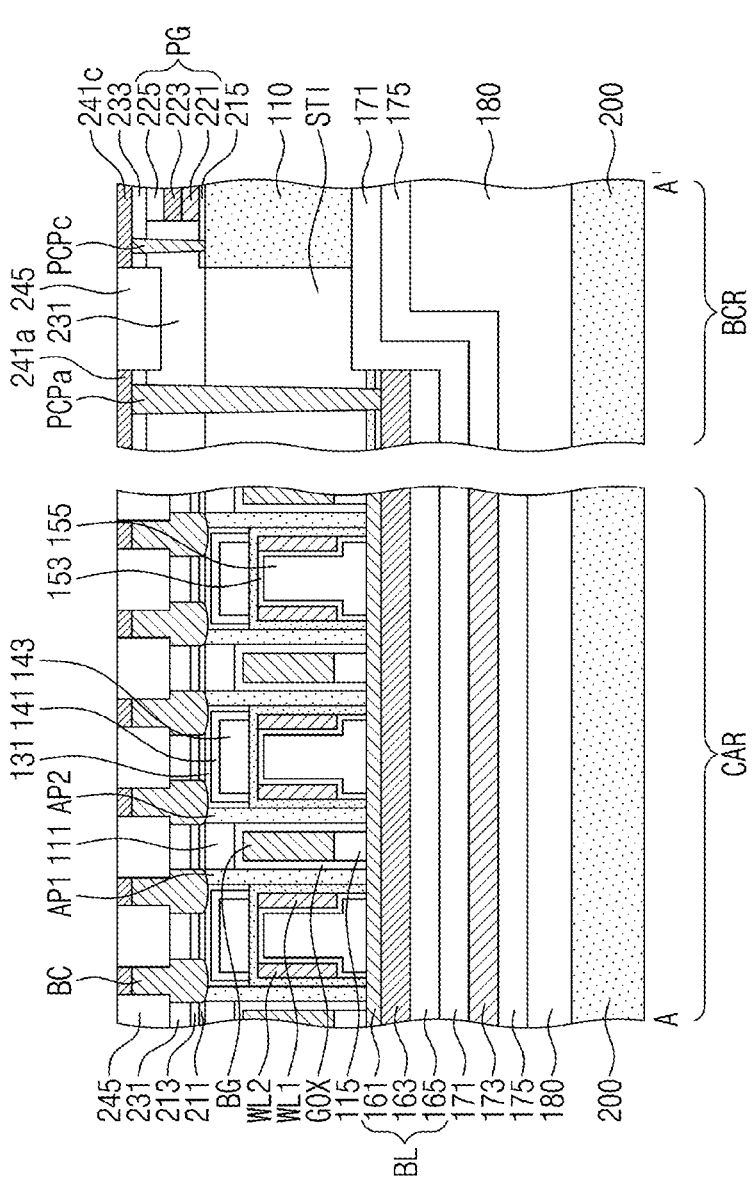
Figure 23B:
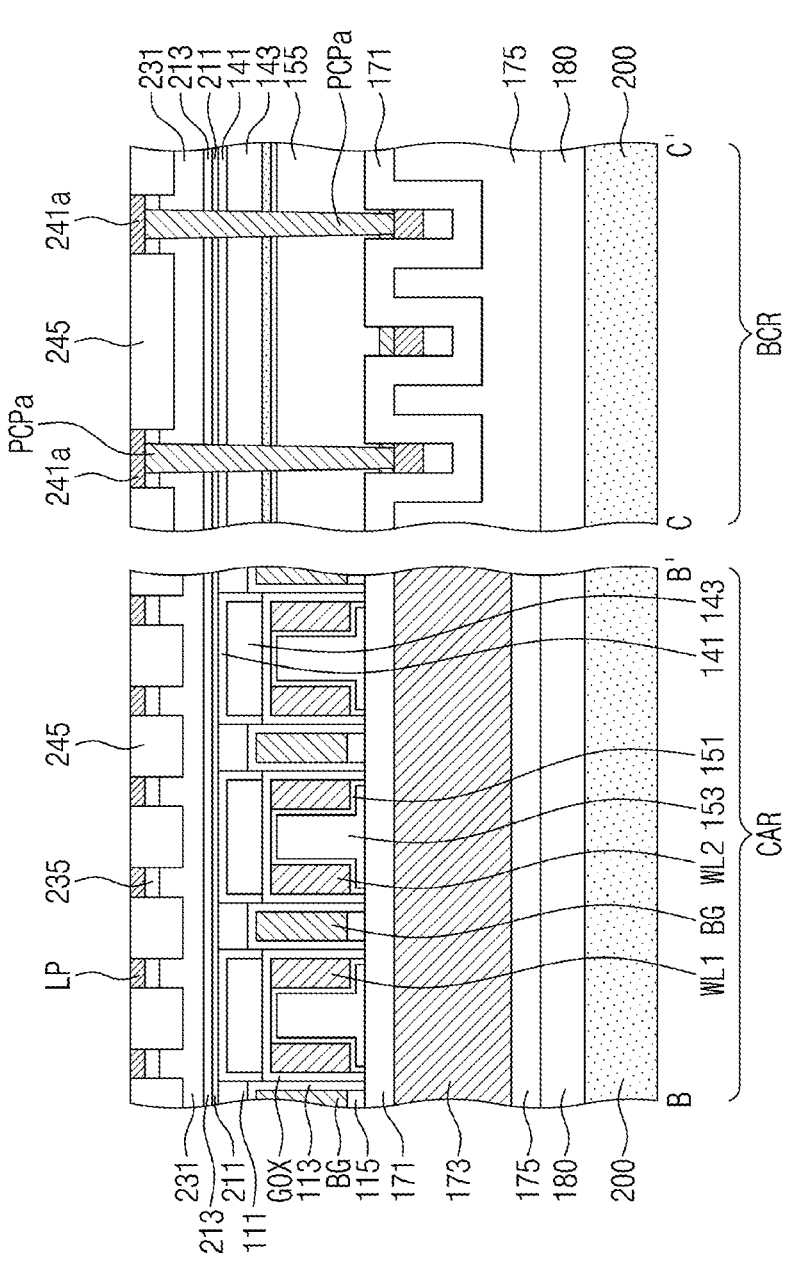
Figure 23C:
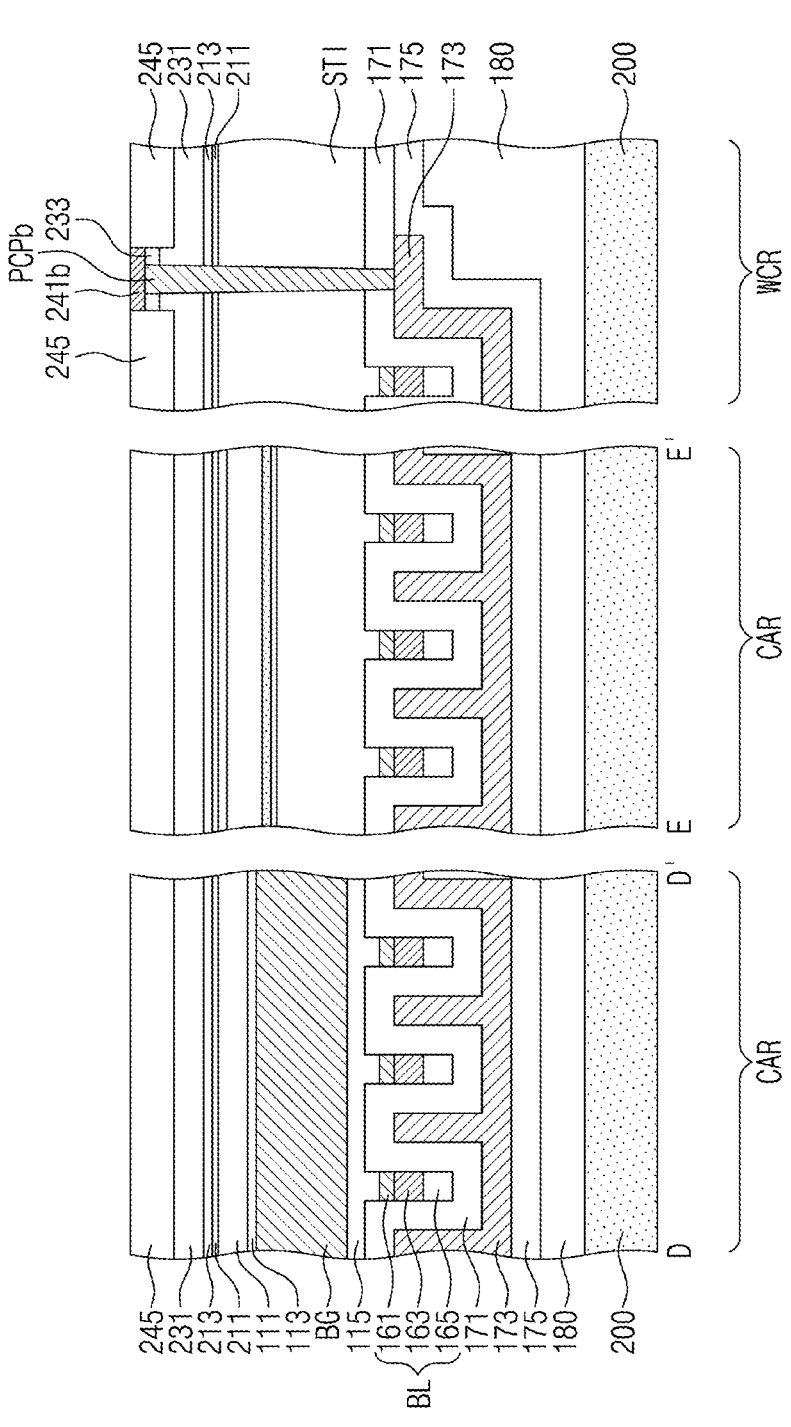
Figure 24A:
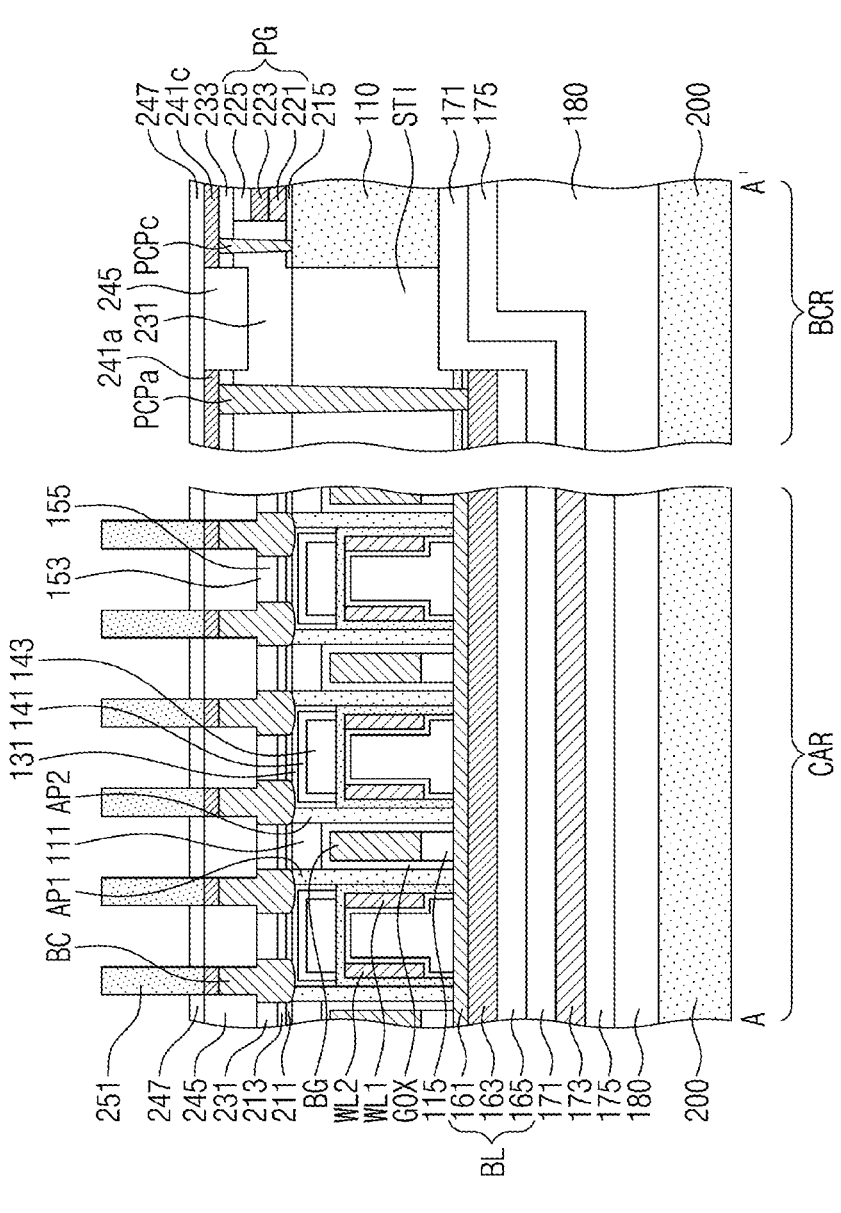
Figure 24B:
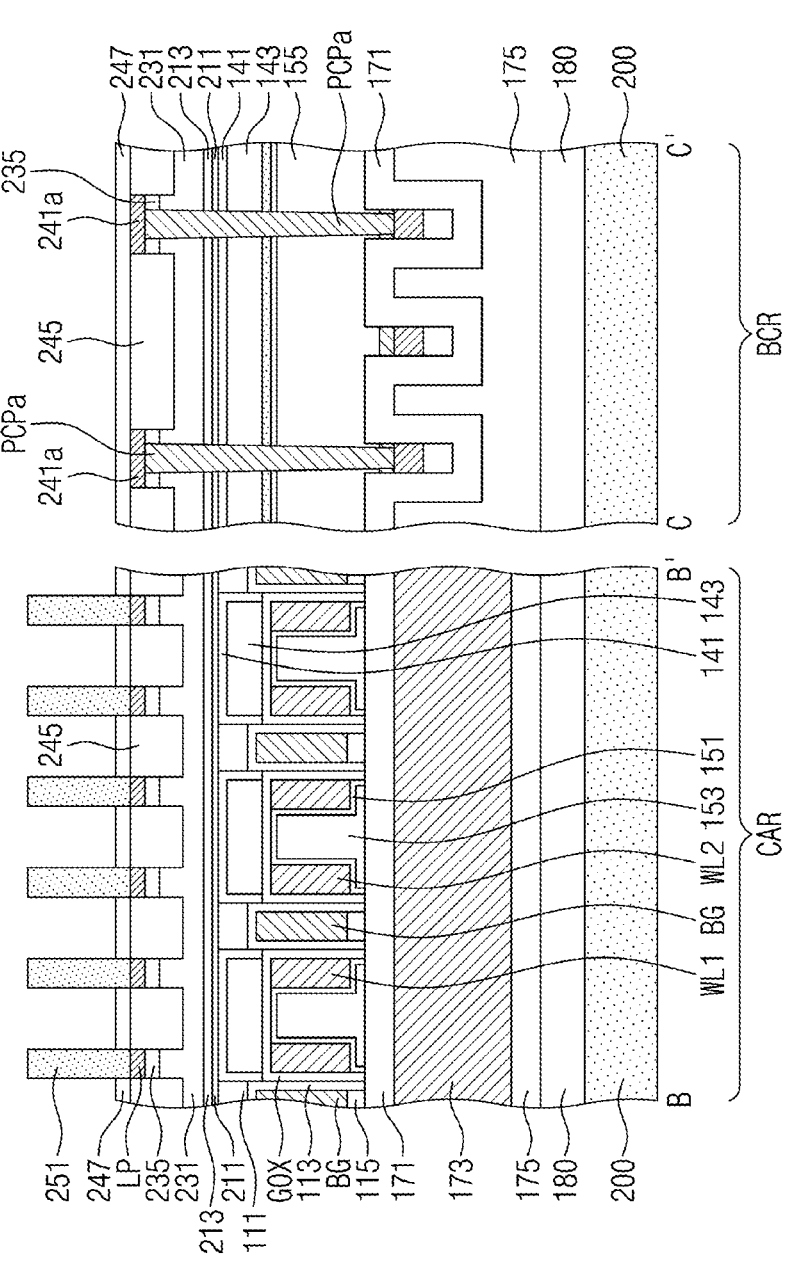
Figure 24C:
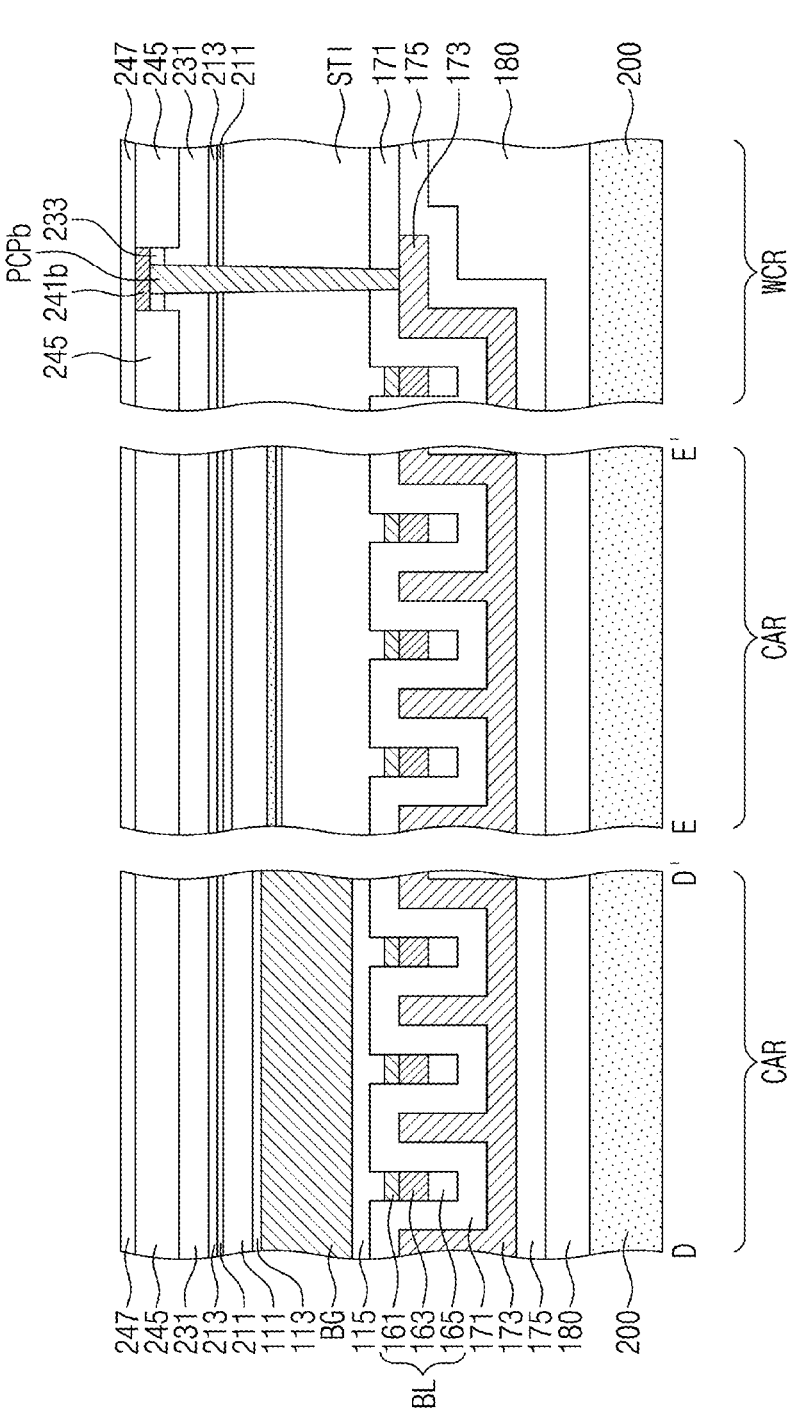

Referring to FIGS. 1A, 11A, 111B, and 11C, the first and second etch stop layers 131 and 141 exposed by the second insulating pattern 143 may be etched isotropically to expose the first and second active patterns AP1 and AP2 in the second trench T2 (e.g., see FIGS. 7A, 7B, and 7C). Furthermore, the top surfaces of the peripheral active pattern 110 and the device isolation layer STI in the first and second connection regions WCR and BCR may be exposed to the outside.

Referring to FIGS. 1A, 12A, 12B, and 12C, a gate insulating layer 151 may be deposited to conformally cover the side surfaces of the first and second active patterns AP1 and AP2, the top surfaces of the back-gate capping patterns 115, and the top surface of the second insulating pattern 143. The gate insulating layer 151 may be deposited on the peripheral active pattern 110 and the device isolation layer STI, in the first and second connection regions WCR and BCR.

The gate insulating layer 151 may be formed using at least one of physical vapor deposition (PVD), thermal chemical vapor deposition (thermal CVD), low-pressure chemical vapor deposition (LP-CVD), plasma-enhanced chemical vapor deposition (PE-CVD), or atomic layer deposition (ALD) technologies.

After the deposition of the gate insulating layer 151, the first and second word lines WL1 and WL2 may be formed on the side surfaces of the first and second active patterns AP1 and AP2.

The formation of the first and second word lines WL1 and WL2 may include depositing a gate conductive layer to conformally cover the gate insulating layer 151 and performing an anisotropic etching process on the gate conductive layer. Here, a deposition thickness of the gate conductive layer may be smaller than half a width of the second trench. The gate conductive layer may be deposited on the gate insulating layer 151 to define a gap region in the second trench.

When the anisotropic etching process is performed on the gate conductive layer, the gate insulating layer 151 may be used as an etch stop layer or the gate insulating layer 151 may be over-etched to expose the second insulating pattern 143. The shapes of the first and second word lines WL1 and WL2 may be variously changed depending on the anisotropic etching process on the gate conductive layer.

Top surfaces of the first and second word lines WL1 and WL2 may be located at a level lower than top surfaces of the first and second active patterns AP1 and AP2.

After the formation of the first and second word lines WL1 and WL2, a gas-phase doping (GPD) process or a plasma doping (PLAD) process may be performed to inject impurities into the first and second active patterns AP1 and AP2 through the gate insulating layer 151 exposed by the first and second word lines WL1 and WL2.

Referring to FIGS. 1A, 13A, 13B, and 13C, the capping layer 153 and the third insulating layer 155 may be sequentially formed in the second trench T2 in which the first and second word lines WL1 and WL2 are formed.

In detail, the capping layer 153 may be conformally deposited on the first substrate 100. The capping layer 153 may be formed of or include at least one of silicon nitride (SiN), silicon oxynitride (SiON), silicon carbide (SiC), silicon carbon nitride (SiCN), or combinations thereof. The capping layer 153 may be formed to cover the word lines WL1 and WL2.

Thereafter, the third insulating layer 155 may be deposited to fill the second trench T2 with the capping layer 153. Here, the third insulating layer 155 may be formed of an insulating material different from the capping layer 153.

Meanwhile, before the formation of the third insulating layer 155, a third mask pattern MP3 may be formed on the capping layer 153 in the first and second connection regions WCR and BCR to expose the cell array region CAR In this case, the third insulating layer 155 may not be formed in the first and second connection regions WCR and BCR.

Thereafter, a planarization process may be performed on the third insulating layer 155, the capping layer 153, and the gate insulating layer 151 to expose top surfaces of the back-gate capping patterns 115. Accordingly, the top surfaces of the first and second active patterns AP1 and AP2 may be exposed, and the gate insulating patterns GOX may be formed. After the planarization process, the third mask pattern MP3 may be removed.

Referring to FIGS. 1A, 14A, 14B, and 14C, a poly-silicon layer 161 may be deposited on the entire top surface of the first substrate 100. The poly-silicon layer 161 may be in contact with the top surfaces of the first and second active patterns AP1 and AP2 in the cell array region CAR and may be deposited on the capping layer 153 in the first and second connection regions WCR and BCR.

Next, a mask pattern (not shown) may be formed on the poly-silicon layer 161 to expose the first and second connection regions WCR and BCR, and the poly-silicon layer 161 in the first and second connection regions WCR and BCR may be etched anisotropically using the mask pattern as an etch mask to expose the capping layer 153.

Next, a metal layer 163 and a hard mask layer 165 may be sequentially formed on the poly-silicon layer 161 in the cell array region CAR and on the capping layer 153 in the first and second connection regions WCR and BCR.

The metal layer 163 may be formed by depositing at least one of conductive metal nitride materials (e.g., titanium nitride and tantalum nitride) or metallic materials (e.g., tungsten, titanium, and tantalum). The hard mask layer 165 may be formed by depositing an insulating material (e.g., silicon nitride or silicon oxynitride).

A mask pattern (not shown) may be formed on the hard mask layer 165 to have a line shape extending in the second direction D2. Then, the hard mask layer 165, the metal layer 163, and the poly-silicon layer 161 may be sequentially and anisotropically etched using the mask pattern. Thus, the bit lines BL, which extend in the second direction D2, may be formed.

The back-gate capping pattern 115 may be partially etched when the bit lines BL are formed. In addition, when the bit lines BL are formed, the hard mask layer 165, the metal layer 163, the capping layer 153, and the gate insulating layer 151 in the first and second connection regions WCR and BCR may be etched to expose a portion of the device isolation layer STI and the peripheral active pattern 110.

Referring to FIGS. 1A, 15A, 15B, and 15C, after the formation of the bit lines BL, the spacer insulating layer 171 may be formed to define a gap region between the bit lines BL.

The spacer insulating layer 171 may be deposited on the entire top surface of the first substrate 100 to have a substantially uniform thickness. A deposition thickness of the spacer insulating layer 171 may be less than half of a distance between adjacent ones of the bit lines BL. In this case, gap regions, which are defined by the spacer insulating layer 171, may be formed between the bit lines BL. The gap region may extend in the second direction D2 to be parallel to the bit lines BL.

Thereafter, a shielding conductive layer 172 may be formed on the spacer insulating layer 171. The shielding conductive layer 172 may be deposited on the spacer insulating layer 171 to fill the gap regions of the spacer insulating layer 171. In an embodiment, a chemical vapor deposition (CVD) process may be used to form the shielding conductive layer 172 on the spacer insulating layer 17. In this case, due to the step coverage property of the CVD process, a discontinuous interface (e.g., a seam) may be formed in the gap region. In an embodiment, the shielding conductive layer 172 may be formed of or include at least one of metallic materials (e.g., tungsten (W), titanium (Ti), nickel (Ni), and cobalt (Co)). In an embodiment, the shielding conductive pattern 173 may be formed of or include a two-dimensional (2D) conductive material (e.g., graphene).

Referring to FIGS. 1A, 16A, 16B, and 16C, a fourth mask pattern MP4 may be formed on the shielding conductive layer 172 in the cell array region CAR and the first connection region WCR. In other words, the fourth mask pattern MP4 may be formed to expose the shielding conductive layer 172 in the second connection region BCR.

Next, the shielding conductive layer 172 may be anisotropically etched using the fourth mask pattern MP4 as an etch mask. Accordingly, a portion of the shielding conductive layer 172, which is located on the end portions of the bit lines BL in the second connection region BCR, may be etched to expose the spacer insulating layer 171. As a result, the shielding conductive pattern 173 may be formed. The shielding conductive pattern 173 may have an end portion in the first connection region WCR.

Referring to FIGS. 1A, 17A, 17B, and 17C, after the formation of the shielding conductive pattern 173, the capping insulating layer 175 may be formed on the shielding conductive pattern 173. The capping insulating layer 175 may conformally cover the shielding conductive pattern 173 and may fill the gap regions of the spacer insulating layer 171 in the second connection region BCR. In an embodiment, the capping insulating layer 175 may be formed of or include silicon nitride.

Thereafter, the planarization insulating layer 180 may be formed on the capping insulating layer 175. The planarization insulating layer 180 may be formed by depositing an insulating material (e.g., silicon oxide). The planarization insulating layer 180 may be formed of or include an insulating material having an etch selectivity with respect to the capping insulating layer 175. As an example, the planarization insulating layer 180 may be one of insulating layers that are formed by a spin-on-glass (SOG) technique, or a silicon oxide layer. The planarization insulating layer 180 may have a substantially flat top surface.

Referring to FIGS. 1A, 18A, 18B, and 18C, the second substrate 200 may be bonded to the planarization insulating layer 180.

The second substrate 200 may be bonded to a top surface of the planarization insulating layer 180 using an adhesive layer. The second substrate 200 may be formed of or include single-crystalline silicon or glass (e.g., quartz).

Referring to FIGS. 1A, 19A, 19B, and 19C, after the bonding of the second substrate 200, a back-side lapping process may be performed to remove the first substrate 100. The removal of the first substrate 100 may include sequentially performing a grinding process and a wet etching process to expose the buried insulating layer 101.

Next, referring to FIGS. 1A, 20A, 20B, and 20C, the buried insulating layer 101 may be removed to expose the active patterns AP1 and AP2, the first insulating patterns 111, and the back-gate insulating patterns 113. Also, in the first and second connection regions WCR and BCR, the second surface of the peripheral active pattern 110 may be exposed.

The buried insulating layer 101 may be etched by a wet or dry etching process, and the active patterns AP1 and AP2 may be used as an etch stop layer during the etching process on the buried insulating layer 101.

Next, the third and fourth etch stop layers 211 and 213 may be sequentially formed on the cell array region CAR. The third etch stop layer 211 may be formed of or include silicon oxide and may be deposited on the active patterns AP1 and AP2, the first insulating patterns 111, and the device isolation layer STI. The fourth etch stop layer 213 may be formed of a material (e.g., silicon nitride) having an etch selectivity with respect to the third etch stop layer 211.

Thereafter, a peripheral transistor may be formed on the second surface of the peripheral active pattern 110 in the first and second connection regions WCR and BCR. In detail, the peripheral gate insulating layer 215 may be formed in the first and second connection regions WCR and BCR to cover the second surface of the peripheral active pattern 110. The peripheral gate electrode PG may be formed on the peripheral gate insulating layer 215. The peripheral gate electrode PG may include the peripheral conductive pattern 221, the peripheral metal pattern 223, and the peripheral mask pattern 225, which are sequentially stacked.

The interlayer insulating layer 231 and a fifth etch stop layer 233 may be formed in the cell array region CAR and the first and second connection regions WCR and BCR. The interlayer insulating layer 231 may be formed by depositing an insulating material and planarizing the insulating material to expose a top surface of the peripheral gate electrode PG. The fifth etch stop layer 233 may be formed of or include an insulating material having an etch selectivity with respect to the interlayer insulating layer 231. The fifth etch stop layer 233 may cover a top surface of the interlayer insulating layer 231 and the top surface of the peripheral gate electrode PG.

Referring to FIGS. 1A, 21A, 21B, and 21C, the contact patterns BC may be formed to penetrate the interlayer insulating layer 231 and the fifth etch stop layer 233 and may be connected to the first and second active patterns AP1 and AP2.

The formation of the contact patterns BC may include patterning the interlayer insulating layer 231 and the fifth etch stop layer 233 to form holes exposing the first and second active patterns AP1 and AP2, respectively, depositing a conductive layer to fill the holes, and planarizing the conductive layer to expose a top surface of the fifth etch stop layer 233.

After the formation of the contact patterns BC, the peripheral contact plugs PCPa, PCPb, and PCPc may be formed in the first and second connection regions WCR and BCR.

The formation of the peripheral contact plugs PCPa, PCPb, and PCPc may include patterning the fifth etch stop layer 233, the interlayer insulating layer 231, and the device isolation layer STI to form contact holes and depositing a conductive material on the fifth etch stop layer 233 to fill the contact holes. The peripheral contact plugs PCPa, PCPb, and PCPc may include a bit line contact plug PCPa, which is provided to penetrate the fifth etch stop layer 233, the interlayer insulating layer 231, and the device isolation layer STI and is coupled to an end portion of the bit line (i.e., an end portion of the metal layer 163), a shielding contact plug PCPb, which is coupled to an end portion of the shielding conductive pattern 173, and a peripheral contact plug PCPc, which is connected to the source/drain region of the peripheral transistor.

Referring to FIGS. 1A, 22A, 22B, and 22C, a conductive layer 240 may be deposited on the fifth etch stop layer 233 in the cell array region CAR and the first and second connection regions WCR and BCR. The conductive layer 240 may be in contact with top surfaces of the contact patterns BC and top surfaces of the peripheral contact plugs PCPa, PCPb, and PCPc. In an embodiment, the conductive layer 240 and the peripheral contact plugs PCPa, PCPb, and PCPc may be formed at the same time.

Next, referring to FIGS. 1A, 23A, 23B, and 23C, the conductive layer 240 in the cell array region CAR may be patterned to form the landing pads LP, which are connected to the contact patterns BC, respectively.

The formation of the landing pads LP may include anisotropically etching the conductive layer 240, the fifth etch stop layer 233, and the interlayer insulating layer 231 using mask patterns to form recess regions and filling the recess regions with an insulating material to form the separation insulating patterns 245. The contact patterns BC may be partially etched, during the formation of the recess region. A top surface of the separation insulating pattern 245 may be substantially coplanar with top surfaces of the landing pads LP.

When the landing pads LP are formed, the conductive layer 240 in the first and second connection regions WCR and BCR may be patterned to form the peripheral circuit interconnection lines 241a, 241b, and 241c. In the first and second connection regions WCR and BCR, the separation insulating pattern 245 may electrically separate the peripheral circuit interconnection lines 241a, 241b, and 241c from each other.

Referring to FIGS. 1A, 24A, 24B, and 24C, the sixth etch stop layer 247 may be formed to cover the top surfaces of the landing pads LP and the top surfaces of the peripheral circuit interconnection lines 241a, 241b, and 241c. The sixth etch stop layer 247 may cover a top surface of the separation insulating pattern 245 and top surfaces of the peripheral circuit interconnection lines 241a, 241b, and 241c. The sixth etch stop layer 247 may be formed of or include an insulating material having an etch selectivity with respect to the separation insulating pattern 245.

Thereafter, the storage electrodes 251 may be formed to penetrate the sixth etch stop layer 247 and to be connected to the landing pads LP, respectively. In an embodiment, the storage electrodes 251 may be formed of or include at least one of doped polysilicon, conductive metal nitride materials (e.g., titanium nitride and tantalum nitride), metallic materials (e.g., tungsten, titanium, and tantalum), conductive metal silicide materials, or conductive metal oxide materials.

Next, referring to FIGS. 1B, 1C, and 1D, the capacitor dielectric layer 253 may be formed to conformally cover the storage electrodes 251. Thereafter, the plate electrode 255 may be formed on the capacitor dielectric layer 253.

The data storage patterns DSP may be formed, and the peripheral circuit insulating layer 263 may be formed to cover the first and second connection regions WCR and BCR. Then, the upper insulating layer 270 may be formed on the data storage patterns DSP and the peripheral circuit insulating layer 263.

According to an embodiment, in the semiconductor memory device including the vertical channel transistors, active patterns may be formed of a single crystalline semiconductor material. The formation of active patterns of a single crystalline semiconductor material may make it possible to improve a leakage current property of the vertical channel transistor.

According to an embodiment, the back-gate electrode may be used to increase a threshold voltage of the vertical channel transistor. Thus, it may be possible to prevent a leakage current property of the vertical channel transistor from being deteriorated by a reduction of the threshold voltage, which could occur if the vertical channel transistor were to be scaled down.

According to an embodiment, in the process of fabricating a semiconductor memory device including vertical channel transistors, the bit line contact plug and the shielding contact plugs may be formed with an increased process margin.

By way of summation and review, embodiments may provide a semiconductor memory device with improved electrical characteristics and an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including a cell array region and a connection region;
bit lines provided on the substrate and extending in a first direction;
first and second active patterns disposed on each of the bit lines and alternately arranged in the first direction;
back-gate electrodes respectively disposed between adjacent ones of the first and second active patterns and extending in a second direction to cross the bit lines;

first word lines disposed adjacent to the first active patterns, respectively, and extending in the second direction;
second word lines disposed adjacent to the second active patterns, respectively, and extending in the second direction; and
a shielding conductive pattern including line portions that are respectively disposed between adjacent ones of the bit lines, and a plate portion that is connected in common to the line portions,
wherein, when measured in the first direction, a length of each of the line portions of the shielding conductive pattern is shorter than a length of each of the bit lines.

2. The semiconductor memory device as claimed in claim 1, further comprising:
a spacer insulating layer conformally covering the bit lines and defining gap regions between the bit lines, respectively; and
a capping insulating layer on the shielding conductive pattern,
wherein the capping insulating layer is provided on the connection region to fill the gap regions of the spacer insulating layer.

3. The semiconductor memory device as claimed in claim 1, wherein the connection region includes:
a first connection region adjacent to the cell array region in the first direction, and
a second connection region adjacent to the cell array region in the second direction, and
the semiconductor memory device further includes:
bit line contact plugs provided on the first connection region and coupled to the bit lines; and
shielding contact plugs provided on the second connection region and coupled to the plate portion of the shielding conductive pattern.

4. The semiconductor memory device as claimed in claim 1, further including:
a peripheral active pattern provided on the connection region of the substrate, the peripheral active pattern including a first surface and a second surface that are opposite to each other in a vertical direction normal to a top surface of the substrate;
a device isolation layer provided on the connection region to enclose the peripheral active pattern; and
a peripheral transistor integrated on the first surface of the peripheral active pattern.

5. The semiconductor memory device as claimed in claim 4, wherein, when measured in the vertical direction, a thickness of the peripheral active pattern is substantially equal to lengths of the first and second active patterns.

6. The semiconductor memory device as claimed in claim 1, further including a peripheral circuit structure disposed between the substrate and the bit lines, when viewed in a vertical view,
wherein the peripheral circuit structure includes peripheral circuits on the substrate and a peripheral circuit insulating layer covering the peripheral circuits.

7. The semiconductor memory device as claimed in claim 1,
wherein, when measured in the second direction, each of the first and second active patterns has a length greater than a width of each of the bit lines.

8. The semiconductor memory device as claimed in claim 1, further comprising:
contact patterns coupled to the first and second active patterns, respectively; and
data storage patterns disposed on the contact patterns.

9. The semiconductor memory device as claimed in claim 8, further comprising:

a first insulating pattern between the bit lines and the back-gate electrodes; and a second insulating pattern between the contact patterns and the back-gate electrodes.

10. The semiconductor memory device as claimed in claim 1, further comprising gate insulating patterns, which are respectively disposed between the first and second active patterns and the first and second word lines, wherein each of the gate insulating patterns includes a vertical portion that is adjacent to the first and second active patterns, and a horizontal portion that protrudes from the vertical portion in the first direction.

11. A semiconductor memory device, comprising:

a substrate including a cell array region, a first connection region adjacent to the cell array region in a first direction, and a second connection region adjacent to the cell array region in a second direction crossing the first direction;

bit lines provided on the substrate and extended in the first direction;

a spacer insulating layer conformally covering the bit lines and defining gap regions between the bit lines, respectively;

a shielding conductive pattern disposed between the spacer insulating layer and the substrate, the shielding conductive pattern including line portions, which are provided on the cell array region to fill the gap regions of the spacer insulating layer, and a plate portion, which is provided to connect the line portions to each other;

a first active pattern and a second active pattern disposed on each of the bit lines;

a back-gate electrode disposed between the first and second active patterns and extended in the second direction to cross the bit line;

a first word line disposed at a side of the first active pattern and extended in the second direction;

a second word line disposed at an opposite side of the second active pattern and extended in the second direction; and contact patterns coupled to the first and second active patterns, respectively, wherein the plate portion of the shielding conductive pattern extends in the first direction and the second direction.

12. The semiconductor memory device as claimed in claim 11, further comprising a capping insulating layer between the shielding conductive pattern and the substrate, wherein the capping insulating layer is provided on the first connection region to fill the gap regions of the spacer insulating layer.

13. The semiconductor memory device as claimed in claim 11, further comprising:

bit line contact plugs coupled to the bit lines, on the first connection region; and shielding contact plugs coupled to the plate portion of the shielding conductive pattern, on the second connection region.

14. The semiconductor memory device as claimed in claim 13, further comprising:

a peripheral active pattern provided on the first connection region and the second connection region of the substrate, the peripheral active pattern including a first surface and a second surface that are opposite to each other in a vertical direction normal to a top surface of the substrate;

a device isolation layer provided on the first connection region and the second connection region to enclose the peripheral active pattern; and a peripheral transistor integrated on the first surface of the peripheral active pattern.

15. The semiconductor memory device as claimed in claim 14, wherein the bit line contact plugs and the shielding contact plugs penetrate the device isolation layer.

16. A semiconductor memory device, comprising:

a substrate including a cell array region, a first connection region adjacent to the cell array region in a first direction, and a second connection region adjacent to the cell array region in a second direction crossing the first direction;

bit lines provided on the substrate and extending in the first direction;

a shielding conductive pattern including line portions that are respectively disposed between adjacent ones of the bit lines, and a plate portion that is connected in common to the line portions;

first and second active patterns disposed on each of the bit lines and alternately arranged in the first direction;

back-gate electrodes disposed between adjacent ones of the first and second active patterns and extending in the second direction to cross the bit lines;

first word lines disposed adjacent to the first active patterns, respectively, and extending in the second direction;

second word lines disposed adjacent to the second active patterns, respectively, and extending in the second direction;

contact patterns coupled to the first and second active patterns, respectively;

data storage patterns coupled to the contact patterns, respectively;

a peripheral active pattern provided on the first connection region and the second connection region of the substrate, the peripheral active pattern including a first surface and a second surface, which are opposite to each other in a vertical direction normal to a top surface of the substrate;

a device isolation layer enclosing the peripheral active pattern;

a peripheral transistor integrated on the first surface of the peripheral active pattern;

bit line contact plugs provided on the first connection region to penetrate the device isolation layer and coupled to the bit lines; and shielding contact plugs provided on the second connection region to penetrate the device isolation layer and coupled to the plate portion of the shielding conductive pattern.

17. The semiconductor memory device as claimed in claim 16, further comprising:

a spacer insulating layer conformally covering the bit lines and defining gap regions between the bit lines, respectively; and a capping insulating layer on the shielding conductive pattern, wherein the capping insulating layer is provided on the first connection region and the second connection region to fill the gap regions of the spacer insulating layer.

18. The semiconductor memory device as claimed in claim 17, further comprising a peripheral circuit structure disposed between the substrate and the capping insulating layer, when viewed in a vertical view, wherein the peripheral circuit structure includes peripheral circuits on the substrate and a peripheral circuit insulating layer covering the peripheral circuits.

19. The semiconductor memory device as claimed in claim 17, further comprising:

gate insulating patterns between the first and second active patterns and the first and second word lines;

back-gate insulating patterns between the first and second active patterns and the back-gate electrodes;

separation insulating patterns disposed between the first and second word lines that are adjacent to each other in the first direction;

first insulating patterns between the bit lines and the back-gate electrodes;

second insulating patterns between the first and second word lines and the bit lines;

third insulating patterns between the contact patterns and the back-gate electrodes; and fourth insulating patterns between the contact patterns and the first and second word lines.

20. The semiconductor memory device as claimed in claim 19, wherein:

each of the gate insulating patterns includes a vertical portion that is adjacent to the first and second active patterns, and a horizontal portion, that extends from the vertical portion to protrude in the first direction, and the horizontal portion of each of the gate insulating patterns is disposed between the fourth insulating patterns and the separation insulating patterns.

\* \* \* \* \*